(12) United States Patent
Wang et al.

(10) Patent No.: US 11,984,478 B2
(45) Date of Patent: May 14, 2024

(54) FORMING SOURCE AND DRAIN FEATURES IN SEMICONDUCTOR DEVICES

(71) Applicant: Taiwan Semiconductor Manufacturing Co., Ltd., Hsin-Chu (TW)

(72) Inventors: Shu Wen Wang, Hsinchu (TW); Chih-Teng Liao, Hsinchu (TW); Chih-Shan Chen, New Taipei (TW); Jui Fu Hsieh, Hsinchu County (TW); Dave Lo, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 230 days.

(21) Appl. No.: 17/341,745

(22) Filed: Jun. 8, 2021

(65) Prior Publication Data
US 2022/0052159 A1 Feb. 17, 2022

Related U.S. Application Data

(60) Provisional application No. 63/065,671, filed on Aug. 14, 2020.

(51) Int. Cl.
*H01L 21/8238* (2006.01)
*H01L 25/065* (2023.01)
(Continued)

(52) U.S. Cl.
CPC ...... *H01L 29/0847* (2013.01); *H01L 25/0655* (2013.01); *H01L 27/0924* (2013.01); *H01L 29/66545* (2013.01); *H01L 29/6656* (2013.01); *H01L 29/66795* (2013.01); *H10B 10/12* (2023.02); *H01L 29/41791* (2013.01)

(58) Field of Classification Search
None
See application file for complete search history.

(56) References Cited

U.S. PATENT DOCUMENTS

| 10,510,875 B2 | 12/2019 | Liao et al. |
| 2015/0243745 A1 | 8/2015 | Kelly |

(Continued)

FOREIGN PATENT DOCUMENTS

| CN | 109860117 A | 6/2019 |
| CN | 110010470 A | 7/2019 |

(Continued)

*Primary Examiner* — Joseph C. Nicely
*Assistant Examiner* — Lamont B Koo
(74) *Attorney, Agent, or Firm* — Haynes and Boone, LLP

(57) ABSTRACT

A method includes forming a first portion of a spacer layer over a first fin and a second portion of the spacer layer over a second fin, performing a first etching process to recess the first portion of the spacer layer with respect to the second portion of the spacer layer to form first spacers on sidewalls of the first fin, subsequently performing a second etching process to recess the second portion of the spacer layer with respect to the first spacers to form second spacers on sidewalls of the second fin, where the second spacers are formed to a height greater than that of the first spacers, and forming a first epitaxial source/drain feature and a second epitaxial source/drain feature between the first spacers and the second spacers, respectively, where the first epitaxial source/drain feature is larger than that of the second epitaxial source/drain feature.

20 Claims, 44 Drawing Sheets

(51) Int. Cl.
  *H01L 27/092* (2006.01)
  *H01L 29/08* (2006.01)
  *H01L 29/66* (2006.01)
  *H10B 10/00* (2023.01)
  H01L 29/417 (2006.01)

(56) References Cited

U.S. PATENT DOCUMENTS

| | | |
|---|---|---|
| 2016/0071846 A1 | 3/2016 | Wen |
| 2017/0271503 A1 | 9/2017 | Yu |
| 2019/0035908 A1 | 1/2019 | Liao |
| 2019/0148514 A1 | 5/2019 | Lin |
| 2019/0157155 A1 | 5/2019 | Keng |
| 2019/0157162 A1 | 5/2019 | Chu |
| 2020/0105620 A1 | 4/2020 | Tan et al. |
| 2020/0119161 A1 | 4/2020 | Liao et al. |

FOREIGN PATENT DOCUMENTS

| | | |
|---|---|---|
| CN | 110197828 A | 9/2019 |
| DE | 102017117850 A1 | 10/2018 |
| EP | 3182461 A1 | 6/2017 |
| KR | 20180118028 A | 10/2018 |
| TW | 201911393 A | 3/2019 |
| TW | 201919235 A | 5/2019 |

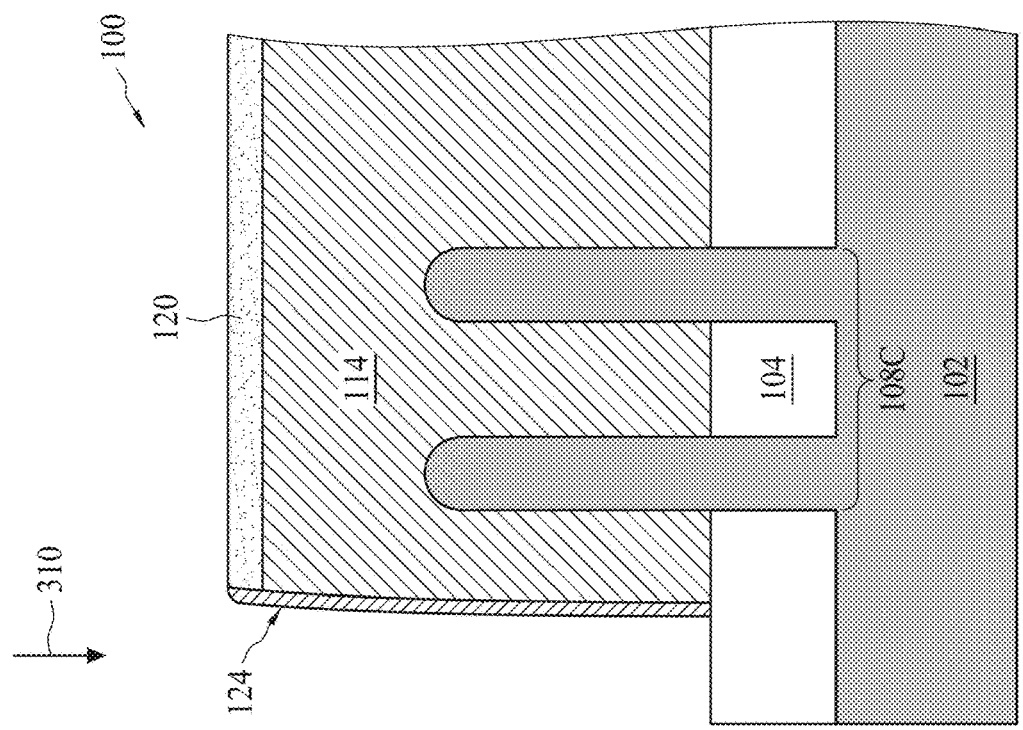
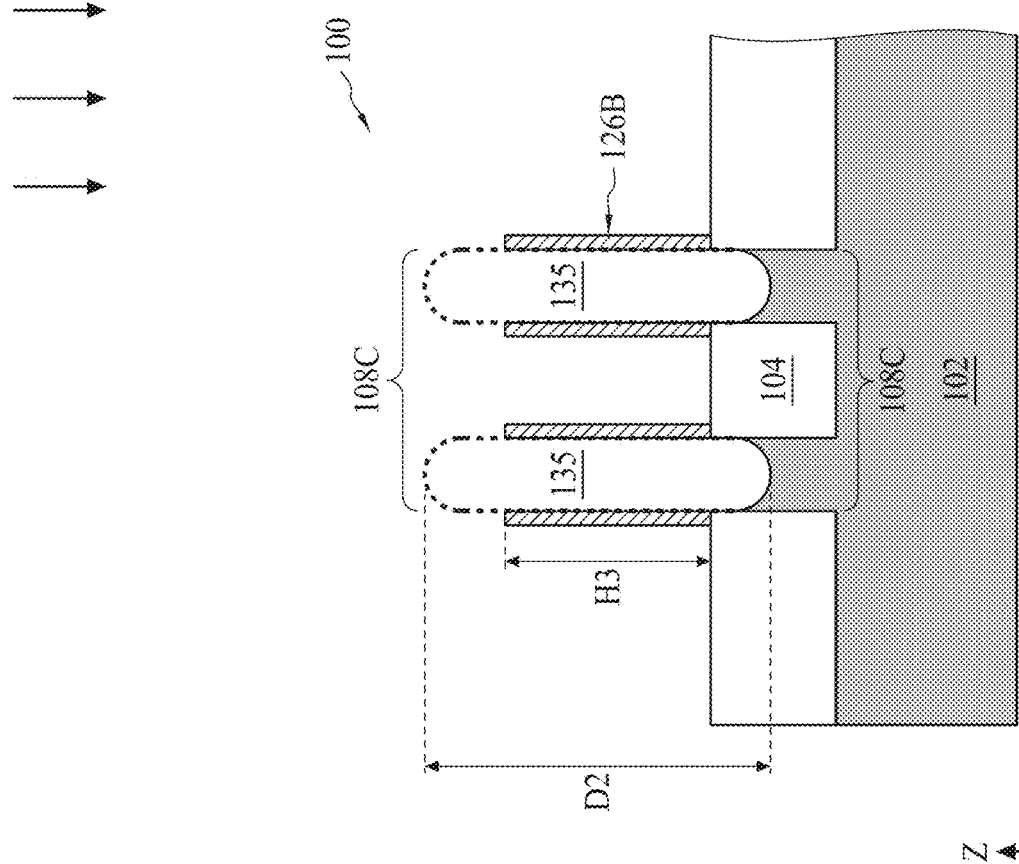
FIG. 12C
FIG. 12D

FORMING SOURCE AND DRAIN FEATURES IN SEMICONDUCTOR DEVICES

CROSS REFERENCE

This application claims the benefit of U.S. Provisional Application 63/065,671, entitled "Forming Epitaxial Source/drain Features in Semiconductor Devices," filed Aug. 14, 2020, the entire disclosure of which is incorporated by reference.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

Multi-gate devices have been introduced in an effort to improve gate control by increasing gate-channel coupling, reduce OFF-state current, and reduce short-channel effects (SCEs). One such multi-gate device that has been introduced is the fin field-effect transistor (FinFET). The FinFET owes its name to the fin-like structure that extends from a substrate on which it is formed, with the surfaces of the fin-like structure serving as channel regions of the FET. FinFETs are compatible with conventional complementary metal-oxide-semiconductor (CMOS) processes and their three-dimensional structure allows them to be aggressively scaled while maintaining gate control and mitigating SCEs. Performance of FinFETs may be controlled and optimized by various features including source and drain features formed in the fin-like structures (or fins as referred to hereafter). While current methods of forming the source and drain features in FinFETs are generally adequate, they are not entirely satisfactory in all aspects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 10C, 11C, 12C, 13C, and 15D are cross-sectional views along dashed line EE' of the example workpiece depicted in FIGS. 10A, 11A, 12A, 13A, and 15A, respectively, at various fabrication stages of the method of FIGS. 1, 2A, and/or 2B according to various aspects of the present disclosure.

FIGS. 10D, 11D, 12D, and 13D are cross-sectional views along dashed line FF' of the example workpiece depicted in FIGS. 10A, 11A, 12A, and 13A, respectively, at various fabrication stages of the method of FIGS. 1, 2A, and/or 2B according to various aspects of the present disclosure.

DETAILED DESCRIPTION

Figure 1:
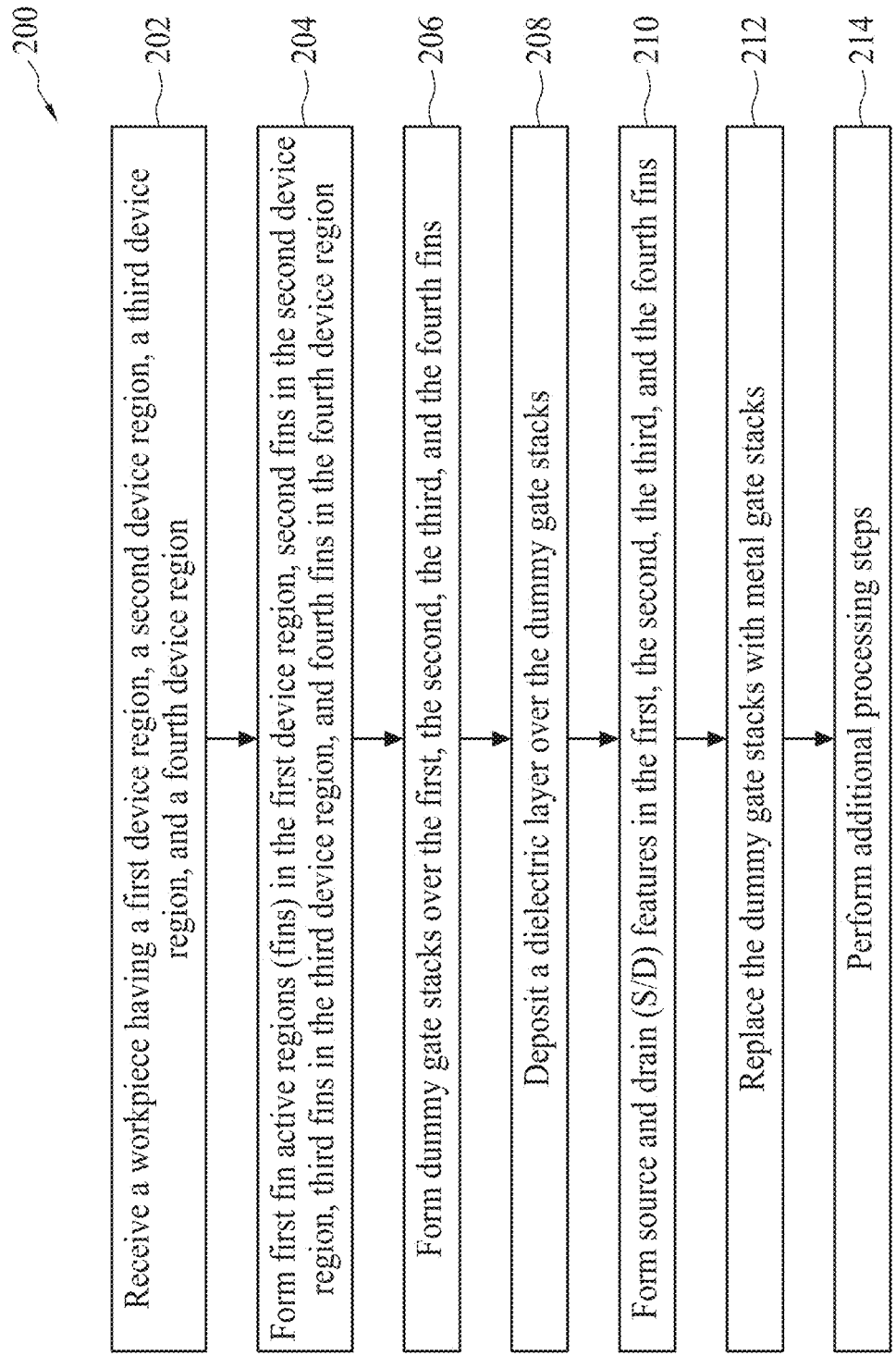
FIGS. 1, 2A, and 2B are flow charts illustrating a method of fabricating a workpiece according to various aspects of the present disclosure.

The following disclosure provides many different embodiments, or examples, for implementing different features of the disclosure. Specific examples of components and arrangements are described below to simplify the present disclosure. These are, of course, merely examples and are not intended to be limiting. For example, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "over," "below," "beneath," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features.

Furthermore, when a number or a range of numbers is described with "about," "approximate," and the like, the term is intended to encompass numbers that are within a reasonable range including the number described, such as within +/−10% of the number described or other values as understood by person skilled in the art. For example, the term "about 5 nm" encompasses the dimension range from 4.5 nm to 5.5 nm. Still further, the present disclosure may repeat reference numerals and/or letters in the various examples. This repetition is for the purpose of simplicity and clarity and does not in itself dictate a relationship between the various embodiments and/or configurations discussed.

It is noted that the present disclosure presents embodiments in the form of multi-gate transistors or fin-type multi-gate transistors referred to herein as FinFETs. Such devices may include a p-type metal-oxide-semiconductor FinFET device or an n-type metal-oxide-semiconductor FinFET device. The FinFET device may be a dual-gate device, tri-gate device, bulk device, silicon-on-insulator (SOI) device, and/or other configurations. Though not depicted, other embodiments applicable to gate-all-around (GAA) devices, Omega-gate (Ω-gate) devices, or Pi-gate (Π-gate) devices may also benefit from aspects of the present disclosure. Furthermore, the present embodiments provide intermediate devices fabricated during processing of an IC, or a portion thereof, that may include memory (such as static random access memory, or SRAM) and/or logic circuits, passive components such as resistors, capacitors, and inductors, and active components such as metal-oxide semiconductor field effect transistors (MOSFETs), complementary metal-oxide semiconductor (CMOS) transistors, bipolar transistors, high voltage transistors, high frequency transistors, other memory cells, and combinations thereof.

The present disclosure is generally related to semiconductor devices and fabrication thereof. More particularly, some embodiments are related to forming source/drain features in device active regions, such as fins, for FinFETs configured to form both logic and memory devices. FinFETs have been introduced to improve gate control by increasing gate-channel coupling, reduce OFF-state current, and reduce short-channel effects (SCEs). The FinFET fabrication process generally includes, inter alia, forming epitaxially grown source/drain features by etching and selective epitaxial growth to induce strain effect in a channel region of the FinFET. While current methods of forming FinFETs are generally adequate, they are not entirely satisfactory in all aspects. For example, existing fabrication schemes may lack the ability to independently control the formation of source/drain features to satisfy different design requirements, such as strain effect and contact resistance, suitable for different FinFETs.

While not intended to be limiting, the present disclosure provides an approach to form source and drain features with increased strain effect, decreased contact resistance, as well as more design freedom to existing methods of forming source/drain features with different characteristics. In some embodiments, source/drain features configured to provide different devices are formed separately with varying shapes and/or dimensions. In the present embodiments, such distinct source/drain features are formed by controlling the height of their respective fin sidewall (FSW) spacers, which may be fabricated by implementing two patterning processes followed by two distinct etching processes.

Embodiments of the present disclosure offer various advantages, though it is understood that other embodiments may offer different advantages, not all advantages are necessarily discussed herein, and no particular advantage is required for all embodiments. In at least some embodiments, by forming the epitaxial source/drain features, the carrier mobility is increased and the device performance is enhanced.

Figure 2A:
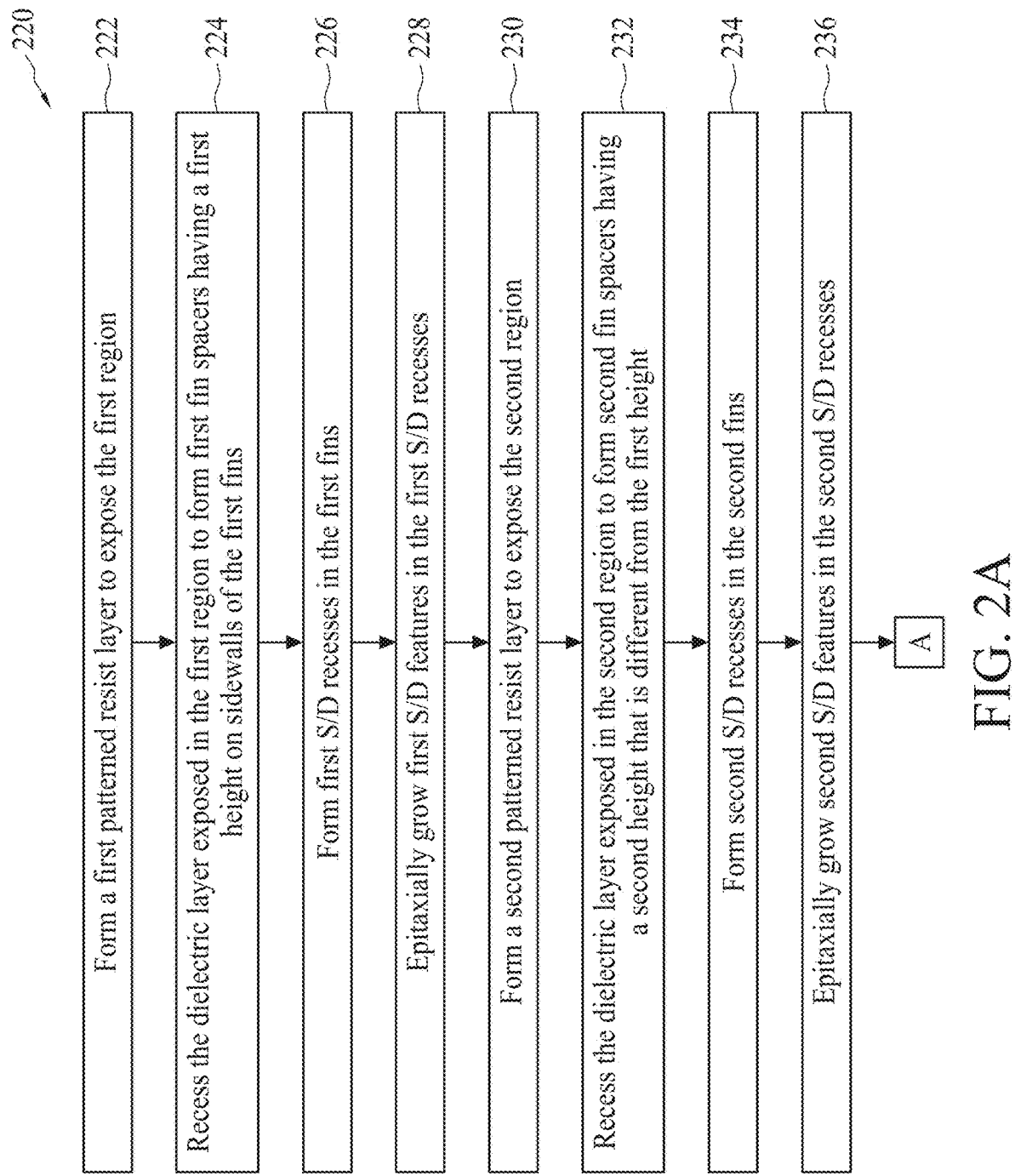
Figure 2B:
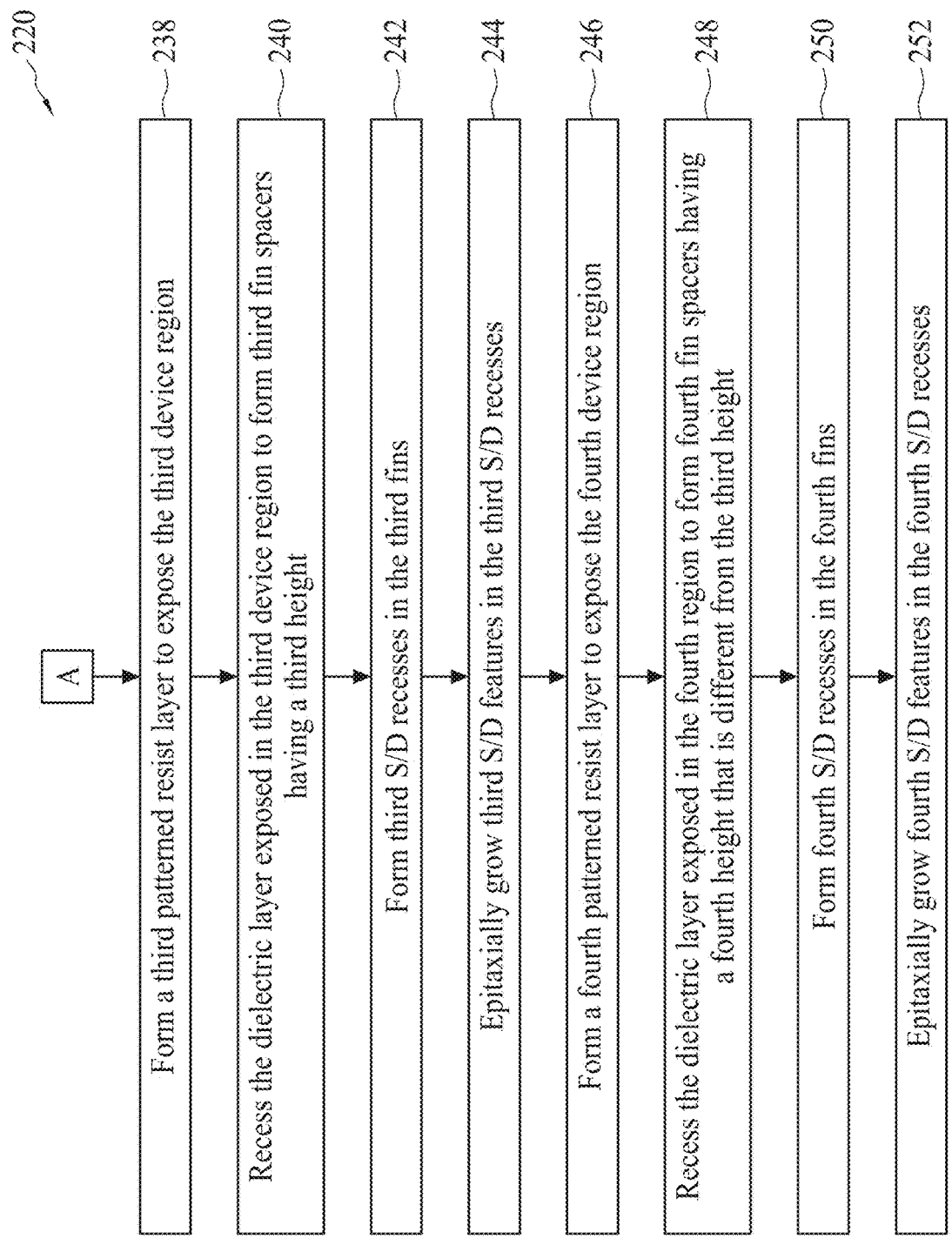
Figure 14A:
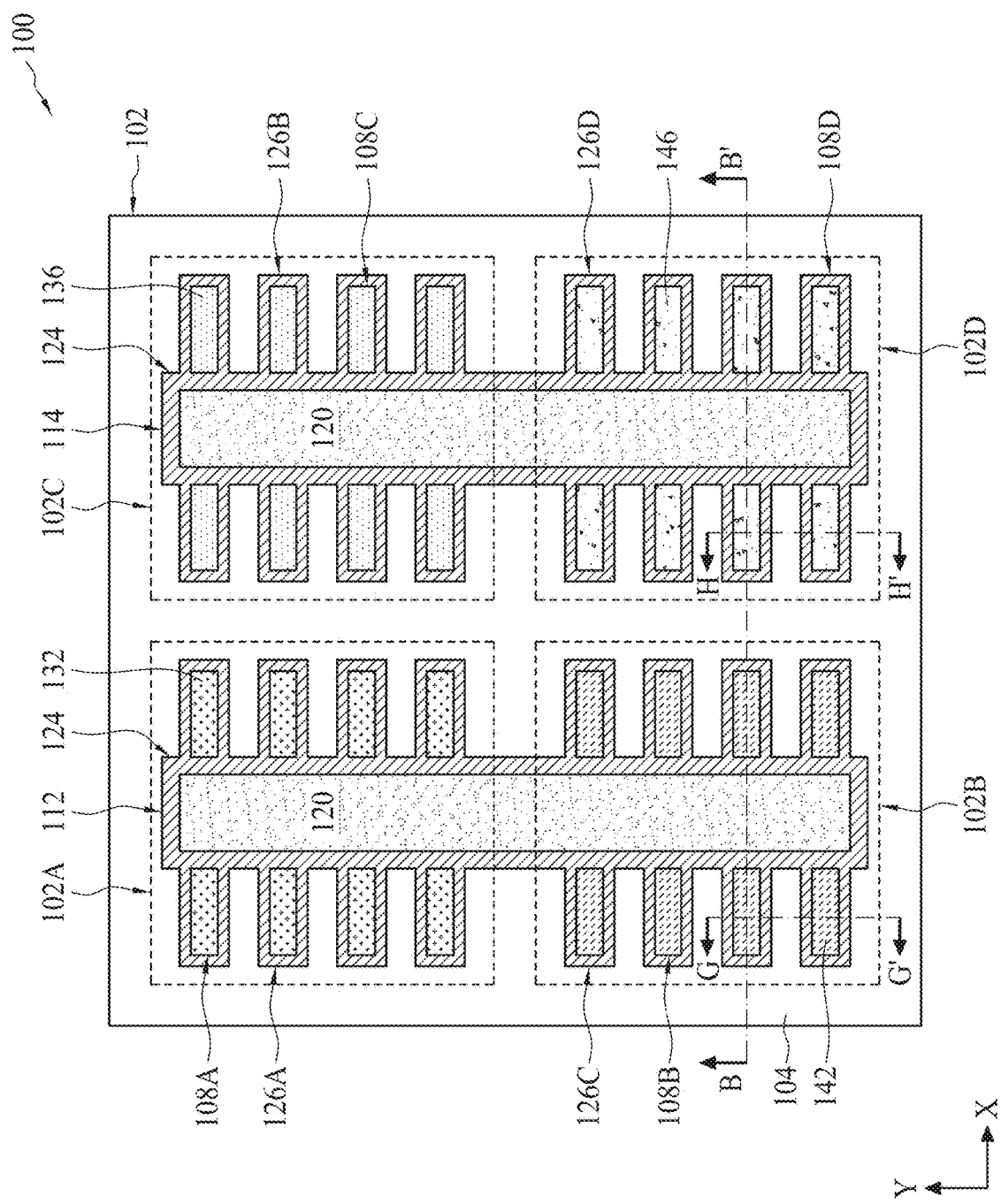
Figure 14B:
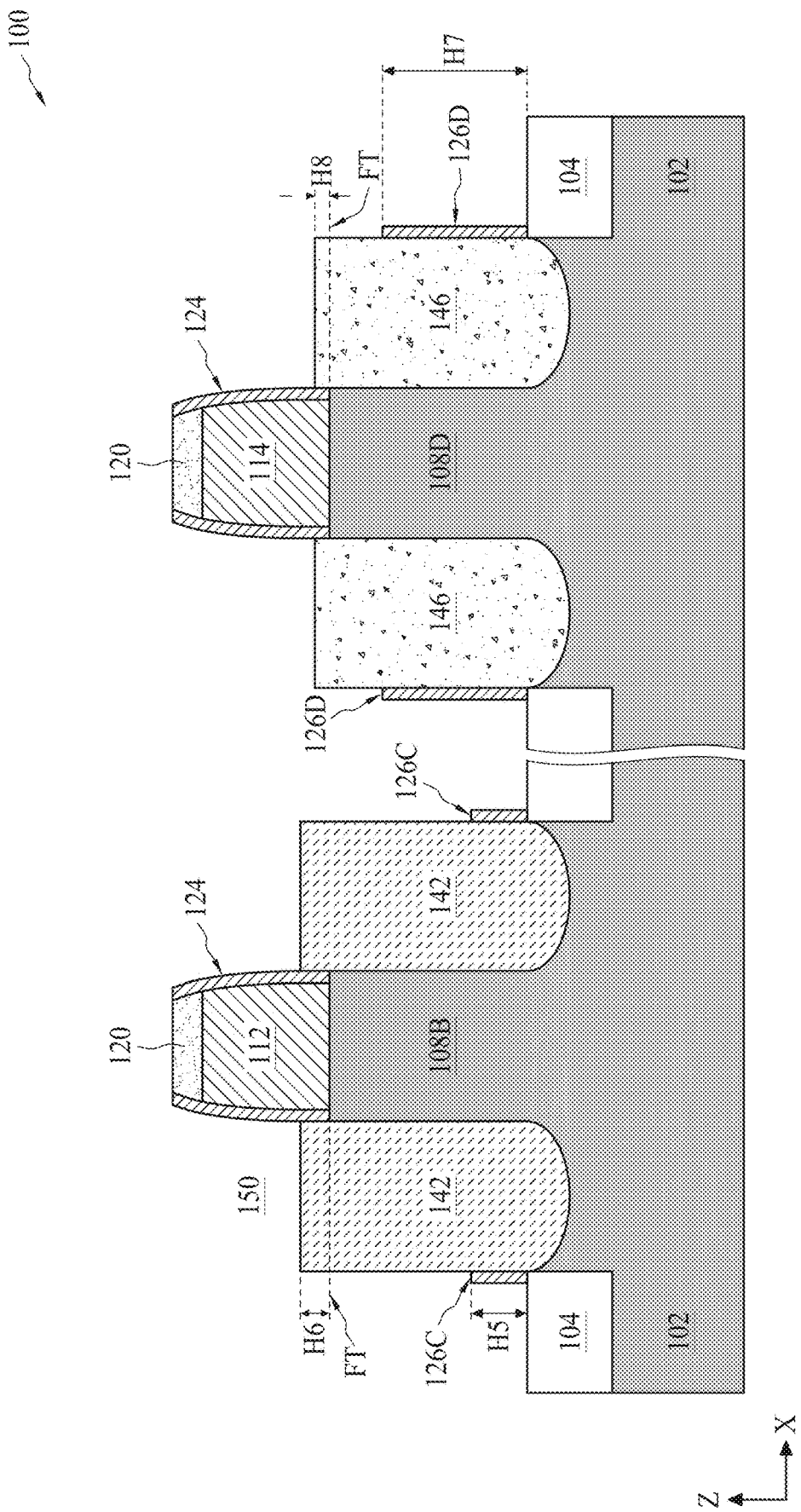
FIGS. 14B and 15E are cross-sectional views along dashed line BB' of the example workpiece depicted in FIGS. 14A and 15A, respectively, at various fabrication stages of the method of FIGS. 1, 2A, and/or 2B according to various aspects of the present disclosure.
Figure 14C:
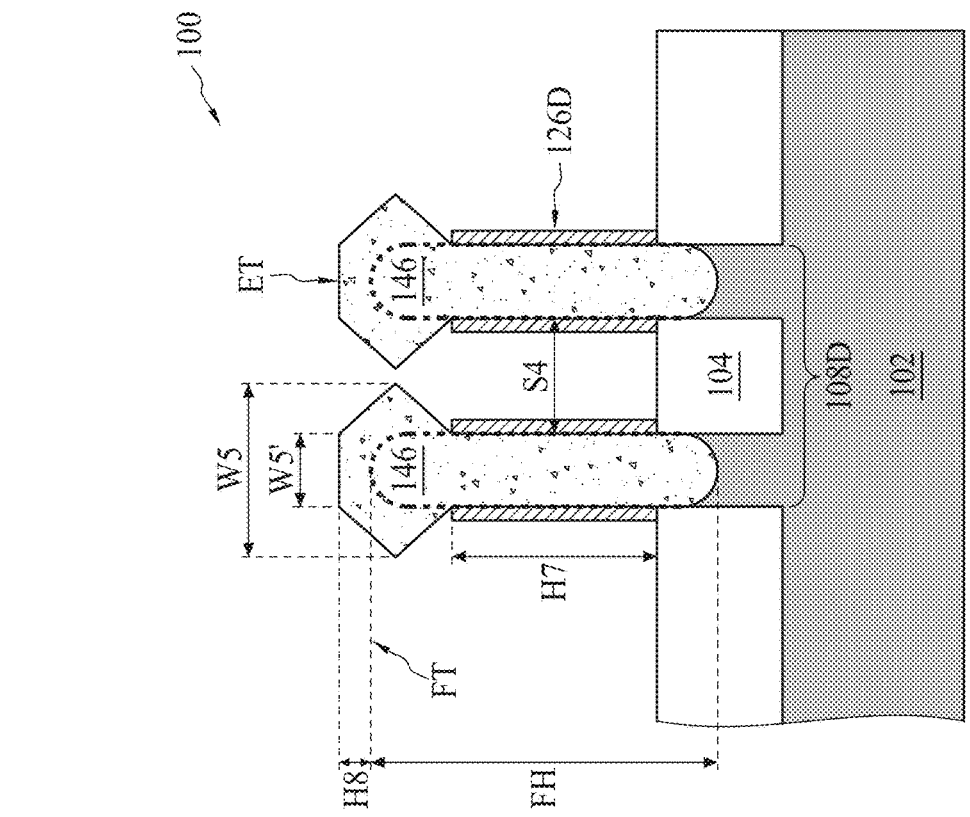
FIGS. 14C and 15F are cross-sectional views along dashed line GG' of the example workpiece depicted in FIGS. 14A and 15A, respectively, at various fabrication stages of the method of FIGS. 1, 2A, and/or 2B according to various aspects of the present disclosure.
Figure 14D:
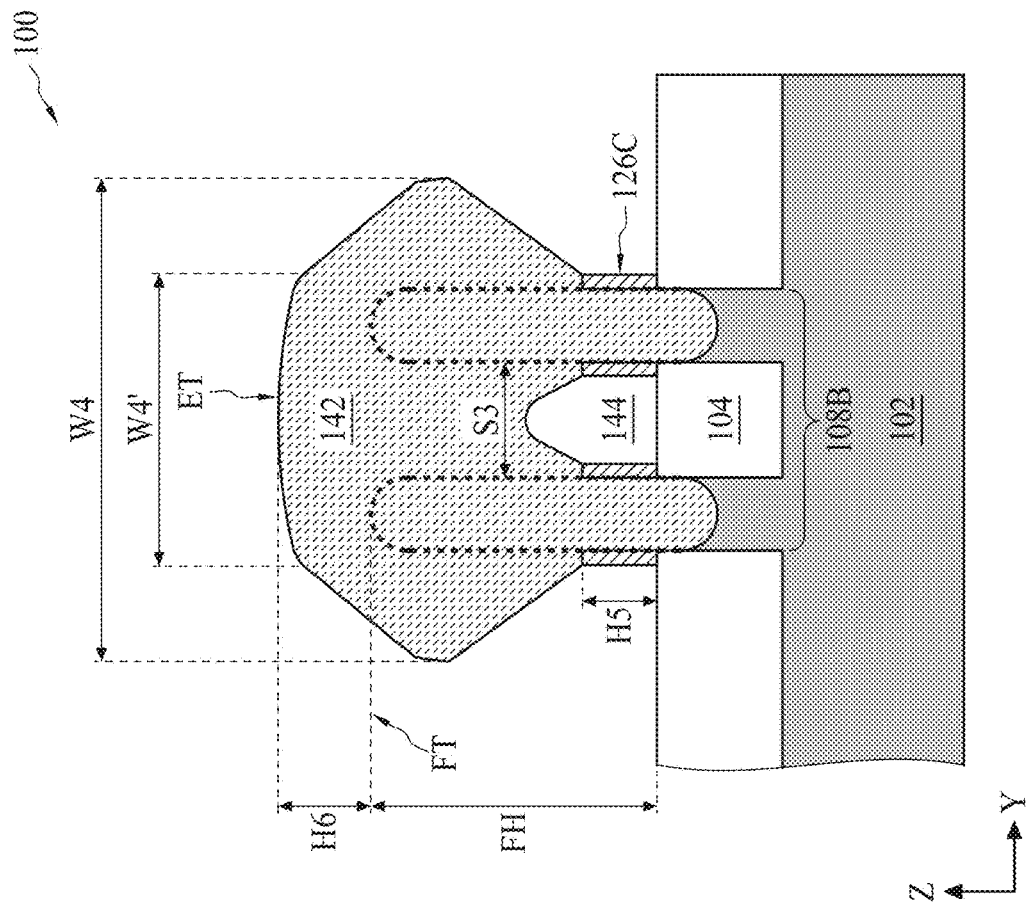
FIGS. 14D and 15G are cross-sectional views along dashed line HH' of the example workpiece depicted in FIGS. 14A and 15A, respectively, at various fabrication stages of the method of FIGS. 1, 2A, and/or 2B according to various aspects of the present disclosure.
Figure 15A:
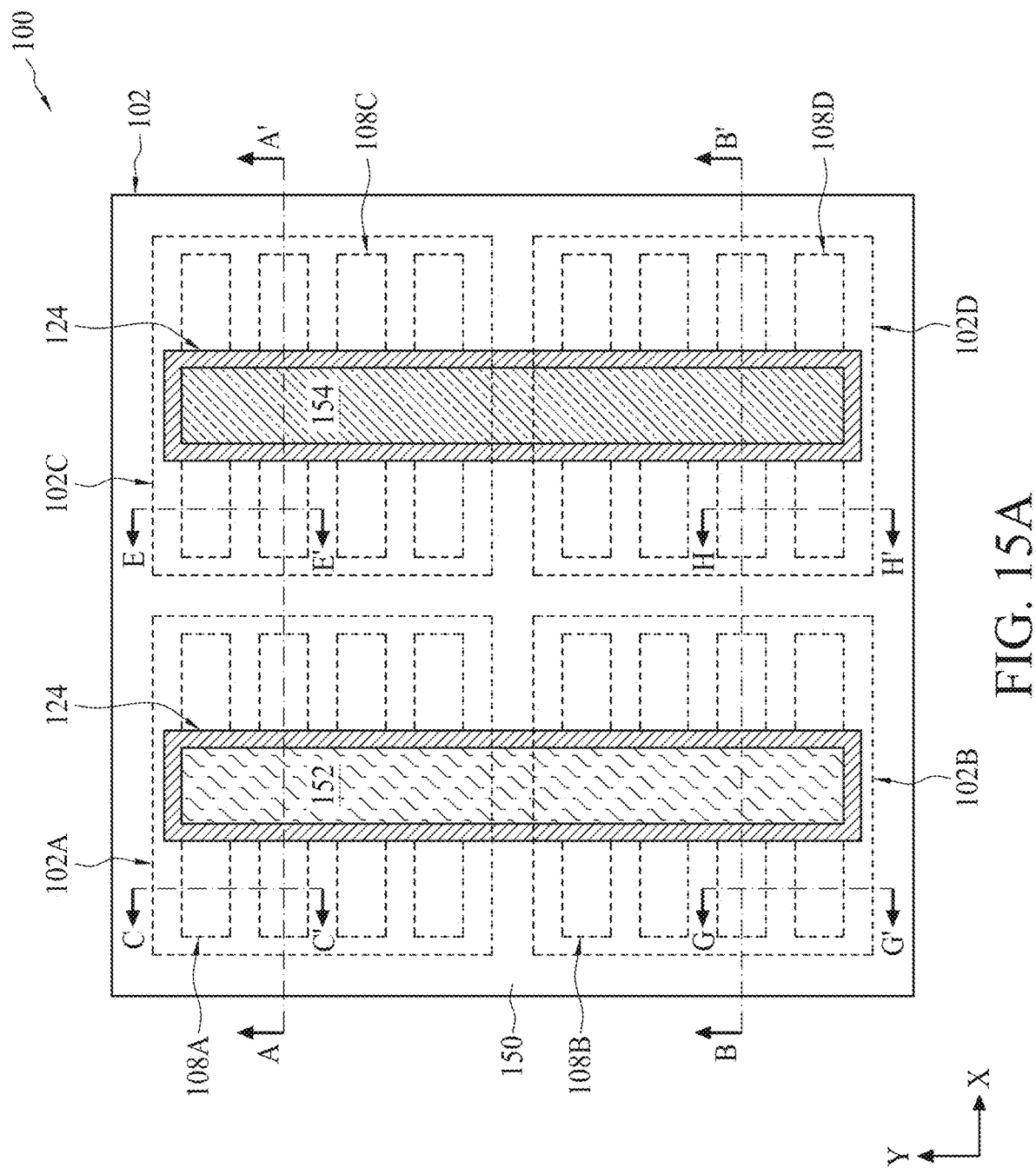
Figure 15B:
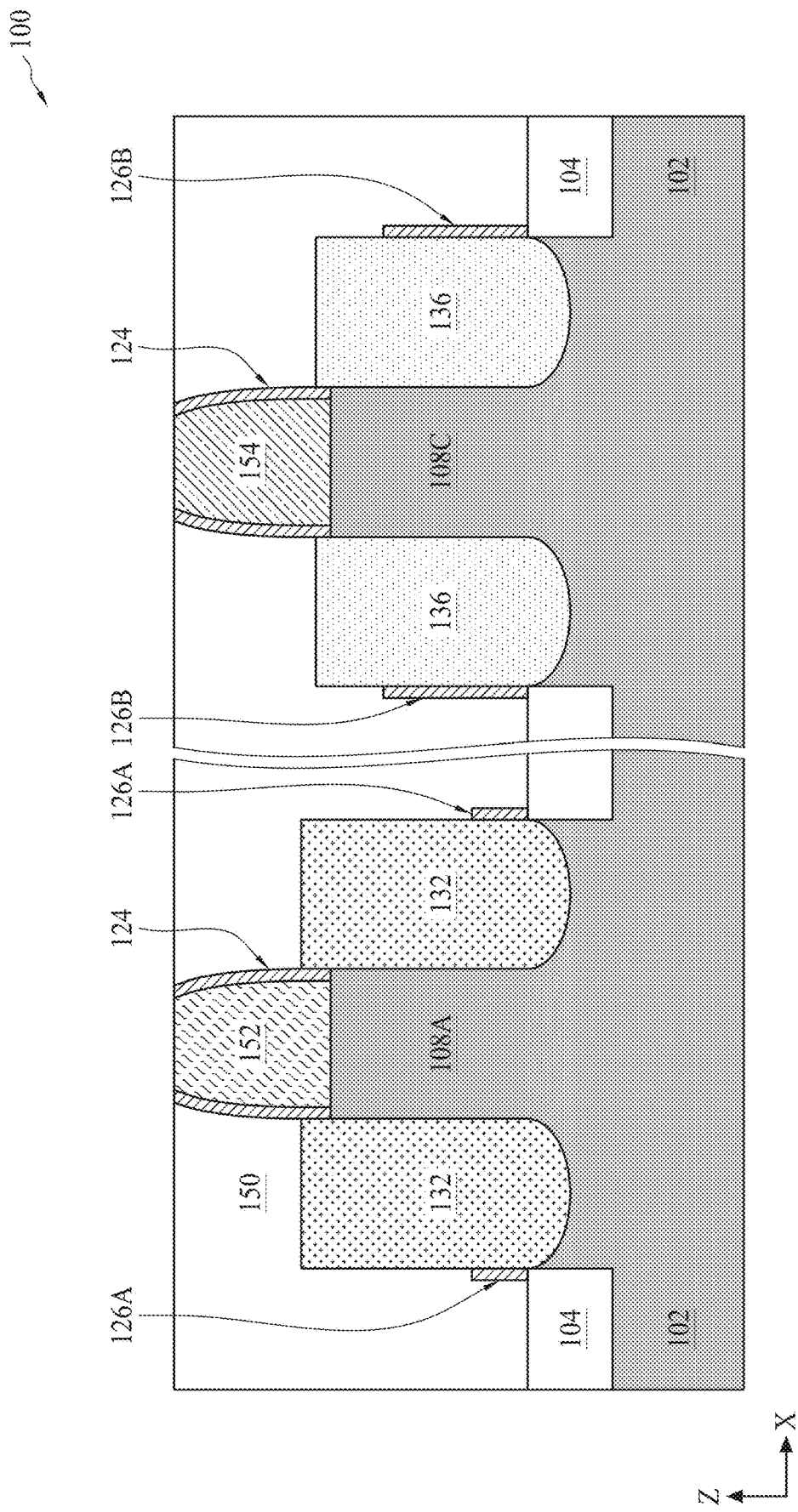
Figure 15D:
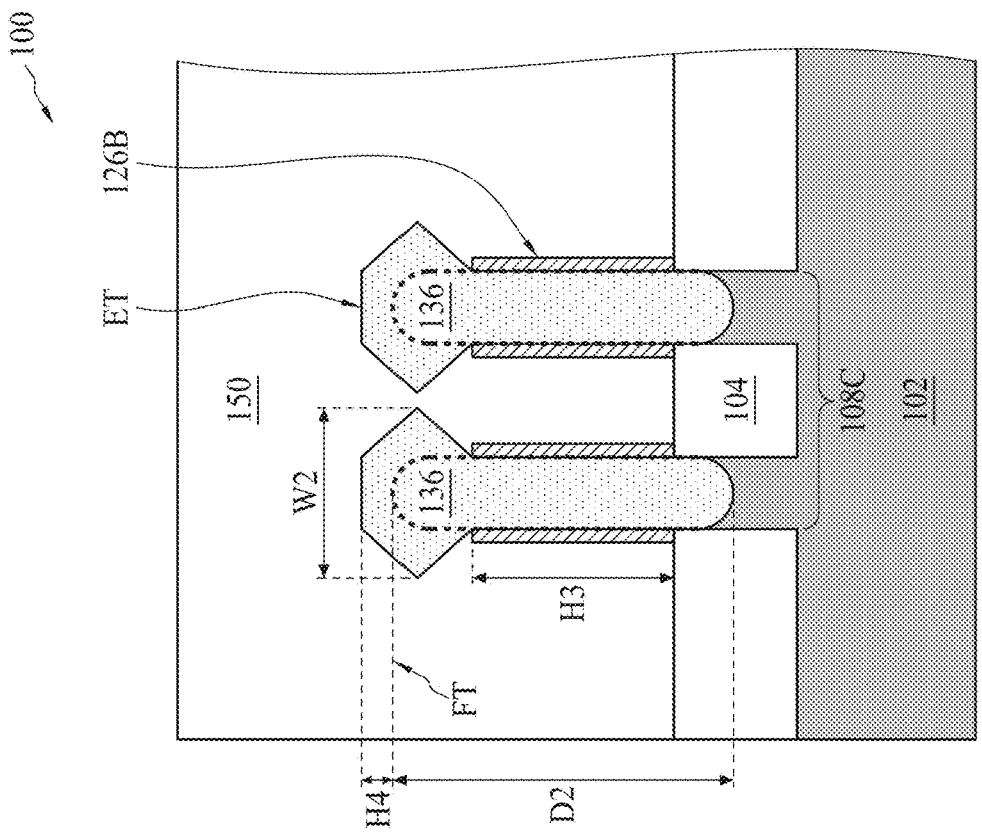
Figure 15C:
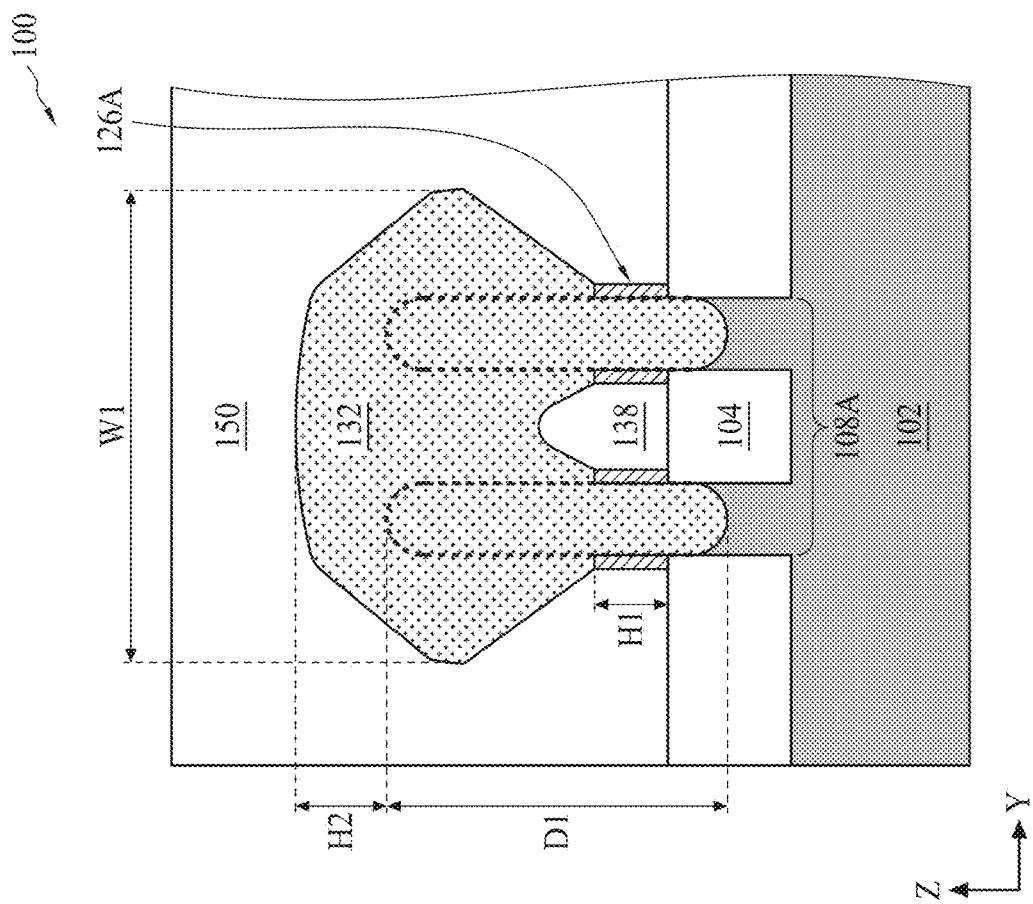
Figure 15E:
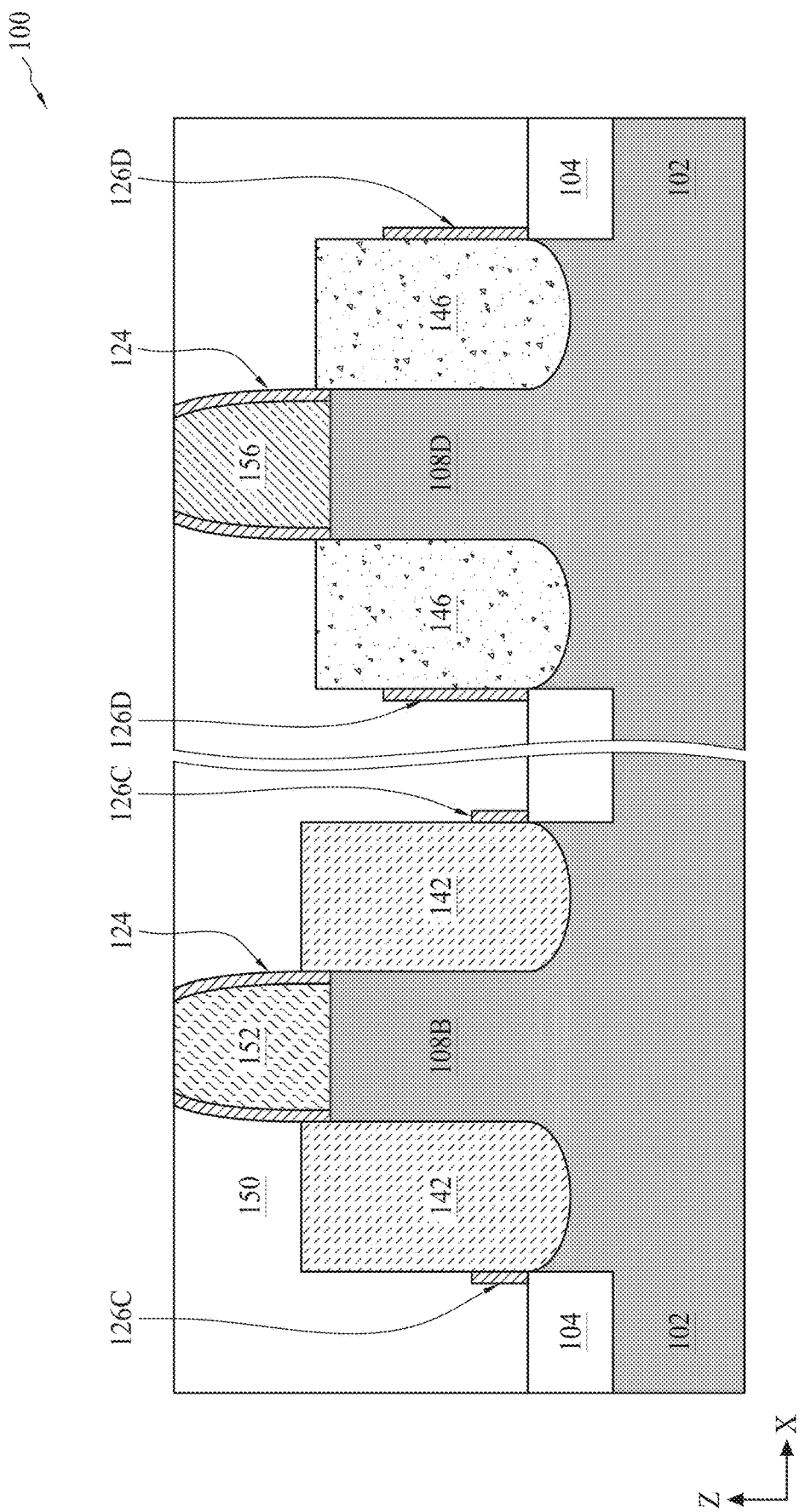
Figure 15F:
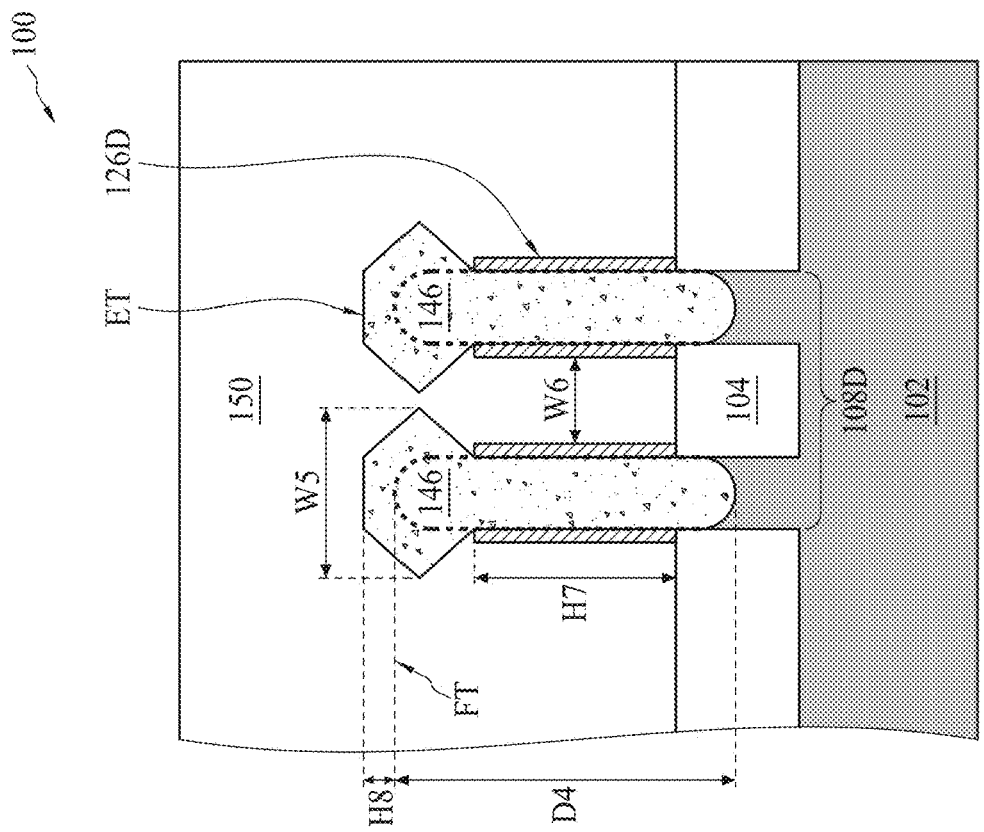
Figure 15G:
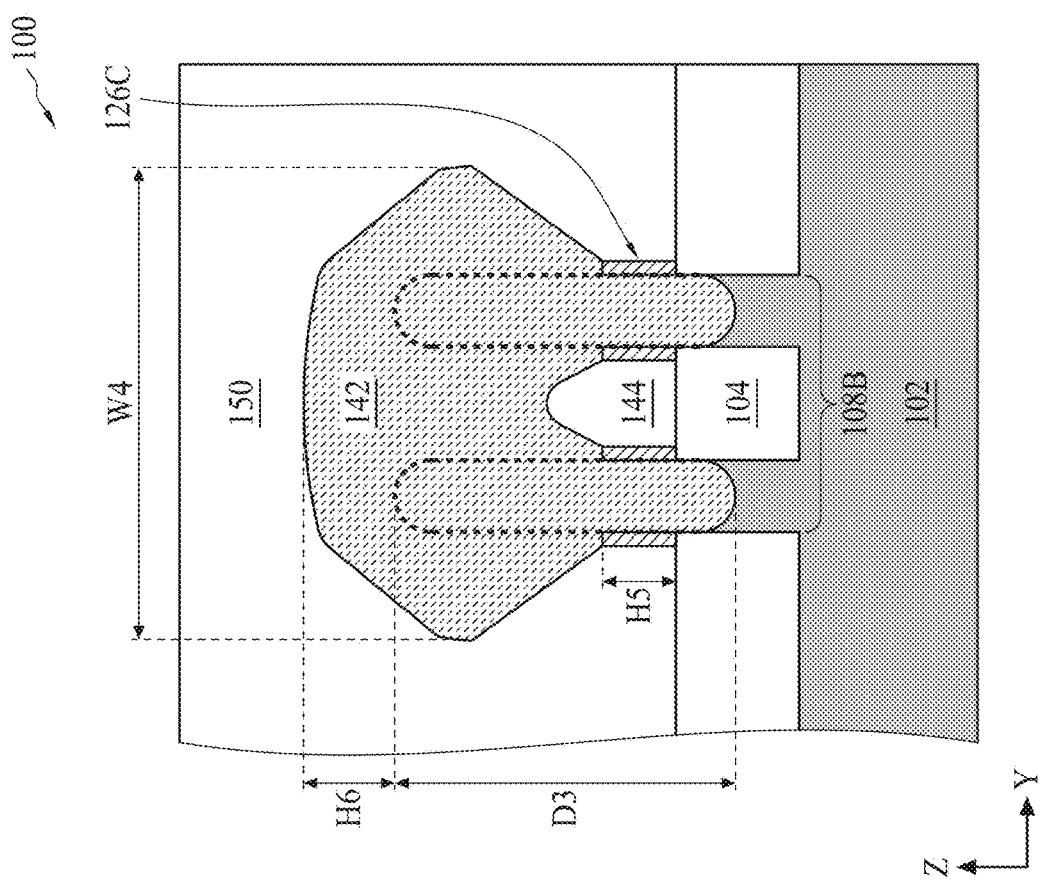

FIG. 1 is a flowchart of a method 200 for making a workpiece (also referred to as a semiconductor structure) 100 configured to provide various FETs, such as FinFETs. FIGS. 2A and 2B together illustrate a flowchart of a method 220 for making the workpiece 100, particularly the source/drain features thereof, which is encompassed by block 210 as shown in FIG. 1. Additional steps can be provided before, during, and after the method 200 and/or the method 220, and some of the steps described can be replaced or eliminated for other embodiments of the methods 200 and 220. Various stages of the methods 200 and/or 220 are discussed in detail with respect to FIGS. 3A-15G, where FIGS. 3A, 4A, 5A, 6A, 7A, 8A, 9A, 10A, 11A, 12A, 13A, 14A, and 15A are top views of the workpiece 100; FIGS. 3B, 4B, 5B, 6B, 7B, 8B, 9B, 10B, 11B, 12B, 13B, and 15B are cross-sectional views along dashed line AA' of the workpiece 100 depicted in FIGS. 3A, 4A, 5A, 6A, 7A, 8A, 9A, 10A, 11A, 12A, 13A, 14A, and 15A, respectively; FIGS. 3C, 4C, 5C, 6C, 7C, 8C, 9C, and 15C are cross-sectional views along dashed line CC' of the workpiece 100 depicted in FIGS. 3A, 4A, 5A, 6A, 7A, 8A, 9A, and 15A, respectively; FIGS. 3D, 4D, 5D, 6D, 7D, 8D, and 9D are cross-sectional views along dashed line DD' of the workpiece 100 depicted in FIGS. 3A, 4A, 5A, 6A, 7A, 8A, and 9A, respectively; FIGS. 10C, 11C, 12C, 13C, and 15D are cross-sectional views along dashed line EE' of the workpiece 100 depicted in FIGS. 10A, 11A, 12A, 13A, and 15A, respectively; FIGS. 10D, 11D, 12D, and 13D are cross-sectional views along dashed line FF' of the workpiece 100 depicted in FIGS. 10A, 11A, 12A, and 13A, respectively; FIGS. 14B and 15E are cross-sectional views along dashed line BB' of the workpiece 100 depicted in FIGS. 14A and 15A, respectively; FIGS. 14C and 15F are cross-sectional views along dashed line GG' of the workpiece 100 depicted in FIGS. 14A and 15A, respectively; FIGS. 14D and 15G are cross-sectional views along dashed line HH' of the workpiece 100 depicted in FIGS. 14A and 15A, respectively.

Referring first to block 202 of FIG. 1 and to FIGS. 3A-3D, the method 200 receives (or is provided with) the workpiece 100 that includes a substrate 102. In various examples, the substrate 102 may include an elementary (single element) semiconductor, such as silicon or germanium in a crystalline structure; a compound semiconductor, such as silicon germanium, silicon carbide, gallium arsenic, gallium phosphide, indium phosphide, indium arsenide, and/or indium antimonide; a non-semiconductor material, such as soda-lime glass, fused silica, fused quartz, and/or calcium fluoride (CaF$_2$), other suitable materials, or combinations thereof. In some embodiments, the substrate 102 includes silicon germanium (Si$_{1-x}$Ge$_x$), where a composition of Ge(x) is about 5% to about 50%. Furthermore, the silicon germanium-containing substrate 102 may be doped with a p-type dopant, such as boron, gallium, aluminum, indium, other suitable p-type dopants, or combinations thereof.

The substrate 102 may be uniform in composition or may include various layers. The layers may have similar or different compositions, and in various embodiments, some substrate layers have non-uniform compositions to induce device strain and thereby tune device performance. Examples of layered substrates include silicon-on-insulator (SOI) substrates 102. In some such examples, a layer of the substrate 102 may include an insulator such as a silicon oxide, a silicon nitride, a silicon oxynitride, a silicon carbide, other suitable insulator materials, or combinations thereof.

In some embodiments, the workpiece 100 includes various doped regions (or wells) formed in or over the substrate 102. Each doped region may be implanted with one or more dopant according to specific design requirement. For example, an n-type well may include an n-type dopant, such as phosphorus, arsenic, antimony, other n-type dopants, or combinations thereof, and a p-type well may include a p-type dopant, such as boron, indium, gallium, aluminum, other p-type dopants, or combinations thereof. In some embodiments, the substrate 102 includes doped regions having a combination of p-type dopants and n-type dopants. The various doped regions can be formed directly on and/or in the substrate 102, for example, providing a p-well structure, an n-well structure, a dual-well structure, a raised structure, or combinations thereof. Each of the various doped regions may be formed by performing an ion implantation process, a diffusion process, other suitable doping processes, or combinations thereof.

Figure 3A:
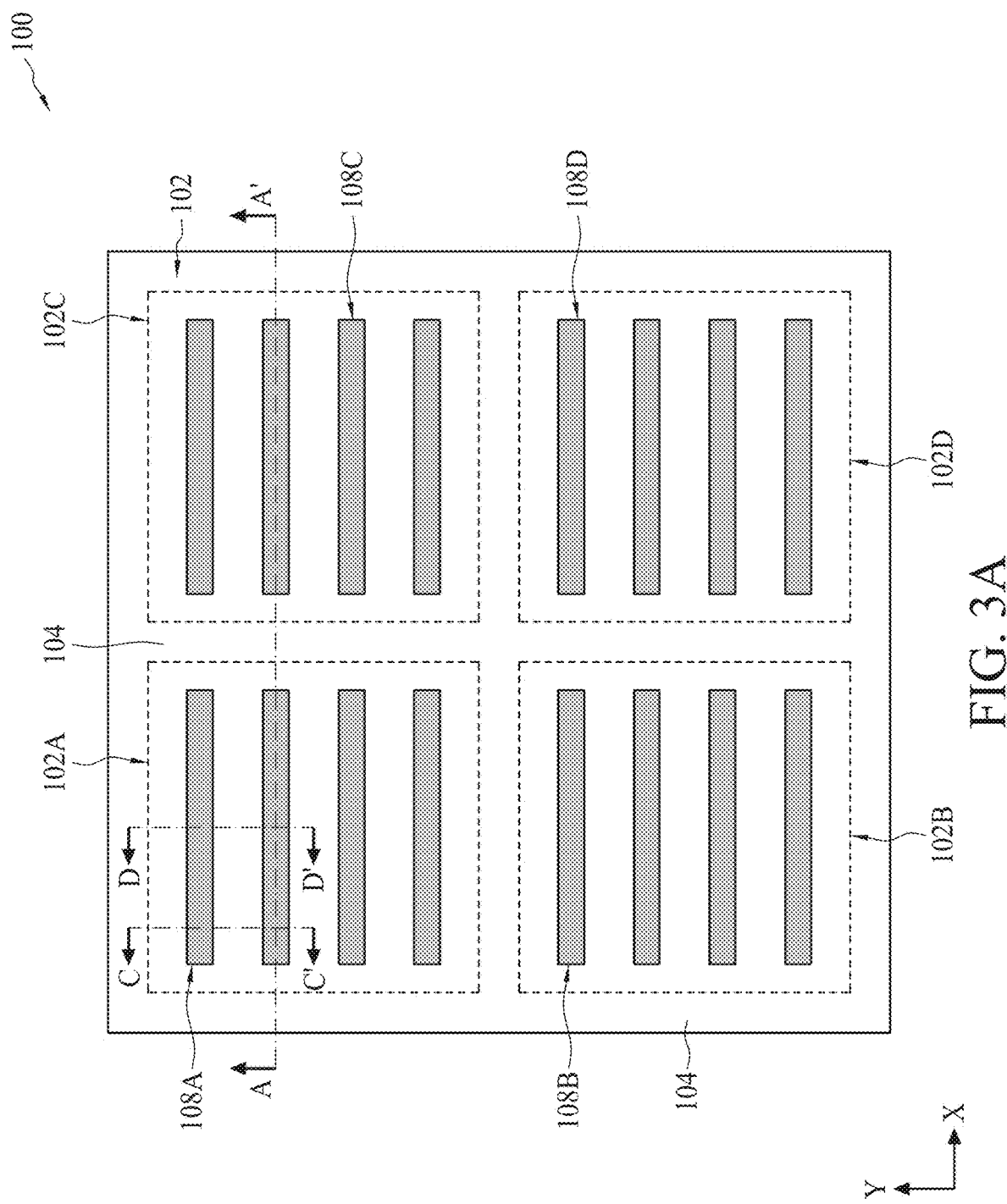
FIGS. 3A, 4A, 5A, 6A, 7A, 8A, 9A, 10A, 11A, 12A, 13A, 14A, and 15A are top views of an example workpiece at various fabrication stages of the method of FIGS. 1, 2A, and/or 2B according to various aspects of the present disclosure.
Figure 3B:
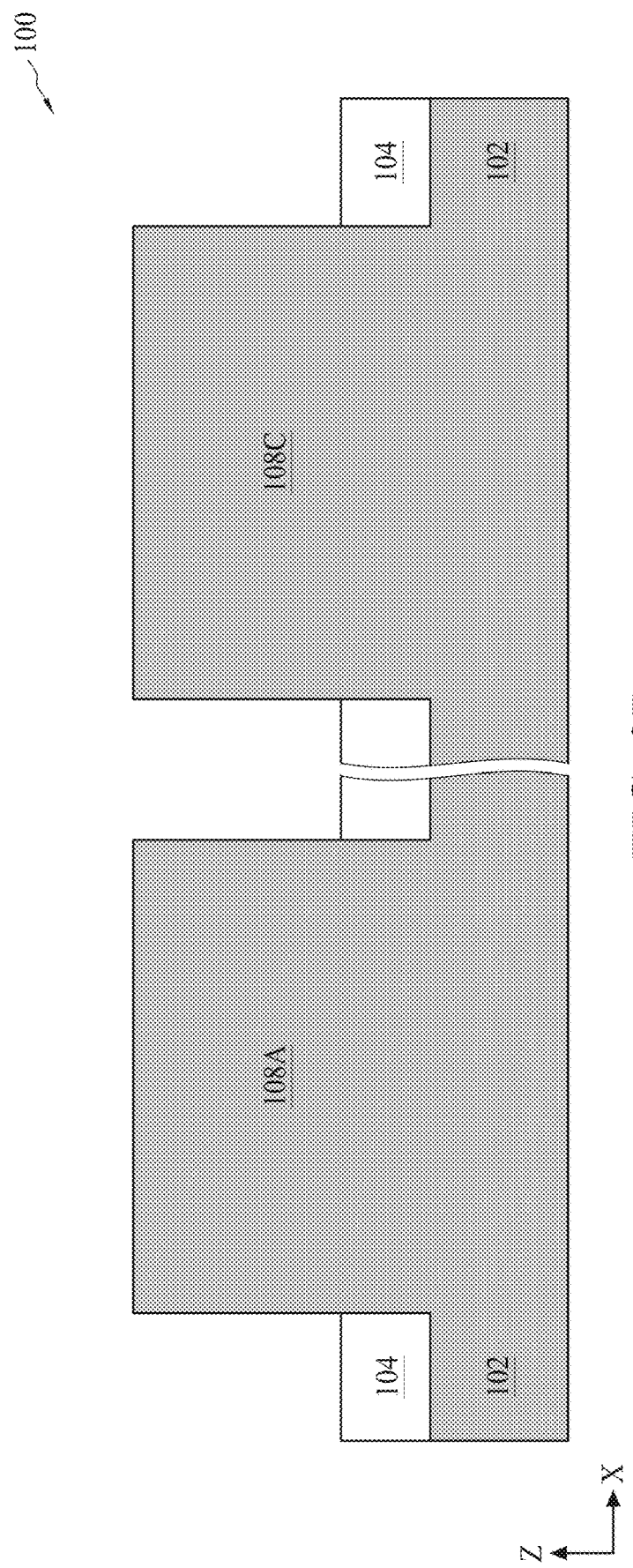
FIGS. 3B, 4B, 5B, 6B, 7B, 8B, 9B, 10B, 11B, 12B, 13B, and 15B are cross-sectional views along dashed line AA' of the example workpiece depicted in FIGS. 3A, 4A, 5A, 6A, 7A, 8A, 9A, 10A, 11A, 12A, 13A, and 15A, respectively, at various fabrication stages of the method of FIGS. 1, 2A, and/or 2B according to various aspects of the present disclosure.
Figure 3D:
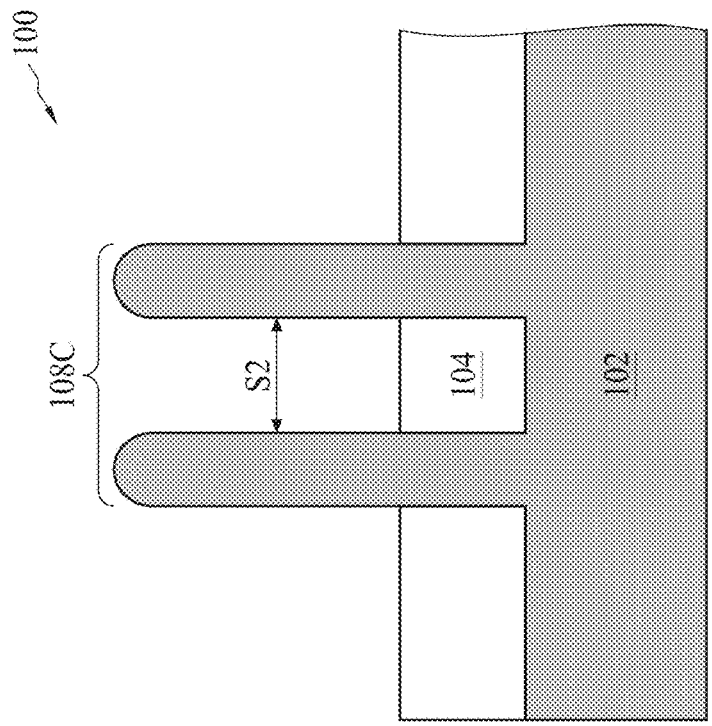
FIGS. 3D, 4D, 5D, 6D, 7D, 8D, and 9D are cross-sectional views along dashed line DD' of the example workpiece depicted in FIGS. 3A, 4A, 5A, 6A, 7A, 8A, and 9A, respectively, at various fabrication stages of the method of FIGS. 1, 2A, and/or 2B according to various aspects of the present disclosure.
Figure 3C:
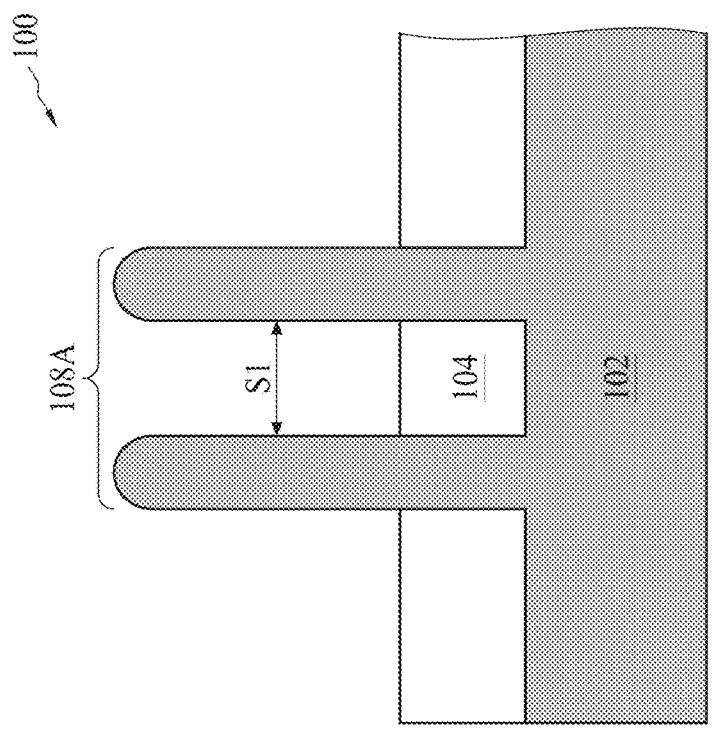
FIGS. 3C, 4C, 5C, 6C, 7C, 8C, 9C, and 15C are cross-sectional views along dashed line CC' of the example workpiece depicted in FIGS. 3A, 4A, 5A, 6A, 7A, 8A, 9A, and 15A, respectively, at various fabrication stages of the method of FIGS. 1, 2A, and/or 2B according to various aspects of the present disclosure.
Figure 4A:
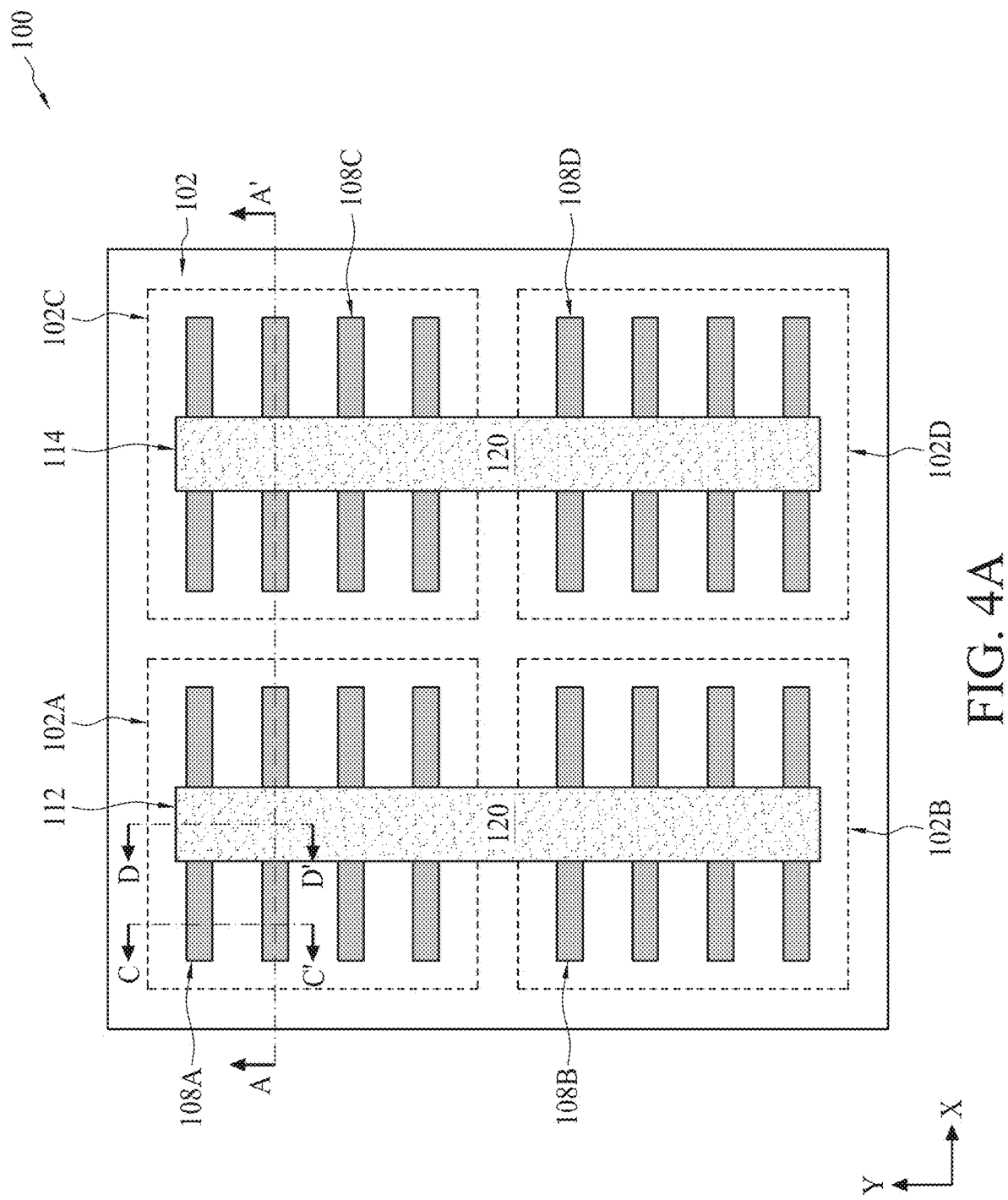
Figure 4B:
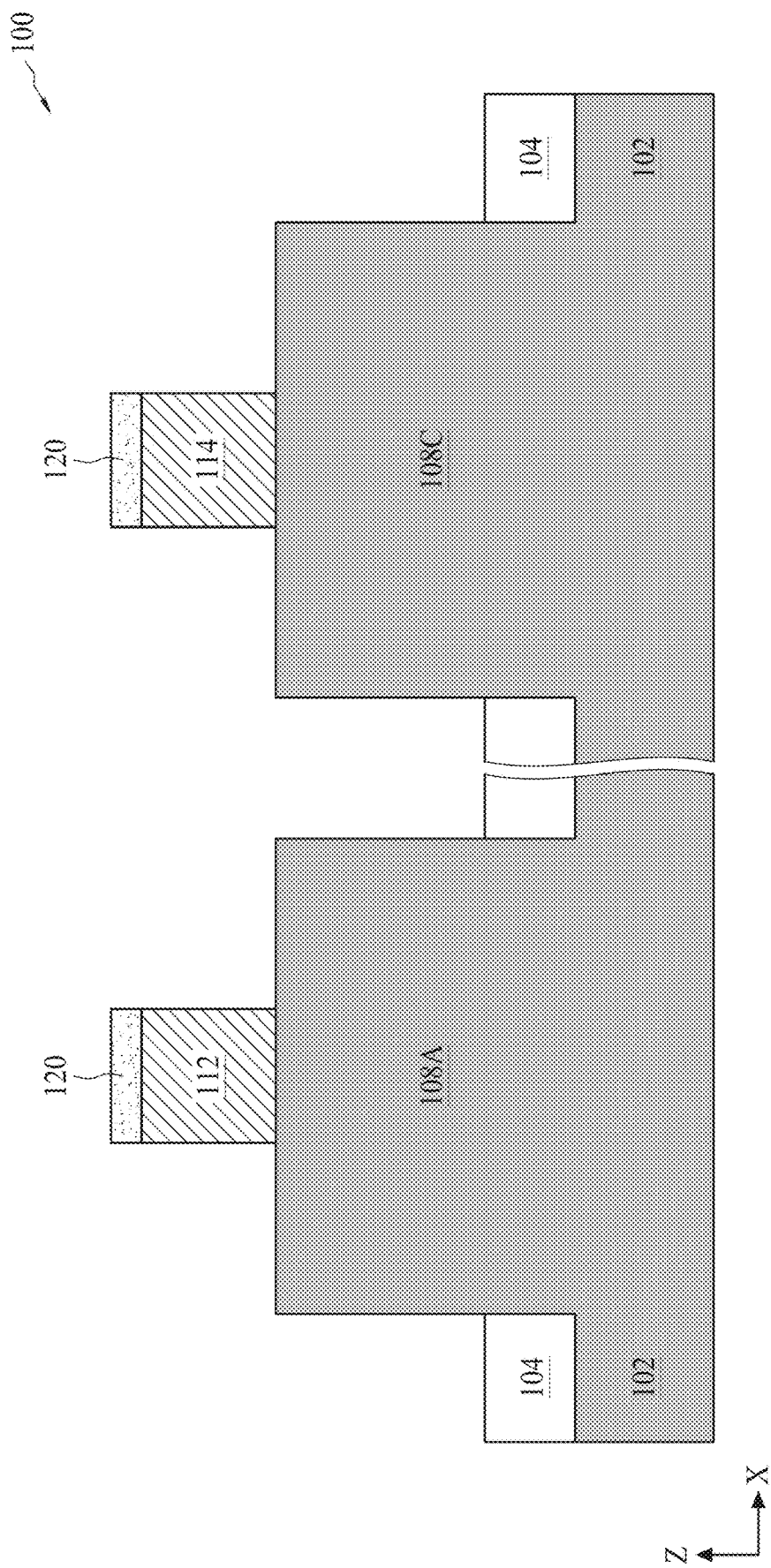
Figure 4D:
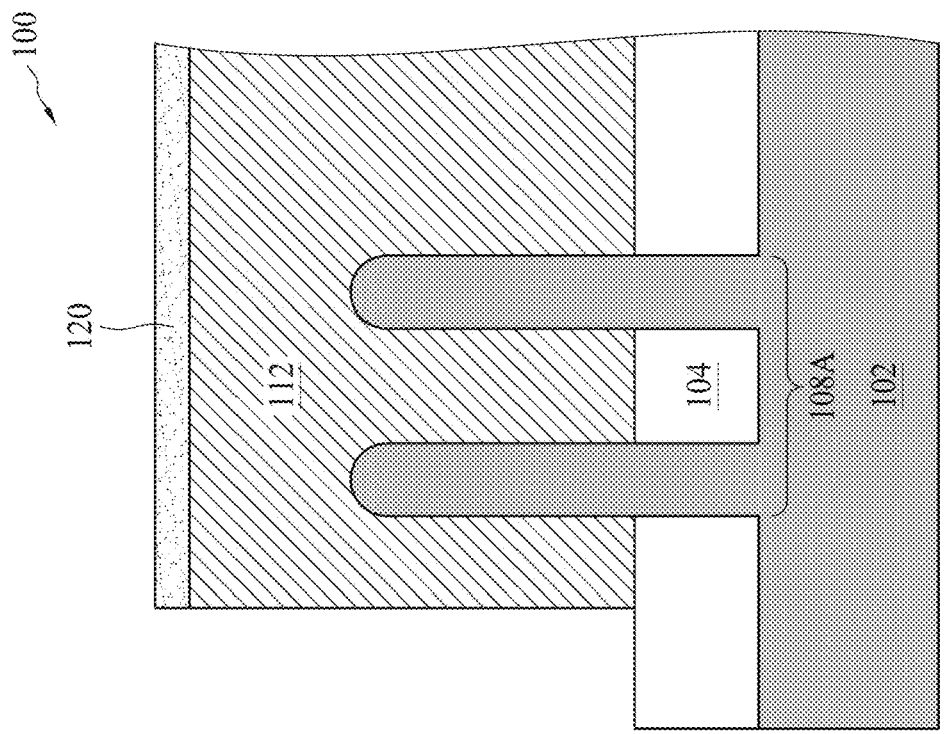
Figure 4C:
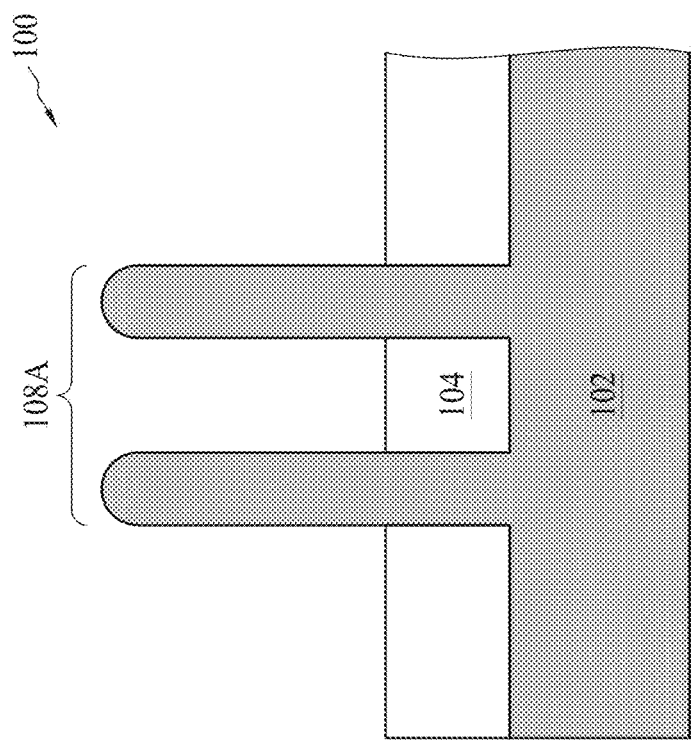
Figure 5A:
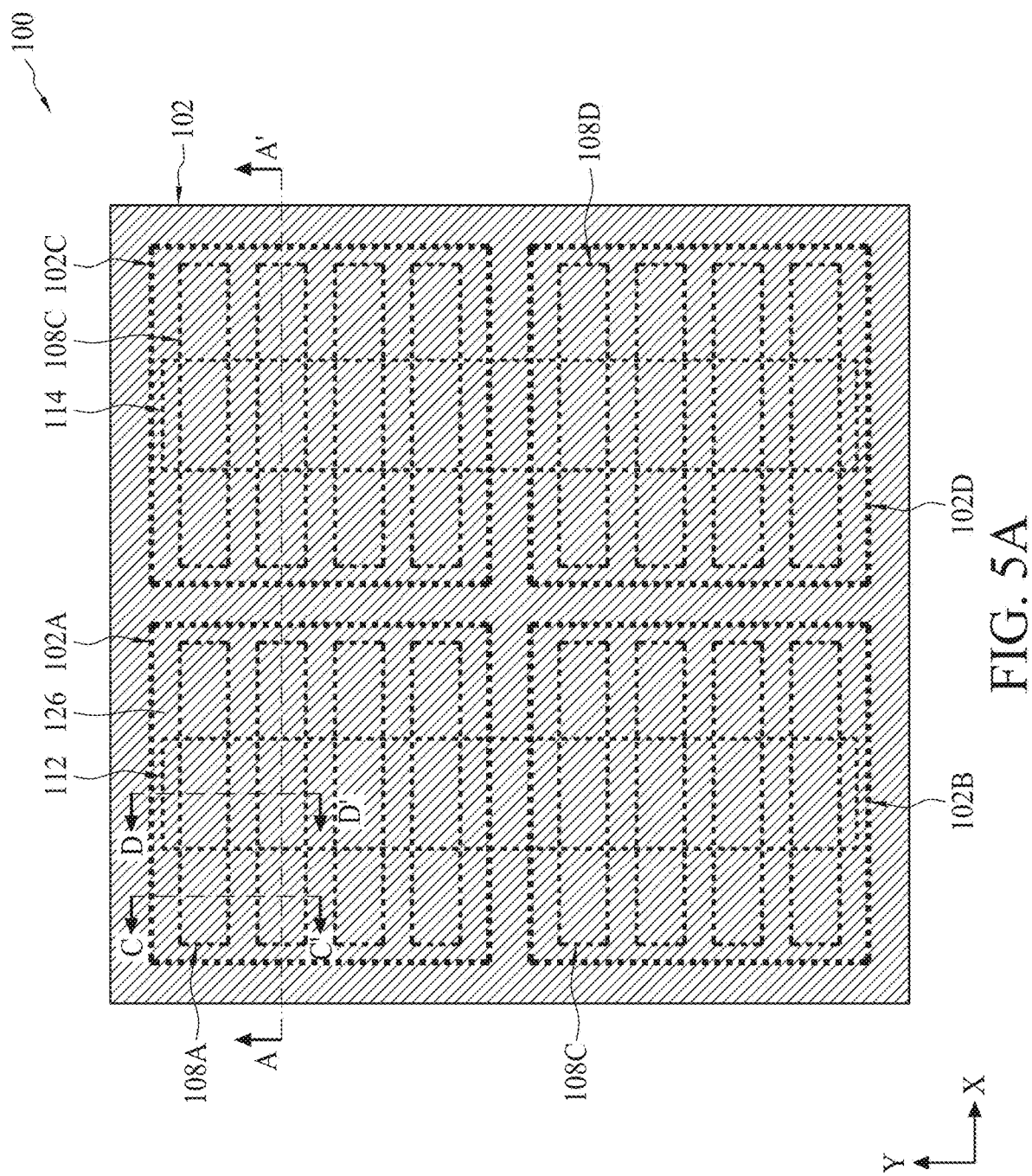
Figure 5B:
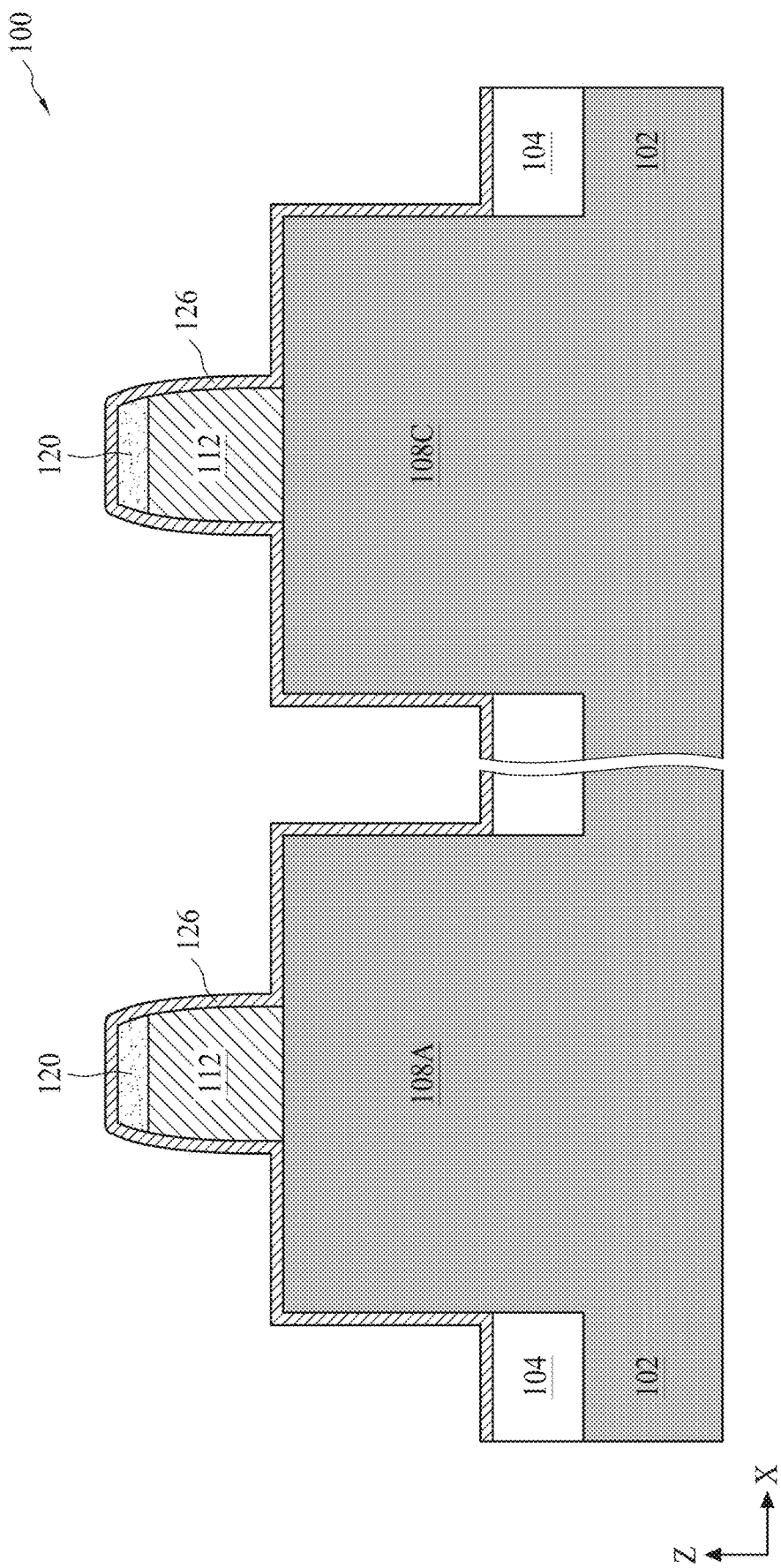
Figure 5D:
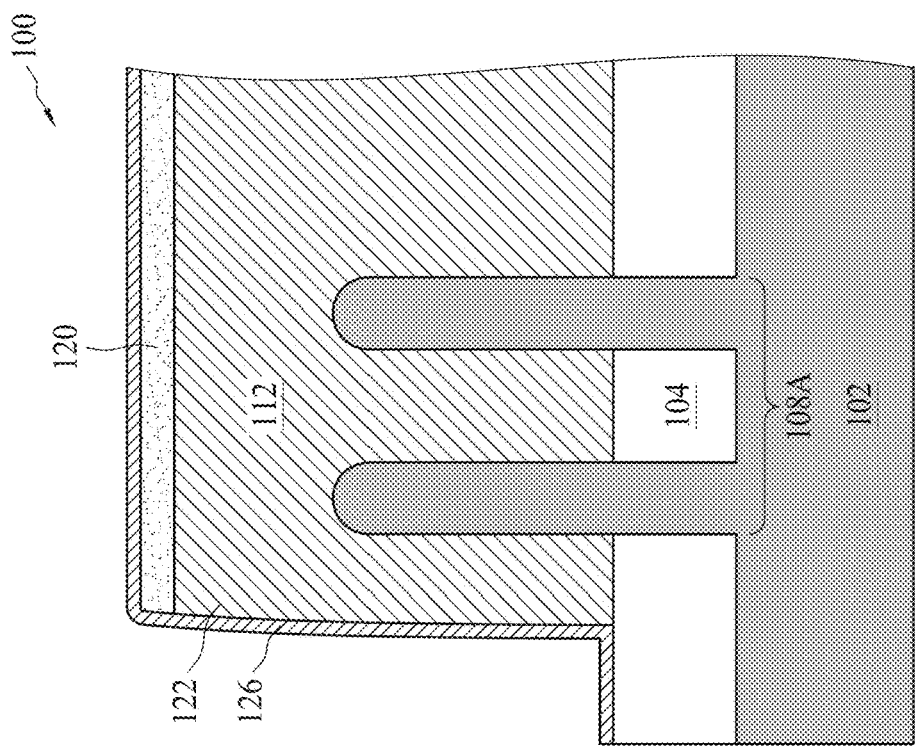
Figure 5C:
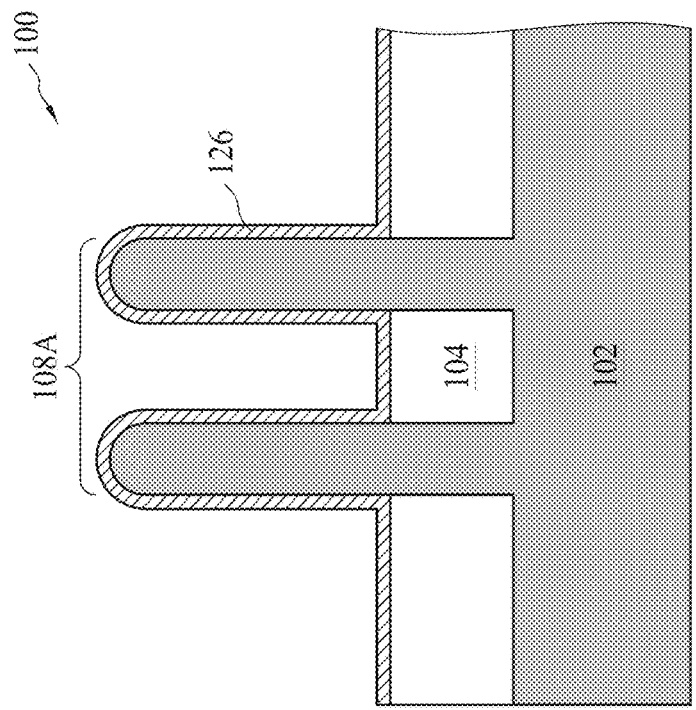
Figure 6A:
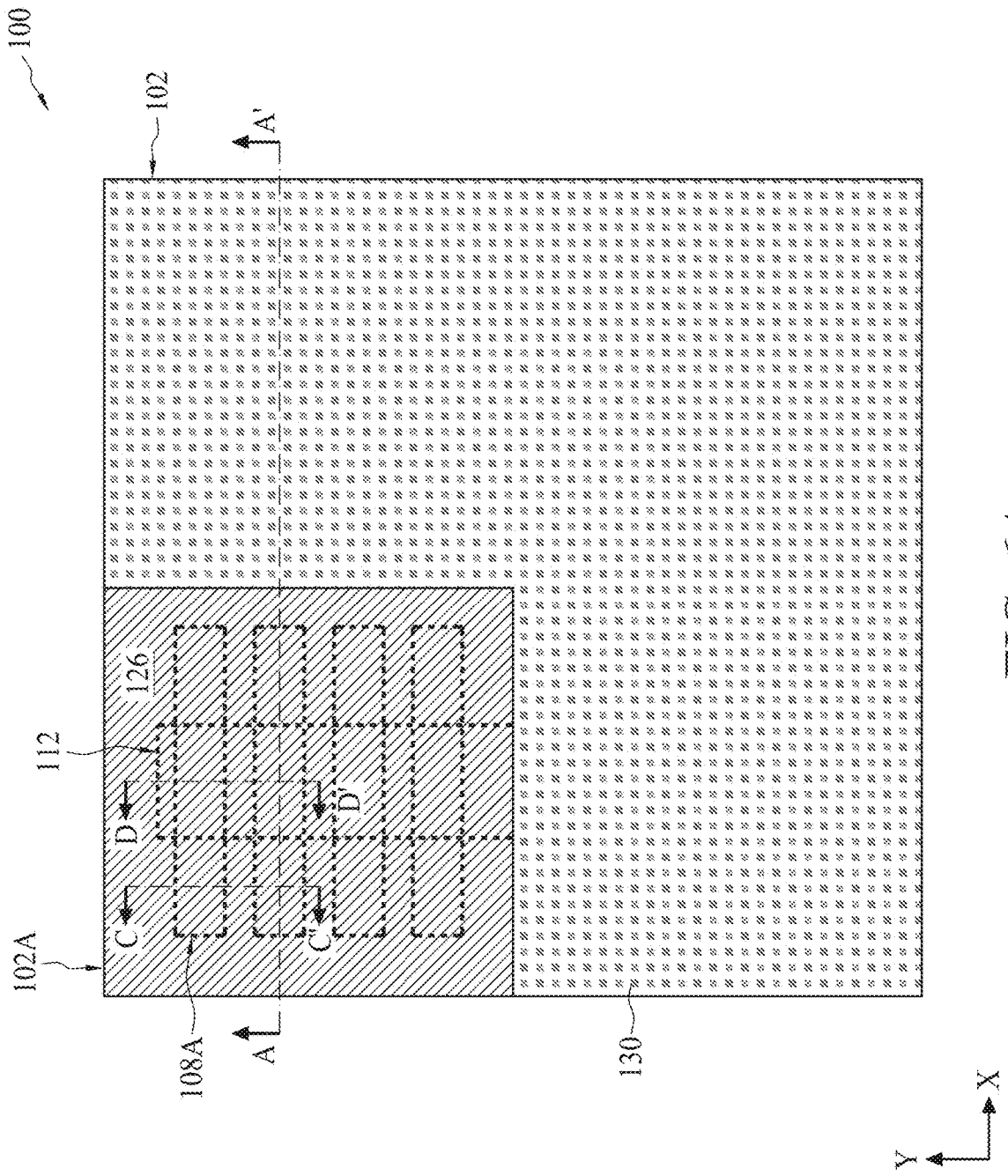
Figure 6B:
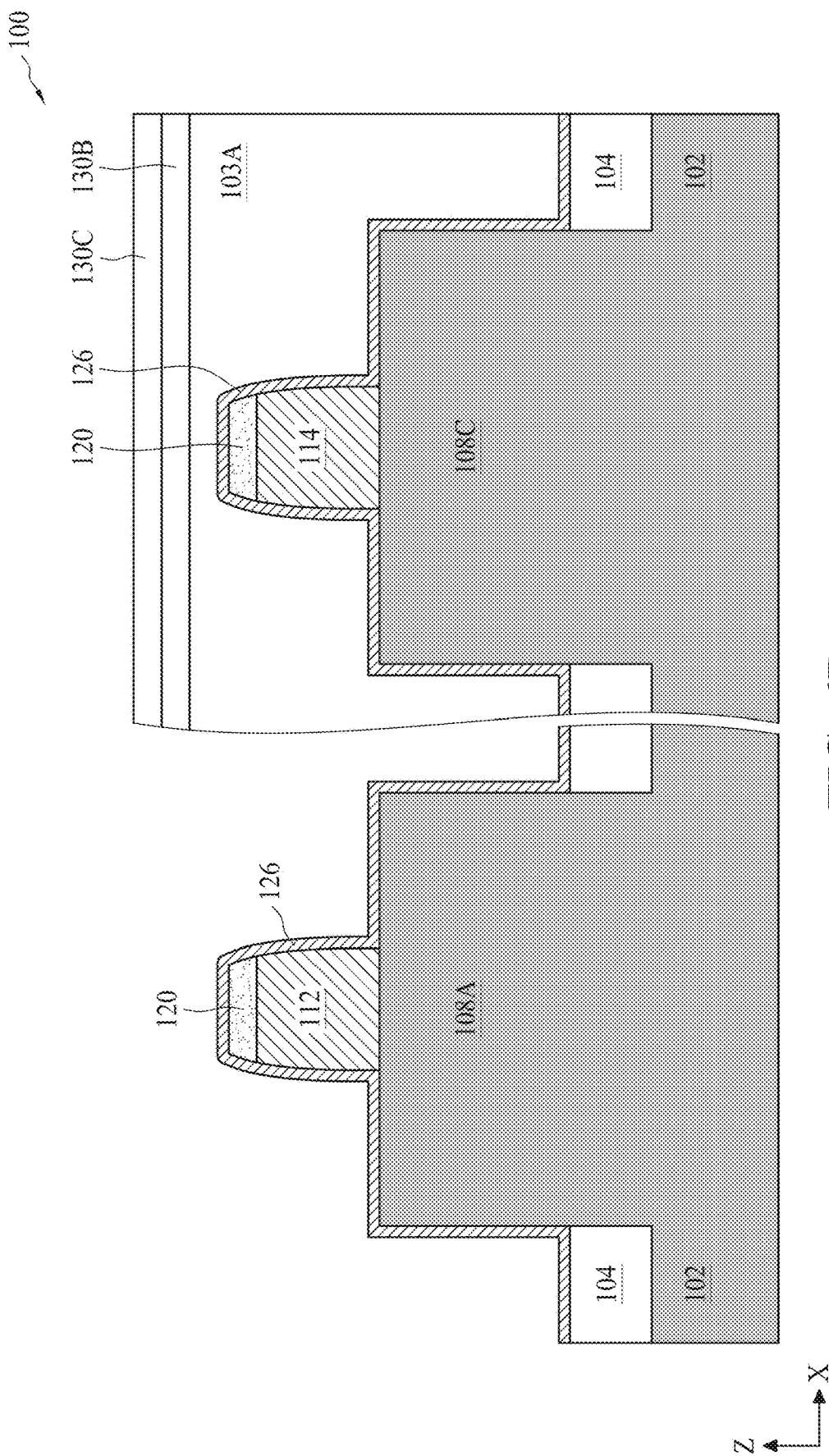
Figure 6D:
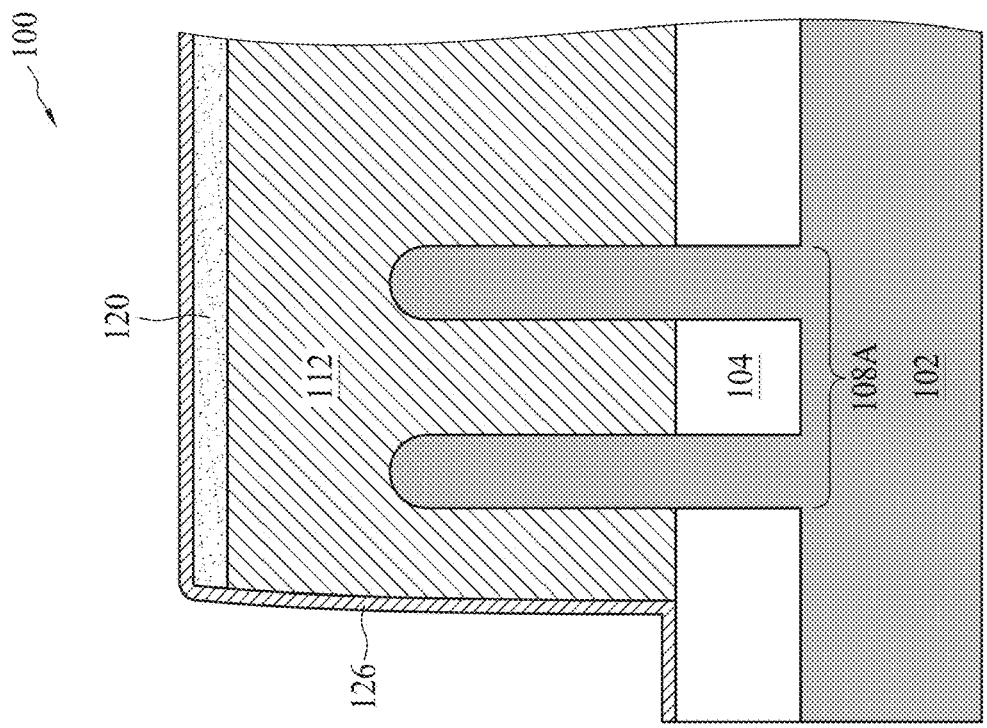
Figure 6C:
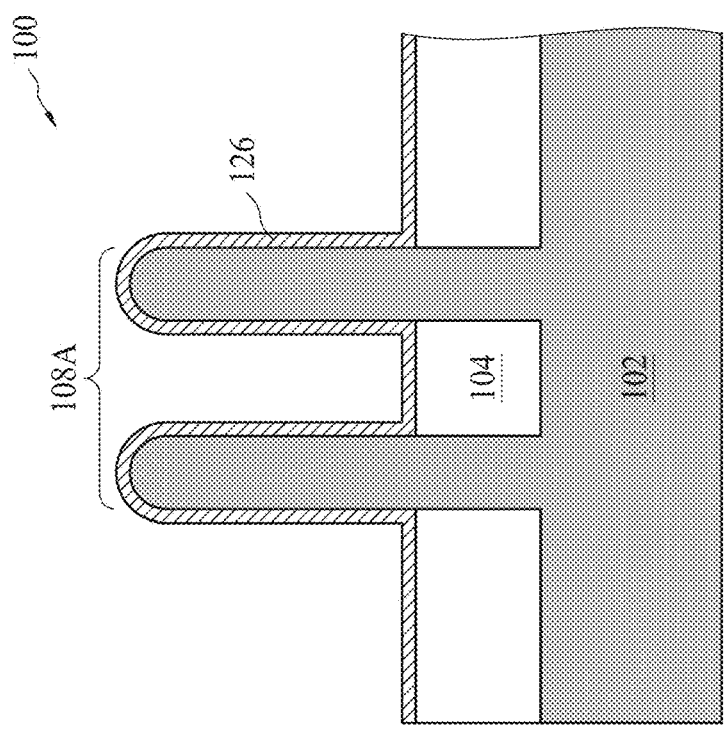
Figure 7A:
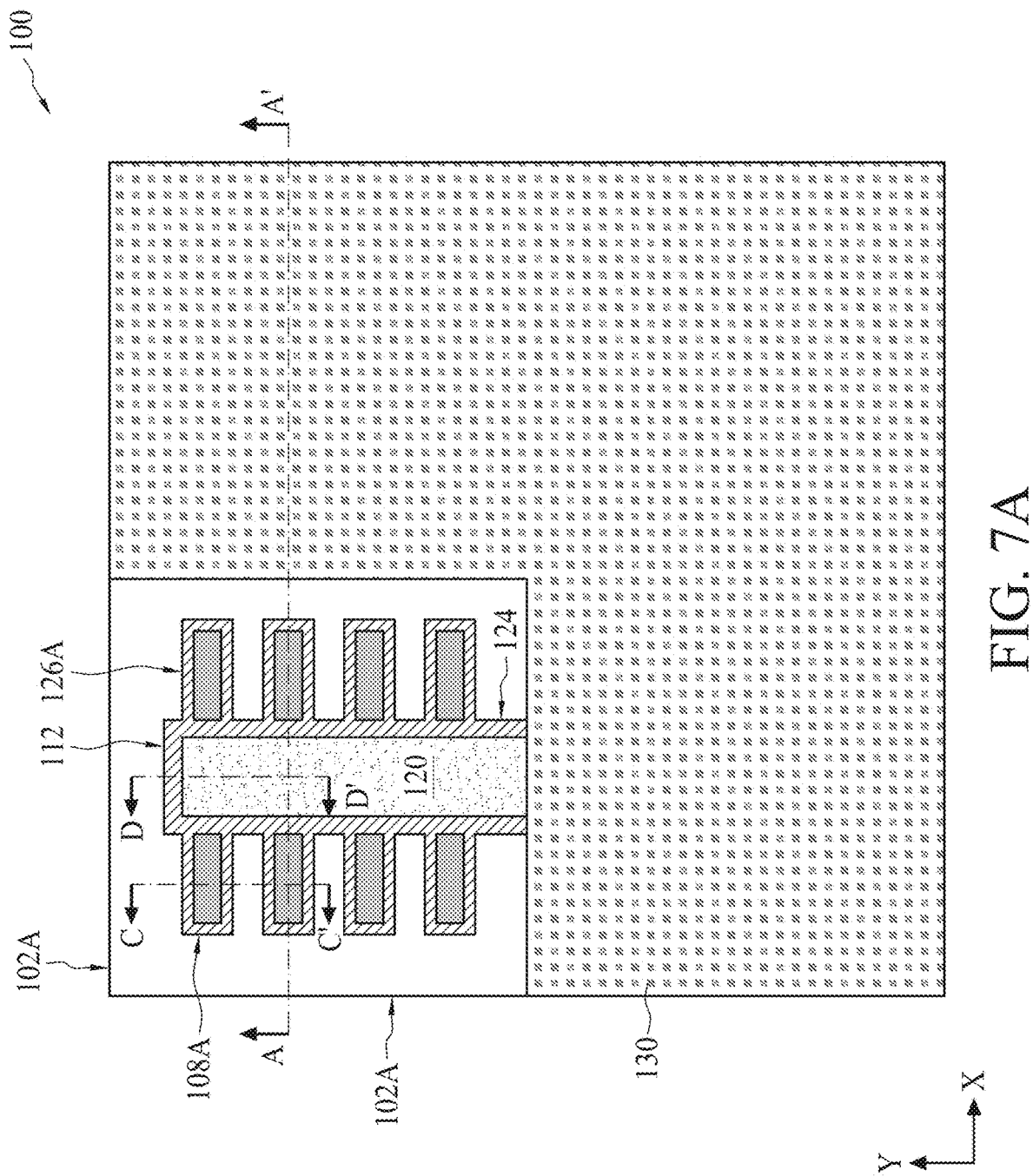
Figure 7B:
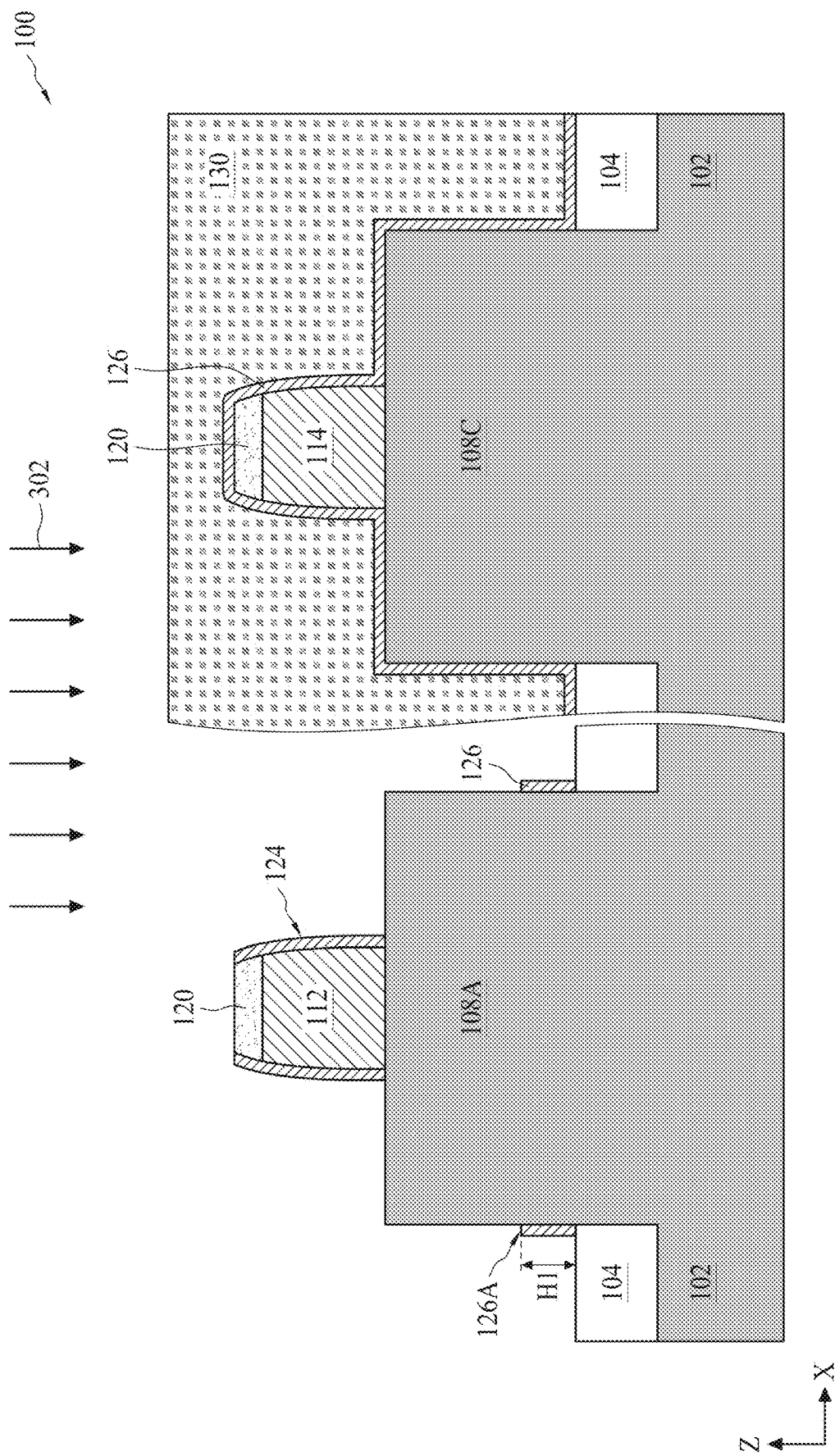
Figure 7C:
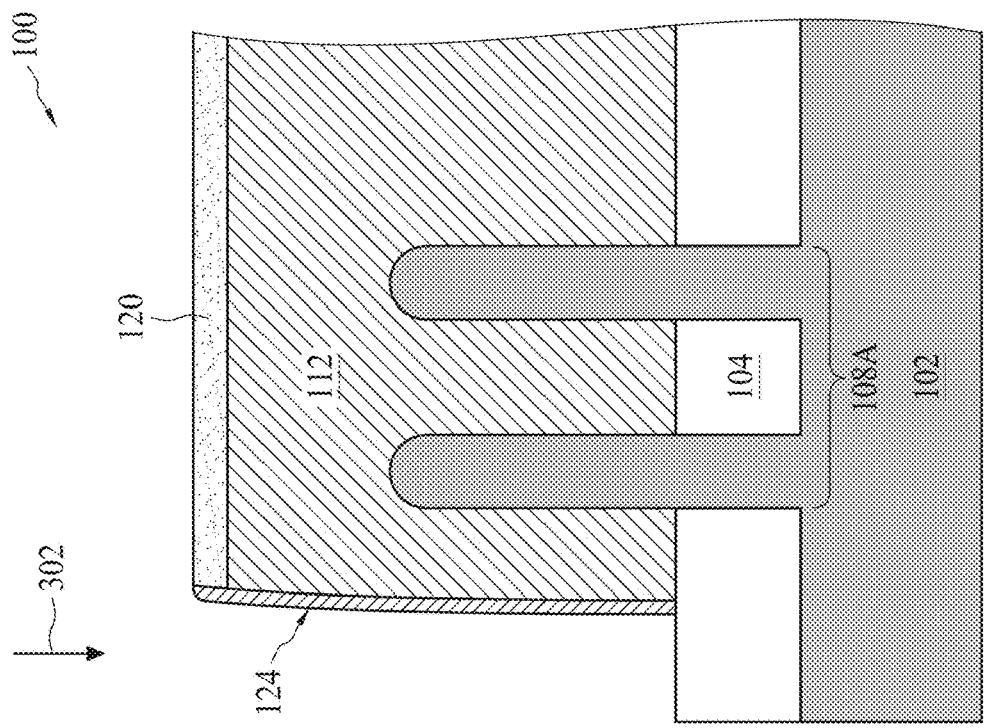
Figure 7D:
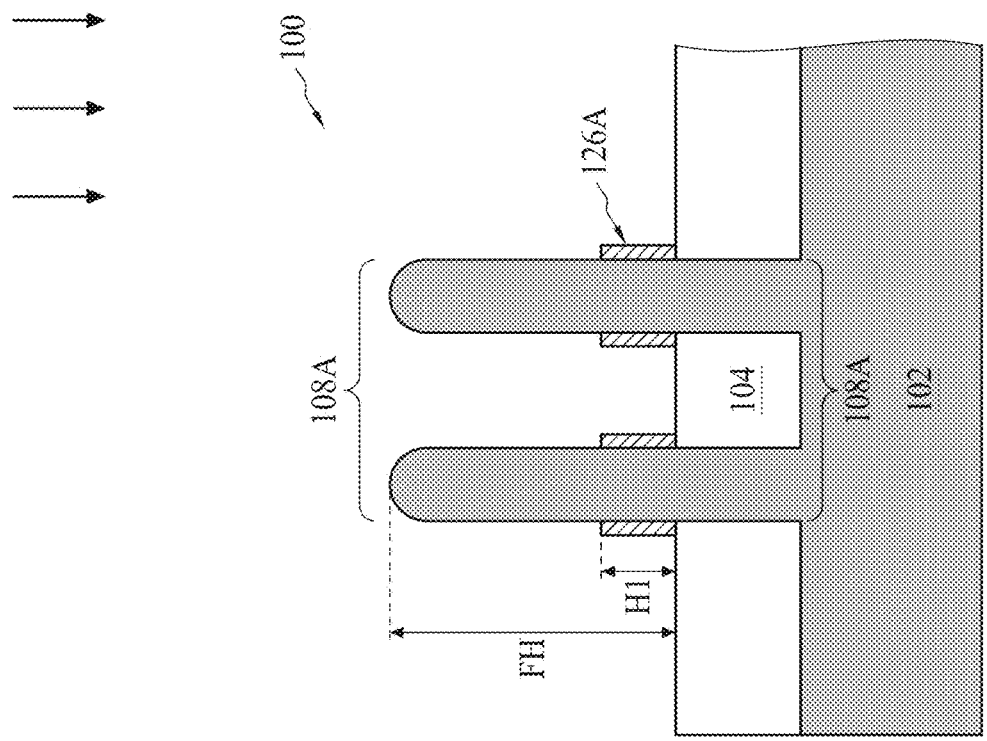
Figure 8A:
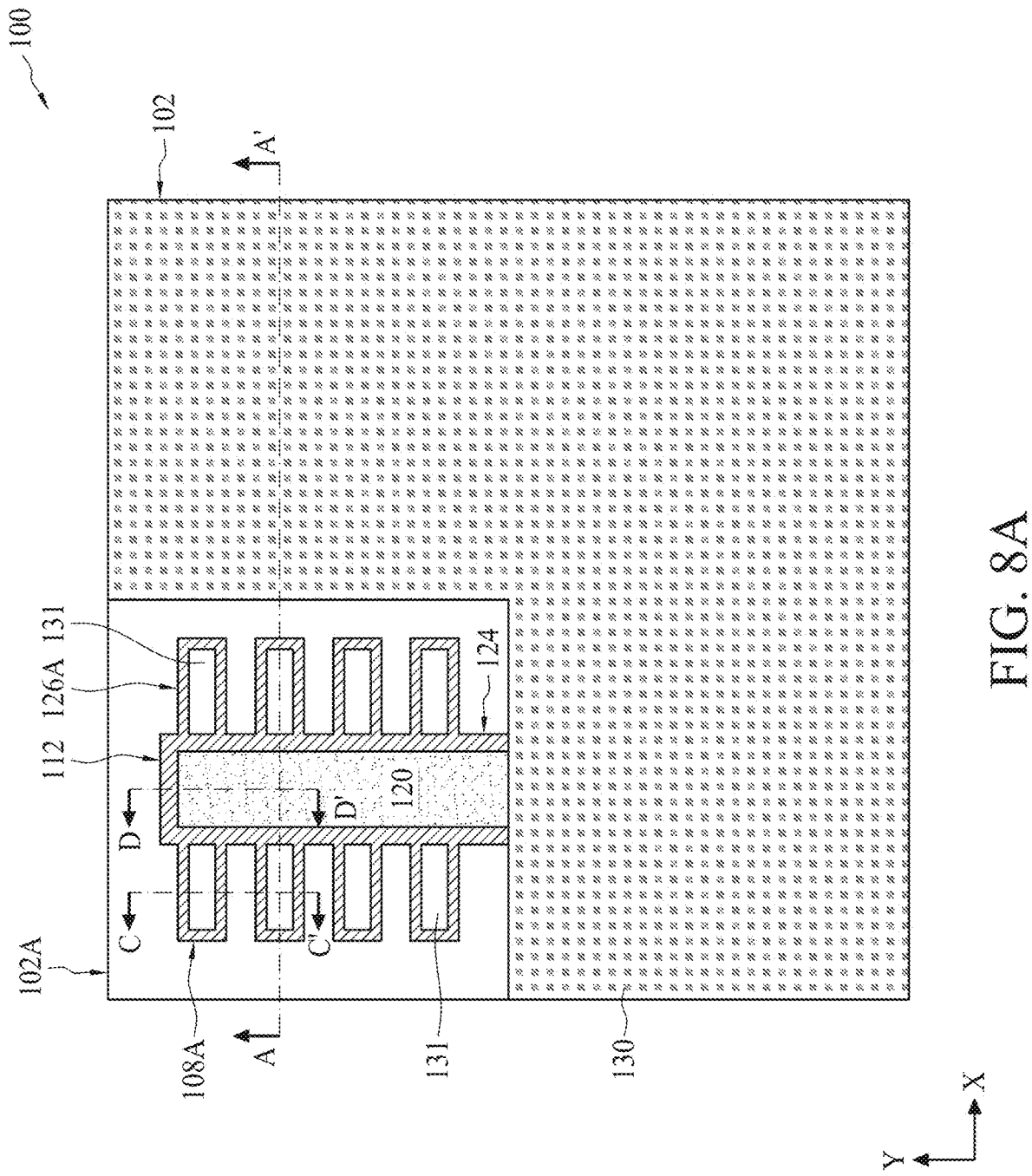
Figure 8B:
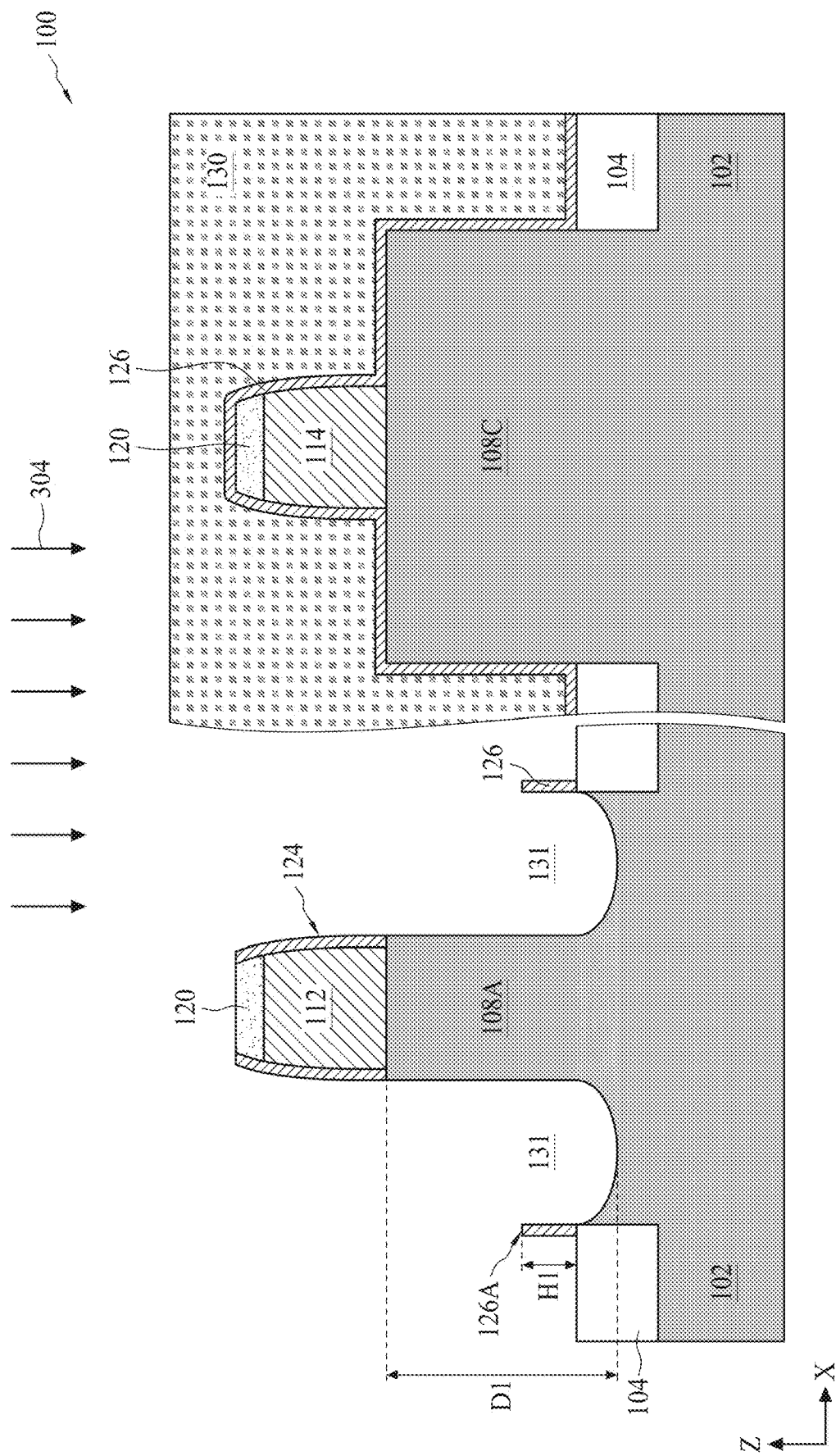
Figure 8C:
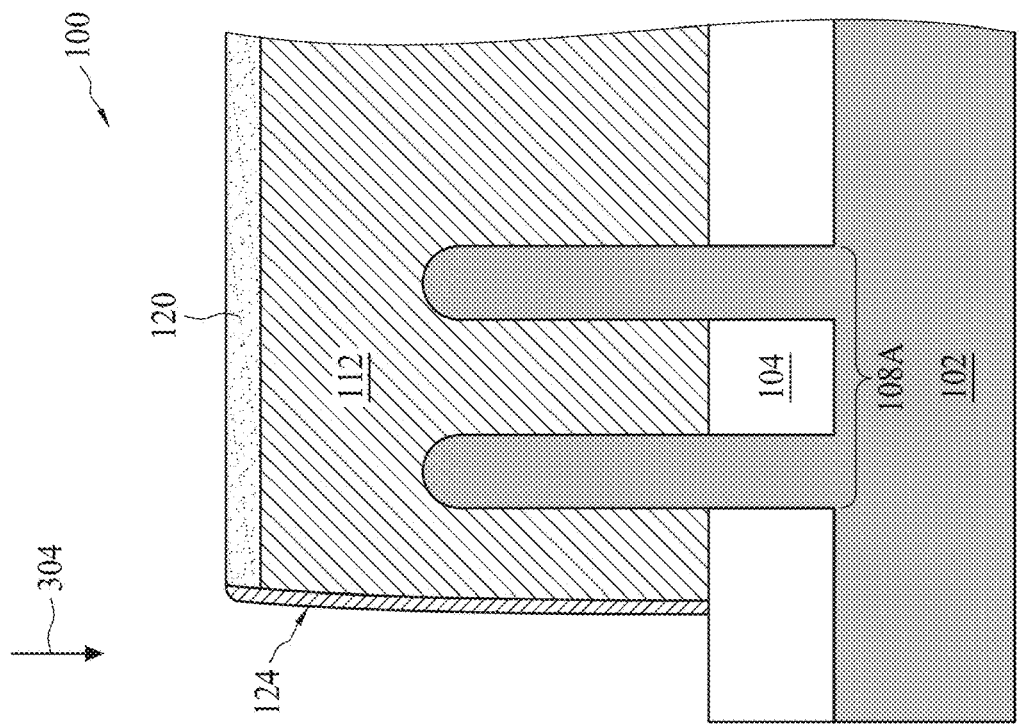
Figure 8D:
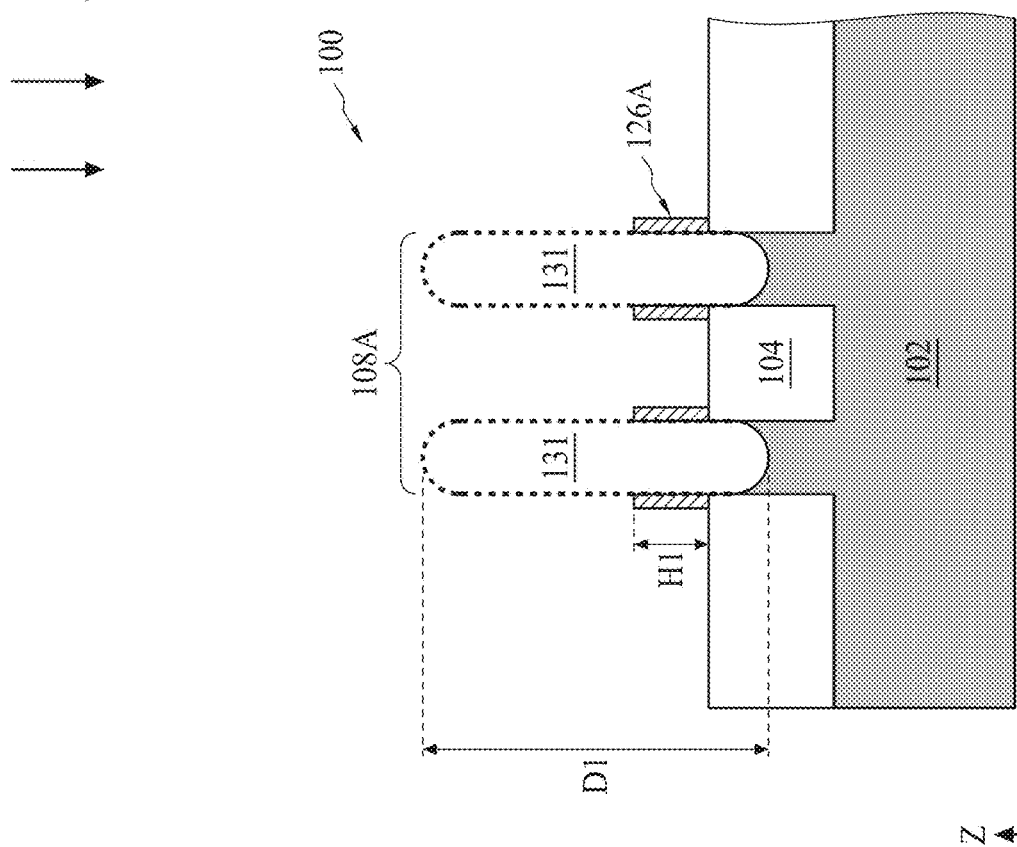

Referring to block 204 of FIG. 1 and to FIGS. 3A-3D, the method 200 forms fin active regions, or fins, 108A, 108B, 108C, and 108D (collectively referred to as fins 108) that extend or protrude from the substrate 102 and are separated by isolation features 104. In the present embodiments, the fins 108 are elongated lengthwise along the X direction and spaced from each other along the Y direction. The fins 108 may include any suitable semiconductor material including silicon, germanium, silicon germanium, and/or other semiconductor materials. In some embodiments, the fins 108 include one or more epitaxially grown semiconductor material. The fins 108 are formed by selective etching the isolation features 104 to form recesses, followed by epitaxially growing one or more semiconductor material in the recesses and planarizing the semiconductor material(s) with the isolation features 104. In some embodiments, the fins 108 are formed by patterning the substrate 102 to form the fins 108 separated by trenches, followed by filling the trenches with a dielectric layer, planarizing the dielectric layer, and selectively etching the dielectric layer to form the isolation features 104 between the fins 108. Referring to FIGS. 3C and 3D, a separation distance between two adjacent fins 108 may differ in different areas defined in the substrate 102. For example, two fins 108A may be formed to a separation distance 51 that is less than a separation distance S2 between two fins 108C.

Patterning the substrate 102 may include a series of photolithography and etch processes. The photolithography process may include forming a photoresist layer (resist) overlying the substrate 102, exposing the resist to a pattern, performing post-exposure bake processes, and developing the resist to form a masking element (not shown) including the resist. The masking element is then used for etching the trenches in the substrate 102, leaving the fins 108 protruding from the substrate 102. The etching process may include dry etching, wet etching, reactive ion etching (RIE), other suitable processes, or combinations thereof. After performing the etching process, the masking element is removed from the substrate 102 by a suitable method, such as plasma ashing or resist stripping.

Numerous other embodiments of methods for forming the fins 108 may be suitable. For example, the fins 108 may be patterned using double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over the substrate 102 and patterned using a photolithography process. Spacers are formed alongside the patterned sacrificial layer using a self-aligned process. The sacrificial layer is then removed, and the remaining spacers, or mandrels, may then be used to pattern the fins 108.

In the present embodiments, the isolation features 104 are formed to define and separate areas (or device regions) in the substrate 102. The isolation features 104 may include silicon dioxide, a low-k dielectric material (a dielectric material having a dielectric constant less than that of silicon oxide, which is about 3.9), other suitable materials, or combinations thereof. In some embodiments, the isolation features 104 include shallow-trench isolation features (STI), deep-trench isolation features (DTI), other types of isolation features, or combinations thereof. For example, portions of the isolation features 104 configured to separate the fins 108 may include STI, while the substrate 102 may be embedded in portions of the isolation features 104 configured as DTI, which may be formed by recessing the substrate 102 to form through-thickness trenches, subsequently filling the trenches with a dielectric material, and planarizing the dielectric material with the substrate 102 to form the DTI. The isolation structures 40 may be deposited by any suitable method, such as chemical vapor deposition (CVD), flowable CVD (FCVD), spin-on-glass (SOG), other suitable methods, or combinations thereof.

The isolation features 104 may separate the substrate 102 into various areas configured to provide different devices. In the depicted embodiments, for example, the substrate 102 includes four example areas (or device regions) 102A, 102B, 102C and 102D. In some embodiments, the areas 102A-102D are designed to independently provide devices of different functions, such as logic devices or memory (such as SRAM) devices, different conductivity types, such as n-type devices or p-type devices, or a combination thereof. For example, in some embodiments, the area 102A and the area 102B are configured to provide devices of the same function but different conductivity types. Of course, the present embodiments are not limited to any specific arrangement. For purposes of simplicity, in the depicted embodiments, the methods 200 and 220 are discussed in reference to the area 102A and the area 102C being configured to provide logic and memory devices, respectively, the area 102A and the area 102B being configured to provide logic devices of different conductivity types, and the area 102C and the area 102D being configured to provide memory devices of different conductivity types.

Referring to block 206 of FIG. 1 and to FIGS. 4A-4D, the method 200 forms a dummy gate stack (alternatively referred to as placeholder gate) 112 over the fins 108A and 108B, and a dummy gate stack 114 over the fins 108C and 108D. In the present embodiments, the dummy gate stacks 112 and 114 will be replaced by metal gate stacks at later stages of fabrication. Each dummy gate stack traverses a channel region of the fins 108 and is therefore disposed between source/drain features subsequently formed in and/or over the fins 108. The dummy gate stacks 112 and 114 may each include at least a gate electrode comprising, for example, polysilicon. In some embodiments, each dummy gate stack further includes an interfacial layer (such as silicon oxide) over the fins 108, a gate dielectric layer (such as silicon oxide) over the interfacial layer, and a gate electrode (such as polysilicon) over the gate dielectric layer, a hard mask layer, a capping layer, a barrier layer, other suitable layers, or combinations thereof. As depicted herein, a hard mask 120 is formed over a top surface of the dummy gate stacks 112 and 114 to provide protection against subsequent etching process(es). Various layers of the dummy gate stacks 112 and 114 may be formed by thermal oxidation, chemical oxidation, CVD, atomic layer deposition (ALD), physical vapor deposition (PVD), other suitable methods, or combinations thereof.

The formation of the dummy gate stacks 112 and 114 may include forming the various gate material layers and patterning the gate material layers using lithography process and etching. A hard mask 120 may be used to pattern the gate material layers. For example, the hard mask 120 may be deposited on the gate material layers and patterned by lithography and etching processes to include various openings. Then, the pattern defined on the hard mask 120 is transferred to the gate material layers by etching, thereby forming the dummy gate stacks 112 and 114. The hard mask 120 may include silicon, nitrogen, oxygen, carbon, other suitable elements, or combinations thereof (for example, silicon oxide, silicon nitride, silicon oxynitride, or silicon carbide). In some examples, the hard mask 120 may include multiple films, such as a silicon nitride layer over the dummy gate stacks 112 and 114 and a silicon oxide layer over the silicon nitride layer. The hard mask 120 may be patterned by any suitable method, such as that discussed in detail above with respect to patterning the fins 108.

In some embodiments, gate spacers (not depicted) having a single-layered or a multi-layered structure are formed on sidewalls of the dummy gate stacks 112 and 114. The gate spacers may include any suitable dielectric material, such as silicon oxide, silicon nitride, silicon oxynitride, silicon carbide, other dielectric materials, or combinations thereof, and may be formed by depositing a layer of the dielectric material and performing an anisotropic etching process to remove portions of the layer, leaving behind the gate spacers on the sidewalls of the dummy gate stacks 112 and 114.

Referring to block 208 of FIG. 1 and to FIGS. 5A-5D, the method 200 forms a dielectric layer 126 over the substrate 102, thereby conformally covering the fins 108 and the dummy gate stacks 112 and 114. In the present embodiments, the dielectric layer 126 is configured to provide gate spacers 124 (in addition or alternative to the gate spacers formed on the sidewalls of the dummy gate stacks 112 and 114 at block 206) on sidewalls of the dummy gate stacks 112 and 114, as well as spacers (such as FSW spacers 126A, 126B, 126C, and 126D) on sidewalls of the fins 108.

The dielectric layer 126 may include silicon, nitrogen, oxygen, carbon, other suitable elements, or combinations thereof. For example, the dielectric layer 126 may include silicon nitride, silicon oxide, silicon carbide, silicon carbide nitride, silicon oxynitride, silicon oxycarbide, silicon oxycarbonitride, a high-k dielectric material (a dielectric material having a dielectric constant greater than that of silicon oxide, which is about 3.9), a low-k dielectric material, other dielectric materials, or a combination thereof. In some embodiments, the dielectric layer 126 has a single-layered structure. In some embodiments, the dielectric layer 126 has a multi-layered structure including at least two material layers. In one such example, the dielectric layer 126 includes a silicon nitride layer and a silicon oxycarbonitride layer. In another example, the dielectric layer 126 includes a silicon nitride layer and a silicon oxynitride layer. In yet another example, the dielectric layer 126 includes a low-k dielectric layer and a silicon nitride layer. The composition of the dielectric layer 126 (and the sublayers thereof) may be selected based on one or more design requirements for proper device function. For example, dielectric materials with different dielectric constants may be selected to achieve a desired level of parasitic capacitance and etching resistance. In some instances, dielectric materials with lower dielectric constants may be suitable for lowering parasitic capacitance, while dielectric materials with higher dielectric constants may be suitable for enhancing protection against subsequent etching process(es). Each sublayer of the dielectric layer 126 may be formed by a suitable deposition method, such as CVD, ALD, FCVD, PVD, other methods, or combinations thereof, to a proper thickness.

The method 200 proceeds to block 210 to form epitaxial source/drain features in the fins 108, which is further discussed by the method 220 and in reference to FIGS. 2A, 2B, and 6A-15D.

Referring to block 222 of FIG. 2A and to FIGS. 6A-6D, the method 220 forms a patterned photoresist layer 130 over the substrate 102 to expose the area 102A without exposing the areas 102B-102D. In the present embodiments, the photoresist layer 130 is a tri-layer photoresist that includes a bottom layer 130A, a middle layer 130B over the bottom layer 130A, and a top layer 130C over the middle layer 130B, which are together configured to enhance results of the photolithography process, such as improving resolution of the photolithography process. Various layers of the photoresist layer 130 may be configured with different compositions to obtain enhanced etching selectivity. For example, the bottom layer 130A may be a polymeric antireflective coating, the middle layer 130B may include a polymeric material configured to enhance the photosensitivity of the photoresist layer 130, and the top layer 130C generally includes a photosensitive material (resist). It is noted that, although the three layers of the photoresist layer 130 are illustrated separately in FIG. 6B, they will be collectively depicted as the photoresist layer 130 in the subsequent figures for purposes of simplicity. The photoresist layer 130 may be patterned by a series of photolithography and etching processes similar to those discussed in detail above with respect to patterning the fins 108.

Referring to block 224 of FIG. 2A and to FIGS. 7A-7D, the method 220 recesses the dielectric layer 216 to form the first fin sidewall (FSW) spacers 126A and the gate spacers 124. In the present embodiments, referring to FIGS. 7B and 7C, the method 220 performs an etching process 302 to remove portions of the dielectric layer 126 in the area 102A. In the present embodiments, the etching process 302 includes one or more etching process configured to anisotropically recess portions of the dielectric layer 126, thereby leaving portions of the dielectric layer 126 as the FSW spacers 126A on the sidewalls of the fins 108A and as the gate spacers 124 on the sidewalls of the dummy gate stack 112. In the present embodiments, the etching process 302 is tuned such that the FSW spacers 126A are defined by a height H1, which is measured from a top surface of the isolation features 104.

In some embodiments, the etching process 302 includes one or more dry etching process, which implements any suitable etchant selected according to the composition of the dielectric layer 126. Some example dry etchants include $CH_3F$, $CF_4$, $NF_3$, $SF_6$, CO, $CO_2$, $SO_2$, $CH_4$, Ar, HBr, $O_2$, He, other suitable etchants, or combinations thereof. In some embodiments, the etching process 302 is performed using mechanisms as deep reactive-ion etching (DRIE) to achieve or enhance the anisotropic etching of the dielectric layer 126.

In the present embodiments, the etching process 302 includes at least a dry etching process that may be tuned by adjusting one or more parameter, such as bias power, bias voltage, etching temperature, etching pressure, source power, etchant flow rate, other suitable parameters, or combinations thereof. In the present embodiments, the bias power of the etching process 302 is adjusted to control the height H1, which subsequently controls the shape and size of the source/drain features formed over the fins 108A. In the present embodiments, for a given amount of etching time, increasing the bias power leads to an increased amount of bombardment by particles of the dry etchants, which results in a greater amount of the dielectric layer 126 being removed and a thus reduced height H1 of the FSW spacers 126A. In the present embodiments, the height H1 is controlled such that the resulting source/drain features formed over two adjacent fins 108A are merged together, thereby providing an enlarged source/drain feature suitable for certain design requirements. In this regard, the height H1 may be tuned to less than about one-half the fin height (FH) of the fins 108, where the FH is measured from the top surface of the isolation features 104. In some embodiments, a ratio of the height H1 to the FH is about 0.1 to about 0.3. While the present embodiments are not limited to such dimensions, it is noted that if the ratio is less than about 0.1, the merged source/drain features may be too small to provide adequate landing area for a subsequently-formed source/drain contact. Additionally, if the size of the resulting source/drain feature is too small, the contact resistance may be inadvertently too high for the desired device performance. On the other hand, a ratio that is greater than about 0.3 may cause the source/drain features to favor vertical growth rather than lateral merging, leading to separated, not merged, source/drain features formed over the adjacent fins 108A. In some examples, the height H1 may be about 6 nm to about 14 nm. In some embodiments, performing the etching process 302 removes a small amount of the gate spacers 124, thereby slightly reducing a height and/or a thickness of the gate spacers 124. It is noted that such reduction generally does not affect the overall performance of the gate spacers 124.

Referring to block 226 of FIG. 2A and to FIGS. 8A-8D, the method 220 forms a source/drain recess 131 in each exposed fin 108A and between the FSW spacers 126A. In the present embodiments, forming the source/drain recess 131 includes applying an etching process 304 that selectively removes portions of the fins 108A without removing, or substantially removing, portions of the dummy gate stack 112, the isolation features 104, or the dielectric layer 126. In the present embodiments, the source/drain recess 131 is formed to a depth D1. In some examples, the depth D1 may be about 47 nm to about 57 nm; of course, the present embodiments are not limited to such dimensions. In some examples, a ratio of the height H1 to the depth D1 may be about 1:10 to about 1:3.

The etching process 304 may be a dry etching process, a wet etching process, other suitable etching processes, or combinations thereof. In some embodiments, a wet etching process implements a wet etchant including a hydroxide, such as potassium hydroxide (KOH) and/or ammonium hydroxide (NH$_4$OH), hydrogen peroxide (H$_2$O$_2$), sulfuric acid (H$_2$SO$_4$), TMAH, other suitable wet etching solution, or combinations thereof. For example, the wet etchant may implement an NH$_4$OH—H$_2$O$_2$H$_2$O mixture (known as an ammonia-peroxide mixture, or APM) or a H$_2$SO$_4$—H$_2$O$_2$ mixture (known as a sulfuric-peroxide mixture, or SPM). In some embodiments, a dry etching process employs a dry etchant that includes a fluorine-containing etchant gas (such as CF$_4$, SF$_6$, CH$_2$F$_2$, CHF$_3$, and/or C$_2$F$_6$), an oxygen-containing gas, a chlorine-containing gas (such as Cl$_2$, CHCl$_3$, CCl$_4$, and/or BCl$_3$), a bromine-containing gas (such as HBr and/or CHBr$_3$), an iodine-containing gas, He, Ar, O$_2$, other suitable gases and/or plasmas, or combinations thereof. In some embodiments, the etching process 304 additionally implements an oxidation process. For example, the etching process 304 may expose the fins 108A to an ozone environment, thereby oxidizing the portions of the fins 108A exposed by the patterned photoresist layer 130, and the oxidized portions are subsequently removed by a cleaning process and/or an etching process, such as those described herein. After implementing the etching process 304, the method 220 may implement a wet cleaning process utilizing an SPM, a diluted HF solution, other suitable solutions, or combinations thereof, to remove any etching by-products.

Referring to block 228 of FIG. 2A and to FIGS. 9A-9D, the method 220 forms first sour/drain features 132 in the source/drain recesses 131. In the present embodiments, the method 220 implements an epitaxial process 306 to grow the source/drain features 132. The epitaxial process 306 may be a selective epitaxial growth (SEG) process implemented with any deposition technique, such as CVD deposition techniques (e.g., vapor-phase epitaxy (VPE) and/or ultra-high vacuum CVD (UHV-CVD)), molecular beam epitaxy, other suitable processes, or combinations thereof. The epitaxial process 306 may use gaseous precursors (such as silicon-containing gases including SiH$_4$ and/or germanium-containing gases including GeH$_4$) and/or liquid precursors, which interact with the composition of the fins 108A to form epitaxial Si layer(s) or epitaxial SiGe layer(s) in the source/drain features 132.

The source/drain features 132 may be doped in-situ during the epitaxial process 306 by introducing one or more dopant. Alternatively, the source/drain features 132 (or layers thereof) may be epitaxially grown using a suitable SEG process, and an implantation process (such as a junction implant process) is subsequently applied to introduce dopant(s) into the source/drain feature 132. The dopant may include a p-type dopant (such as boron, BF$_2$, aluminum, gallium, and/or indium), an n-type dopant (such as phosphorus, arsenic, and/or antimony), other suitable dopants, or combinations thereof. The source/drain features 132 may include one or more epitaxial layer having different concentrations of the same dopant. In some examples, the different epitaxial layers may include different types of dopant. The composition of the source/drain features 132 may be selected based on the type of devices they are configured to provide. For embodiments in which the source/drain features 132 are configured to provide an n-type device (such as an n-type logic device), the source/drain features 132 include one or more epitaxial Si layer doped with an n-type dopant, such as phosphorous (Si:P). For embodiments in which the source/drain features 132 are configured to provide a p-type device (such as a p-type logic device), the source/drain feature 132 includes one or more epitaxial SiGe layer doped with a p-type dopant, such as boron (SiGe:B). In some embodiments, epitaxial SiGe layers configured for a p-type device further include antimony (SiGe:Sn:B) configured to tune lattice constant of the epitaxial layer(s). The epitaxial process 306 may further include performing one or more annealing processes to activate the dopant(s) in the source/drain features 132. Suitable annealing processes include rapid thermal annealing (RTA), laser annealing, other suitable processes, or combinations thereof. After the formation of the source/drain features 132, the patterned photoresist layer 130 is removed by a suitable process, such as plasma ashing and/or resist stripping.

Figure 9A:
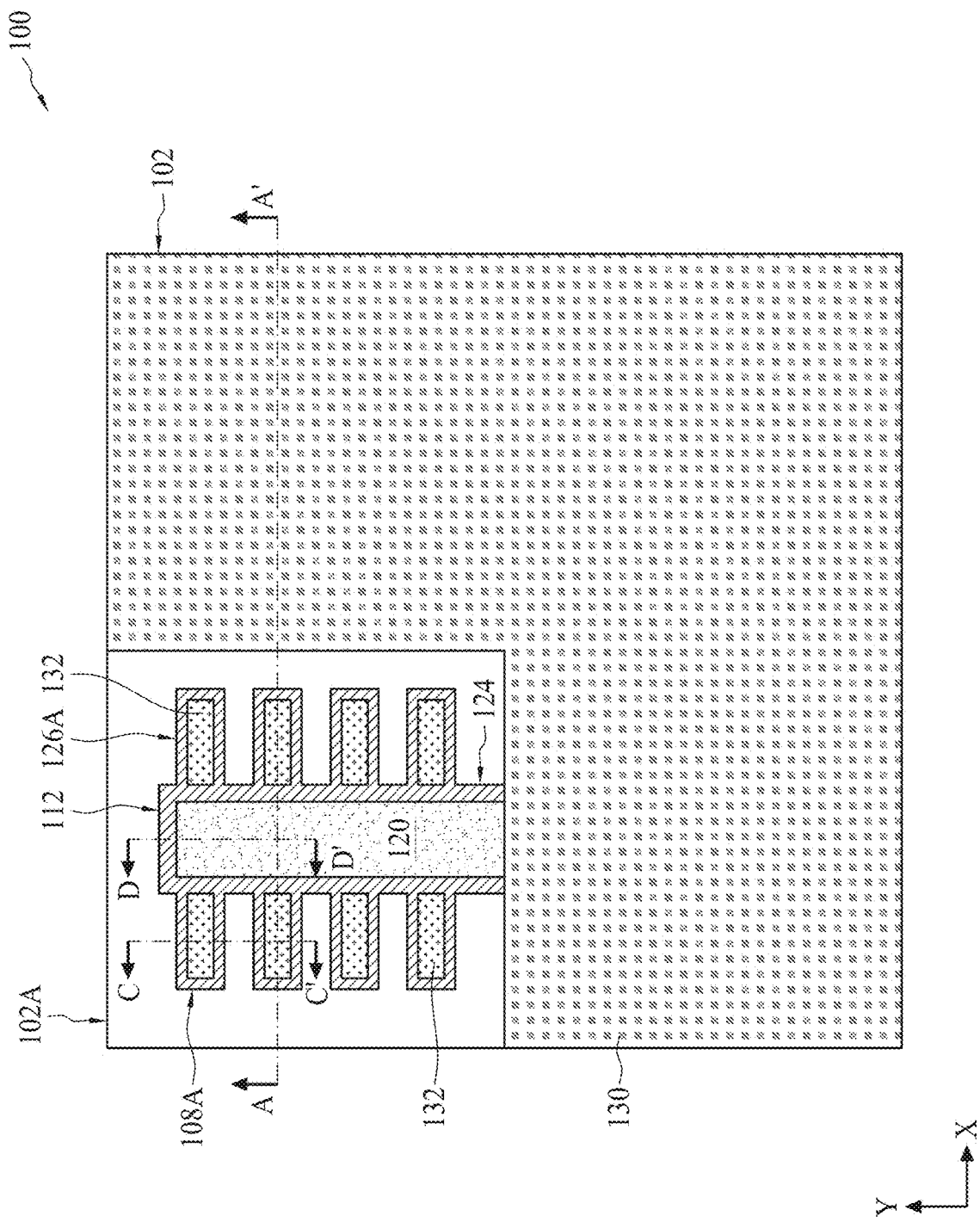
Figure 9B:
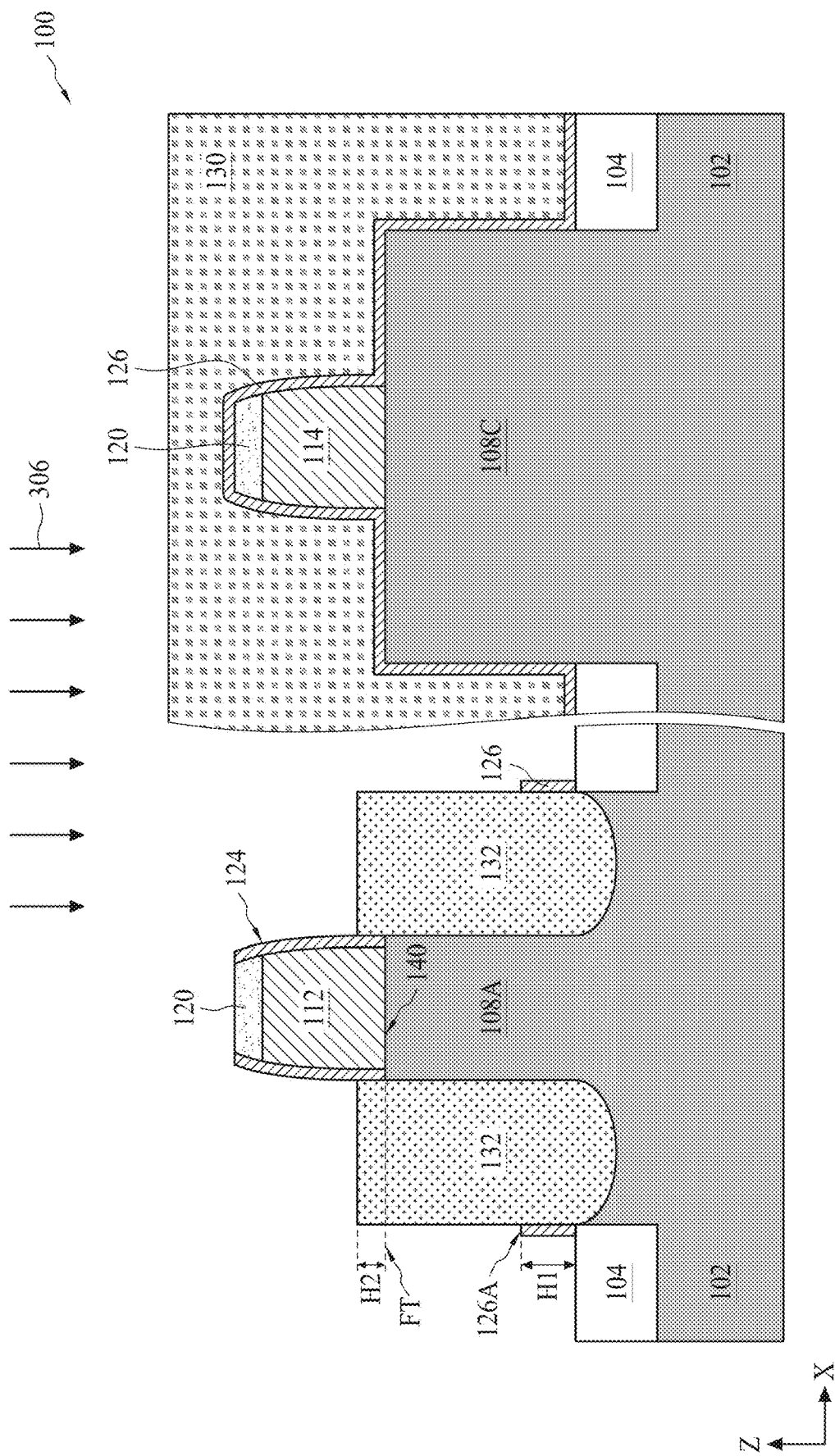
Figure 9C:
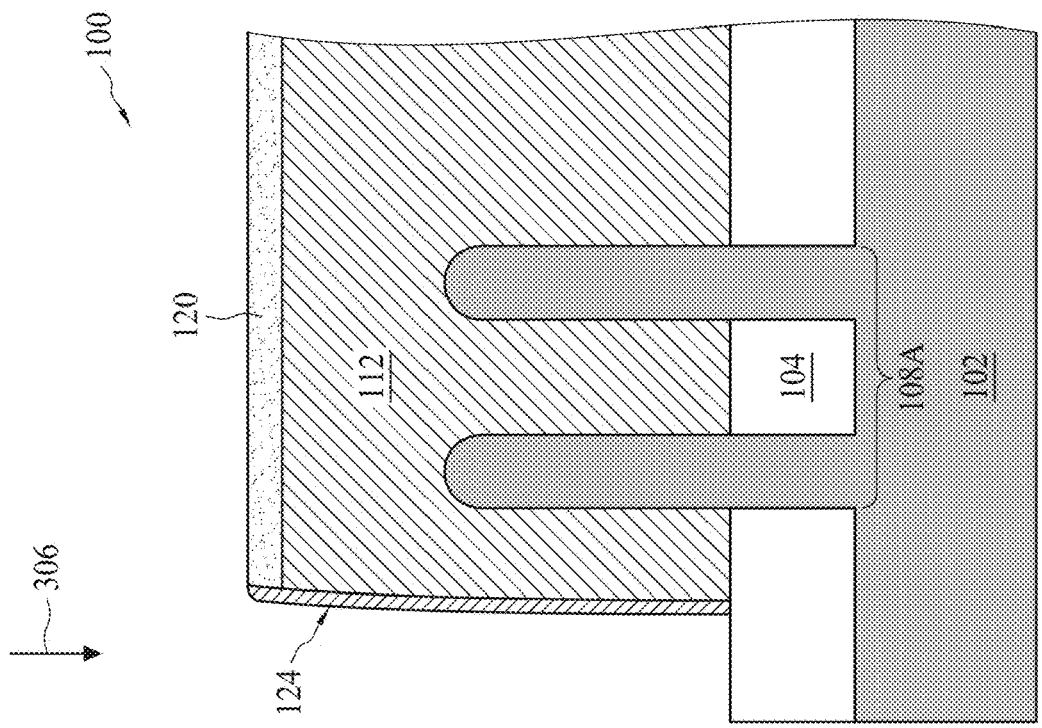
Figure 9D:
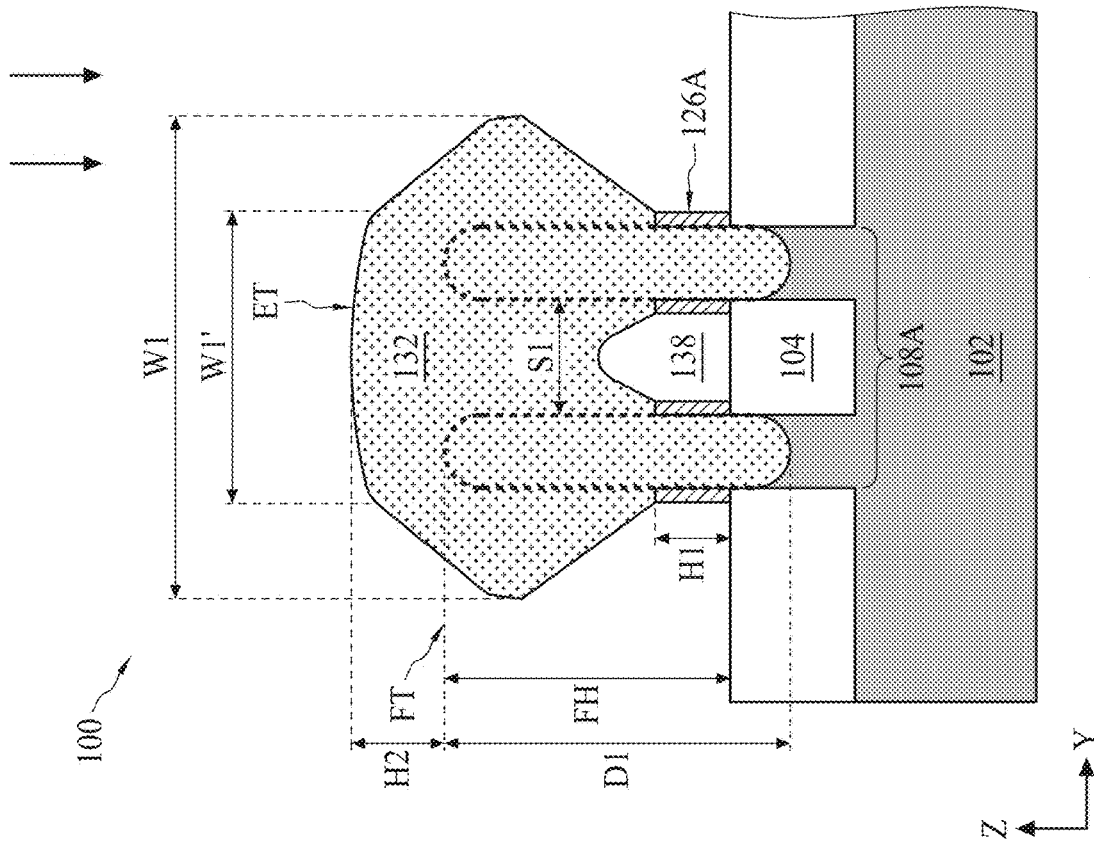
Figure 10A:
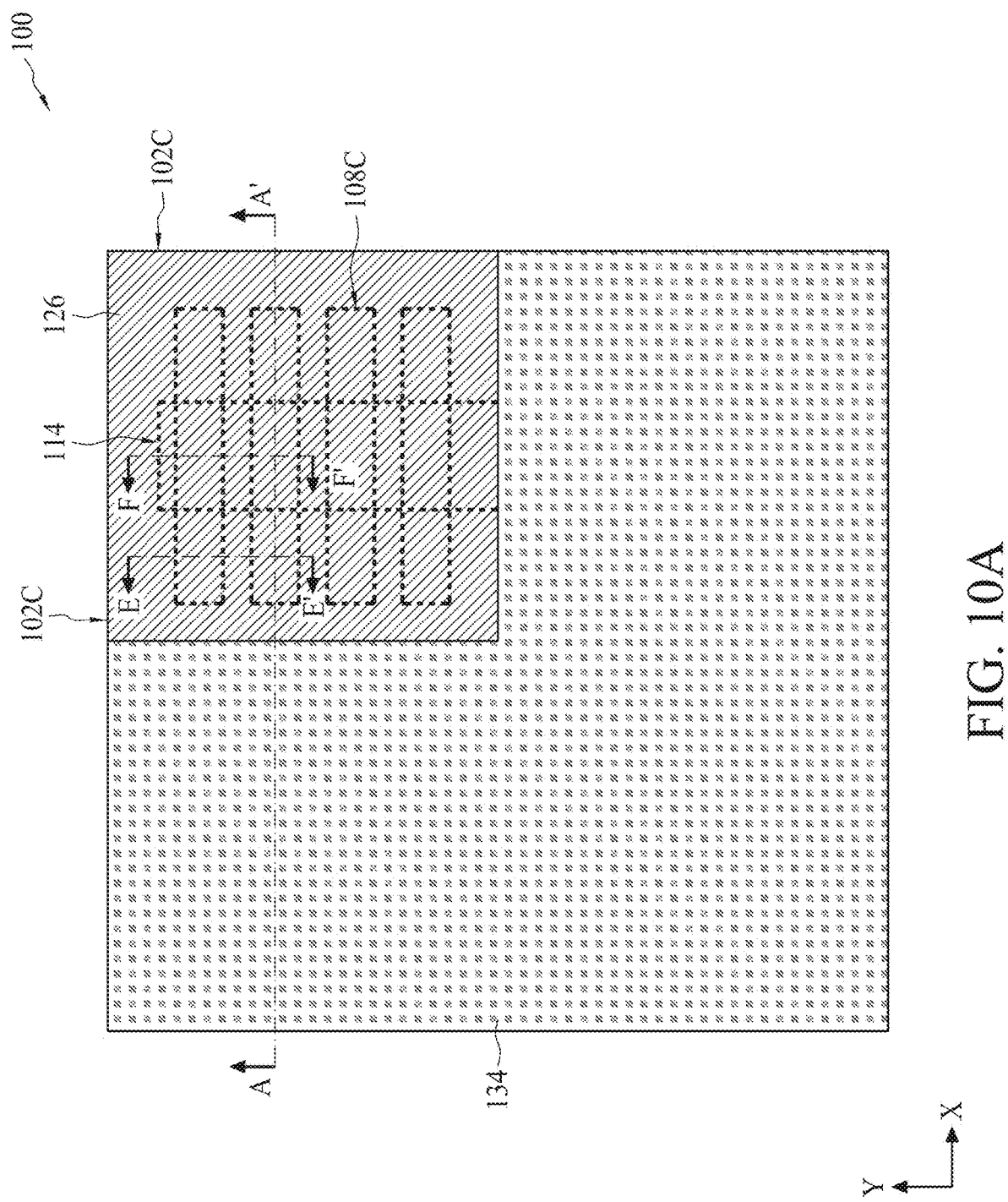
Figure 10B:
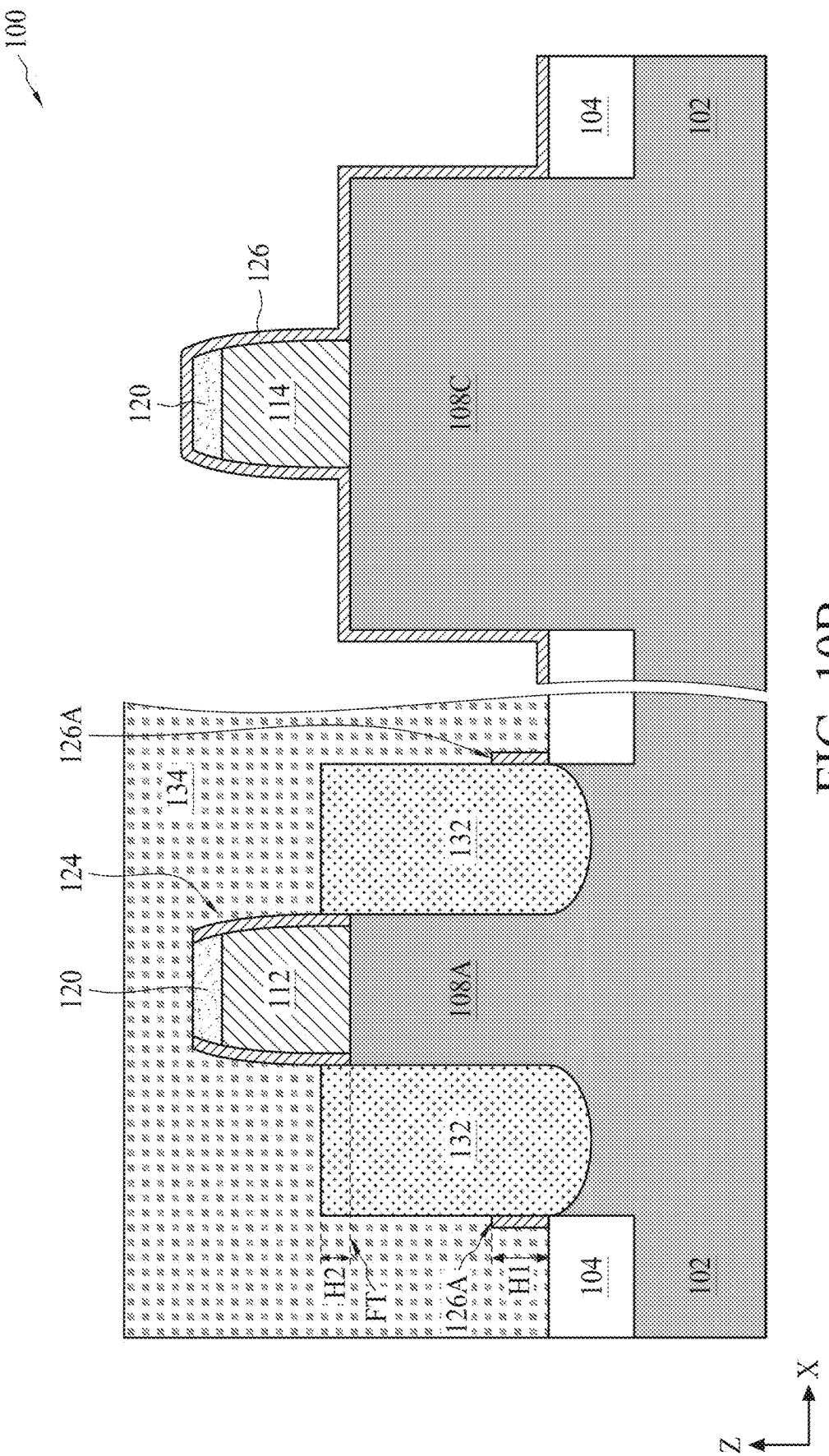
Figure 10D:
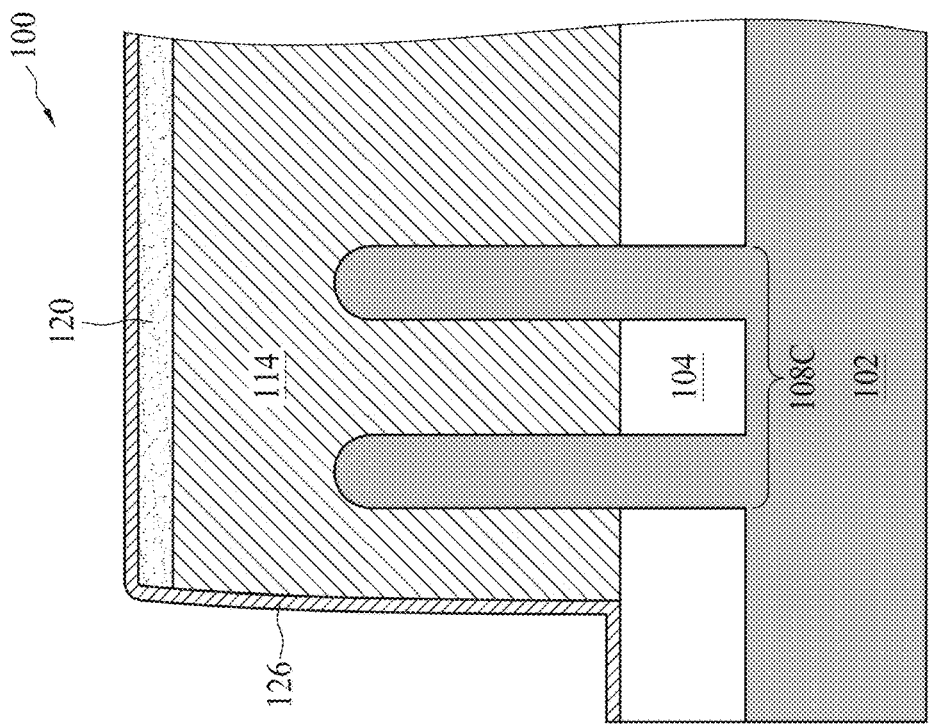
Figure 10C:
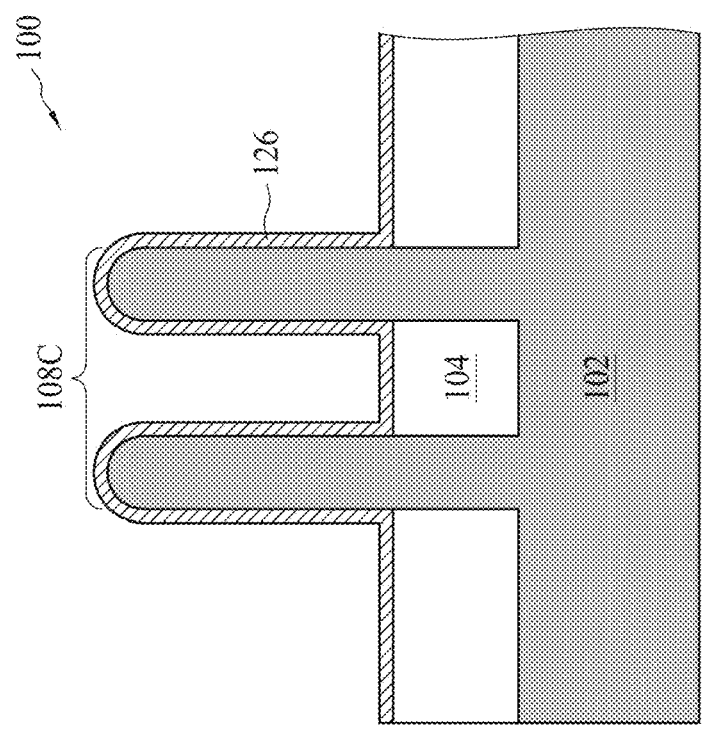

In the present embodiments, referring to FIG. 9C, the epitaxial process 306 forms the source/drain features 132 from two adjacent source/drain recesses 131 that merge together the adjacent fins 108A. In the present embodiments, referring to FIG. 9B, the merging enhances the strain effect to a channel region 140 under the dummy gate stack 112, which may improve the carrier mobility of the resulting device. In addition, the enlarged volume of the source/drain features 132 may lead to lowered contact resistance and thus enhanced device performance. In some embodiments, the merging results in an air gap (or void) 138 formed between the FSW spacers 126A and below a bottom portion of the merged source/drain features 132, thereby providing additional isolation function to the source/drain features 132. Furthermore, the merging allows a top surface (ET) of the source/drain features 132 to be substantially elongated to a width W1' along the direction of the dummy gate stack 112 (direction Y), which serves to enlarge the landing area over which a source/drain contact may be subsequently formed. In addition to the height (such as the height H1) of the FSW spacers 126A, the size and shape of the source/drain features 132 may depend on factors such as compositions of the epitaxial layers, the separation distance Si between the fins 108A, and/or deposition conditions of the epitaxial process 306.

In some embodiments, a maximum width W1 of the source/drain feature 132 exceeds the FH. In some examples, the width W1 may be about 65 nm to about 75 nm, and a ratio of the width W1 to the FH may be about 1.2 to about 1.4; of course, the present embodiments are not limited to such dimensions. Furthermore, in the present embodiments, referring to FIGS. 9B and 9C, a distance H2 between a top surface of the fins 108A (FT) and ET is greater than zero. In some examples, the distance H2 may be about 3 nm to about 10 nm; of course, the present embodiments are not limited to such dimensions.

Referring to block 230 of FIG. 2A and to FIGS. 10A-10D, the method 220 forms a patterned photoresist layer 134 over the workpiece 100 to expose the area 102C without exposing the areas 102A, 102B, and 102D. The photoresist layer 134 may be a tri-layer photoresist similar to the photoresist layer 130, which has been discussed in detail above with respect to block 222. The photoresist layer 134 may be patterned by a series of photolithography processes similar to those discussed in detail above with respect to patterning the fins 108.

Referring to block 232 of FIG. 2A and to FIGS. 11A-11D, the method 220 recesses the dielectric layer 216 to form the FSW spacers 126B. In the present embodiments, referring to FIG. 11B, the method 220 performs an etching process 308 to remove portions of the dielectric layer 126 in the area 102C. In the present embodiments, the etching process 308 includes one or more etching process configured to anisotropically recess portions of the dielectric layer 126, thereby leaving portions of the dielectric layer 126 as the FSW spacers 126B on the sidewalls of the fins 108C and as the gate spacers 124 on the sidewalls of the dummy gate stack 114. In the present embodiments, the FSW spacers 126B are defined by a height H3, which is measured from the top surface of the isolation features 104. The etching process 308 may implement one or more dry etching process similar to or the same as that discussed above with respect to the etching process 302, and may utilize the same dry etchant(s) as the etching process 302; however, parameter(s) of the etching process 308 is tuned in a manner different from that of the etching process 302, such that the subsequently-formed source/drain features in the area 102C differ from those in the area 102A in terms of configuration.

Figure 11A:
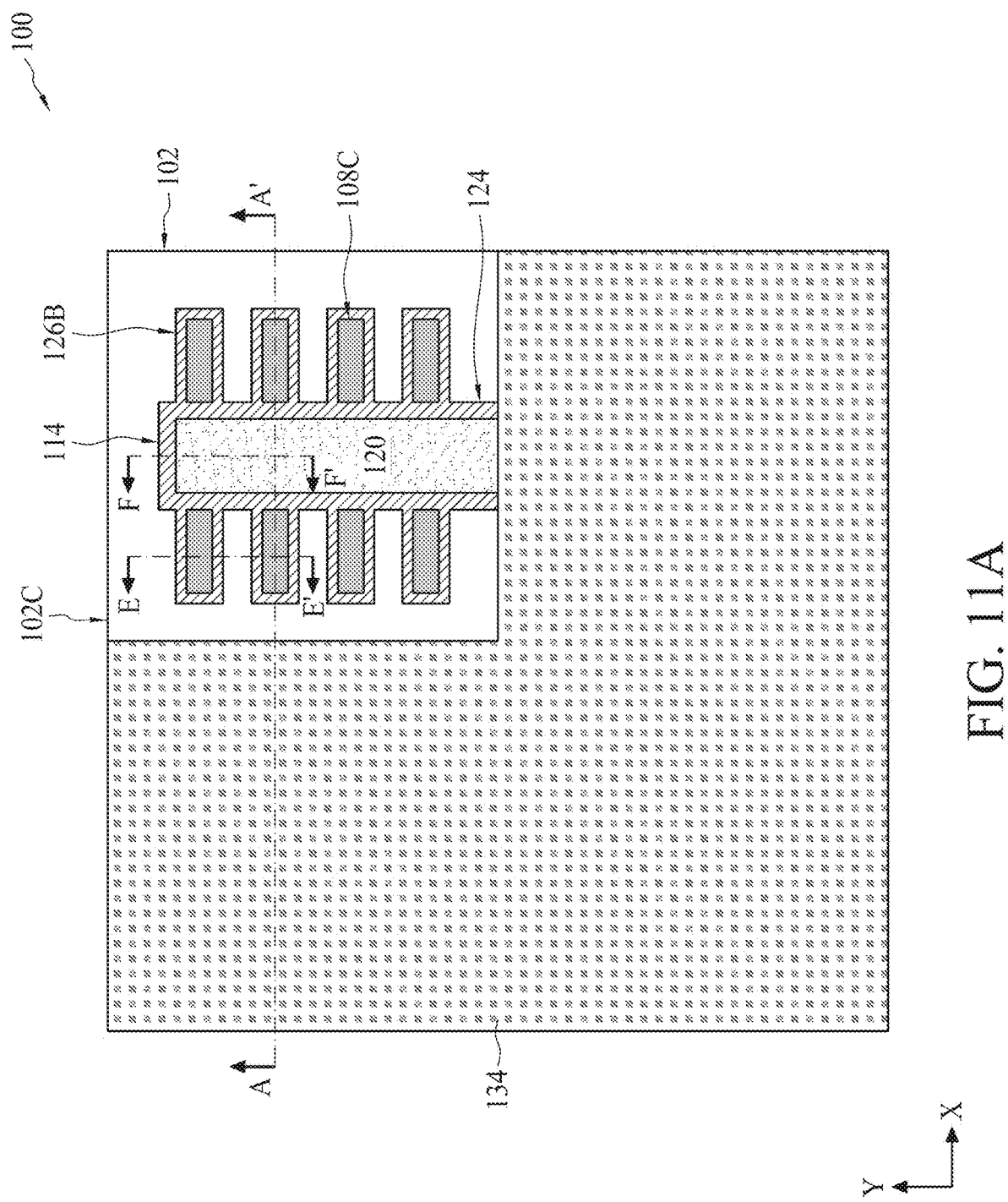
Figure 11B:
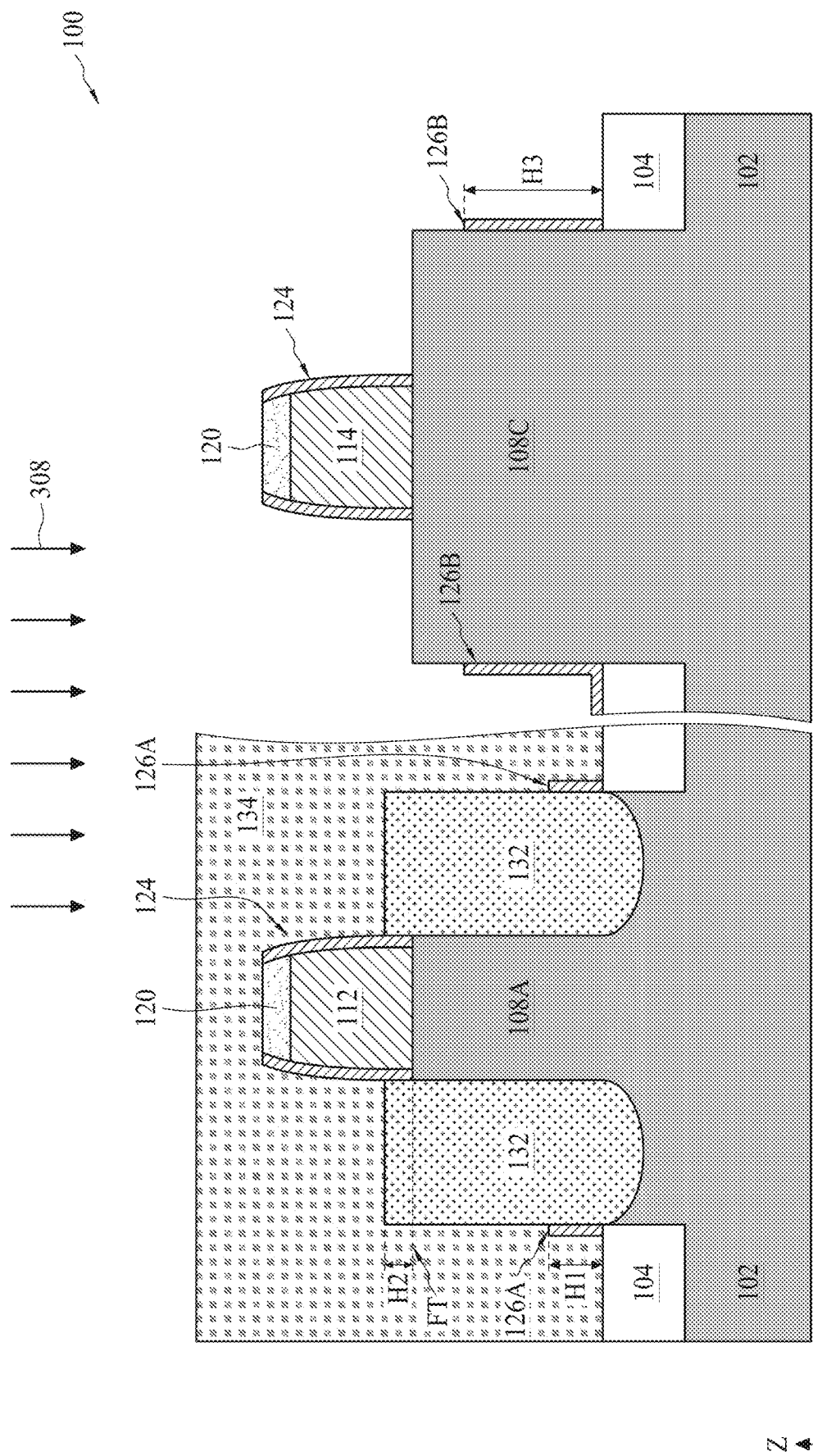
Figure 11C:
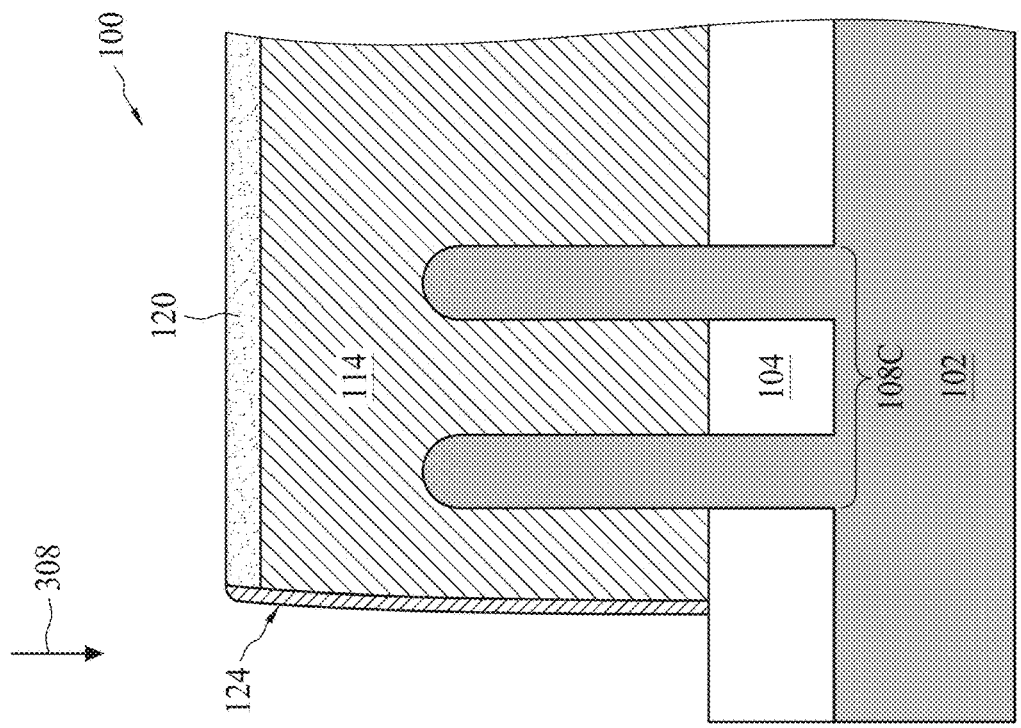
Figure 11D:
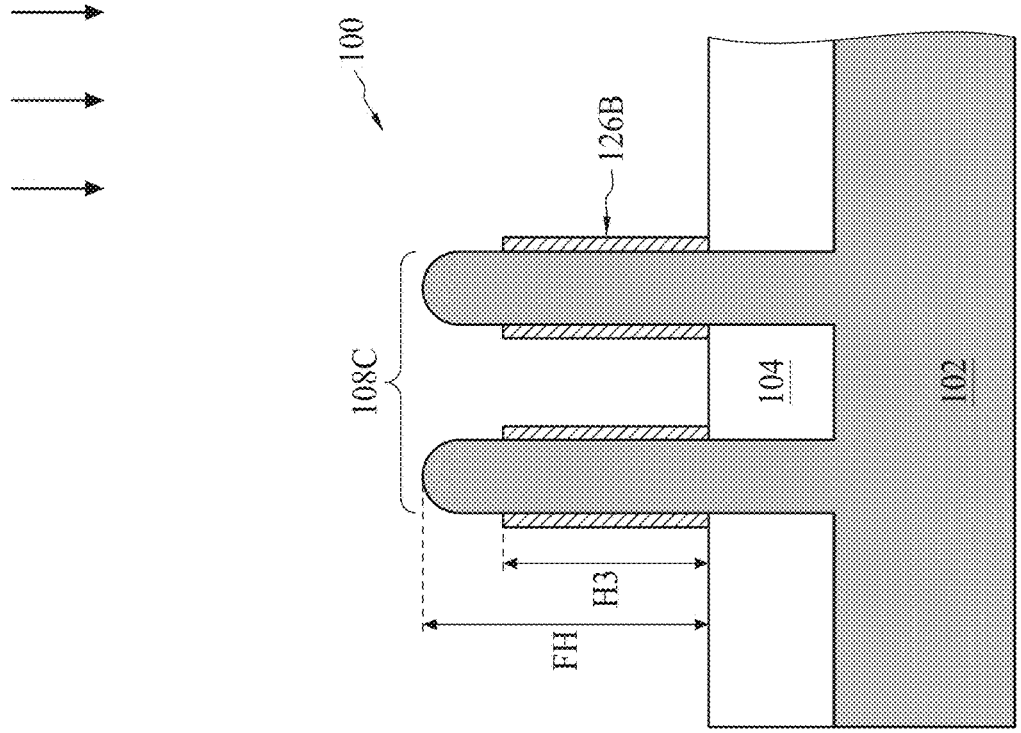

Specifically, in the present embodiments, still referring to FIG. 11B, instead of adjusting the bias power, the etching process 308 is tuned by adjusting the frequency of power output (a process referred to as "synchronous pulsing"), such that the dry etchant (discussed above with respect to the etching process 302) is intermittently applied. In other words, the etching process 308 is repeatedly turned "on," i.e., when the dry etchant (or pulse) is applied, and "off," i.e., when no dry etchant is applied, at a designated frequency to allow alternation between material removal and re-deposition. When the etching process 308 is turned "on," portions of the dielectric layer 126 are removed by chemical reaction with and/or particle bombardment by the dry etchant, thereby reducing the height H3. In contrast, when the etching process 308 is "off," etching by-products (such as carbon-like polymeric materials) are re-deposited on surfaces of the workpiece 100 including, for example, the FSW spacers 126B and the gate spacers 124, thereby increasing the height H3 and/or smoothing surface profile of the FSW spacers 126B. Accordingly, the height H3 may be fine-tuned by adjusting the duration and/or frequency of the on/off pulsing implemented during the etching process 308. For example, if the duration of the "on" state is longer than the duration of the "off" state, the height H3 may be lower compared to if the duration of the "off" state is longer than the duration of the "on" state for a given amount of etching time. Furthermore, the height H3 may be tuned by adjusting the number of on/off cycles. For example, increasing the number of cycles reduces the height H3. Additionally, other factors such as types of the dry etchant and concentration of the dry etchant may also be independently controlled during the synchronous pulsing process to achieve a desired FSW spacer height and morphology. For example, by adjusting the duration and/or frequency of the synchronous pulsing, the resulting top surfaces of the FSW spacers 126B may be tuned to have a relatively flat, rather than a rounded, profile. Furthermore, any inadvertent thinning or shortening of the gate spacers 124 exposed in the third area 108C may be remedied by the re-deposition of etching by-products during the "off" state of the etching process 308. In other words, a height of the gate spacers 124 formed in the area 102C may be greater than that of the gate spacers 124 formed in the area 102A due to a lack of the etching/re-deposition cycles applied during the etching process 302.

In the present embodiments, the height H3 is formed to be greater than the height H1, such that the resulting source/drain features formed between the FSW spacers 126B are different from those formed between the FSW spacers 126A in terms of shape and size. In some embodiments, the height H3 is controlled such that the resulting source/drain features are formed over separate fins 108C, and each being smaller in size than the merged source/drain features 132 formed between the FSW spacers 126A as discussed above. In this regard, the height H3 may be at least about half of the fin height FH, which is defined previously. In some embodiments, a ratio of the height H3 to the FH is about 0.5 to about 0.7. In some examples, the height H3 may be about 29 nm to about 37 nm. While the present embodiments are not limited by such dimensions, it is noted that if the ratio of the height H3 to the FH is less than about 0.5, the subsequently-formed source/drain features over two adjacent fins 108C may merge to form a single source/drain feature. On the other hand, if the ratio of the height H3 to the FH is greater than about 0.7, the resulting source/drain features, while not merged, may introduce higher contact resistance due to their smaller sizes.

Figure 12A:
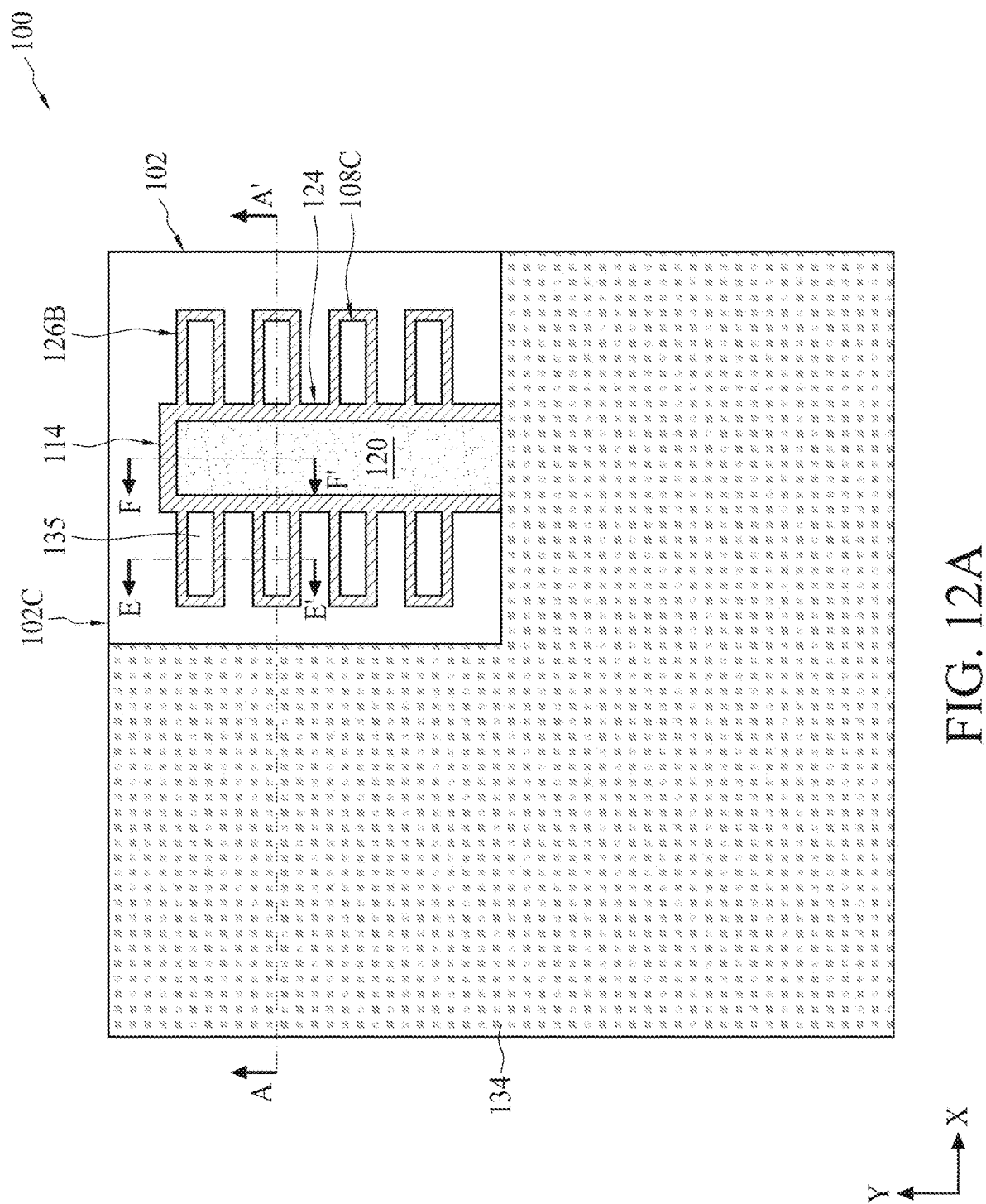
Figure 12B:
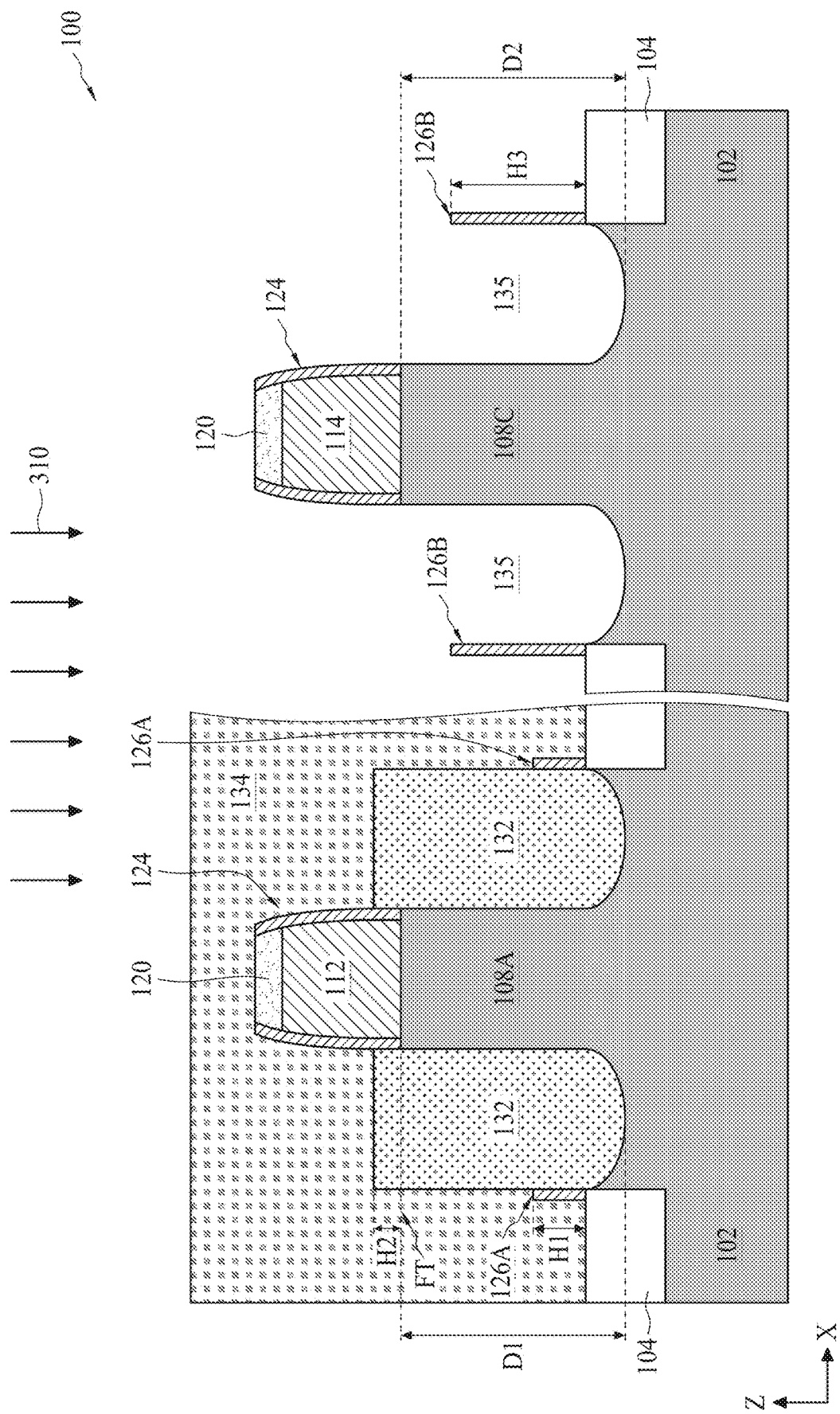

Referring to block 234 of FIG. 2A and to FIGS. 12A-12D, the method 220 forms a source/drain recess 135 in each exposed fin 108C and between the FSW spacers 126B. In the present embodiments, forming the source/drain recess 135 includes applying an etching process 310 that selectively removes portions of the fins 108C without removing, or substantially removing, portions of the dummy gate stack 114, the isolation features 104, or the dielectric layer 126. Details of the etching process 310 may be similar to those of the etching process 304 discussed above. In some embodiment, the etching process 310 is followed by a wet cleaning process, also similar to that discussed above with respect to the etching process 304. The source/drain recess 135 may be formed to a depth D2. In some embodiments, the depth D2 is less than the depth D1, such that a bottom surface of the source/drain recess 135 is above a bottom surface of the source/drain recess 131 as depicted in FIG. 12B. In some examples, a ratio of the height H3 to the depth D2 may be about 0.6 to about 1.0, and the depth D2 may be about 35 nm to about 45 nm; of course, the present embodiments are not limited to such dimensions.

Referring to block 236 of FIG. 2A and to FIGS. 13A-13D, the method 220 forms a source/drain feature 136 in the source/drain recess 135. In the present embodiments, the method 220 implements an epitaxial process 312 to grow the source/drain features 136. The epitaxial process 312 may be similar to the epitaxial process 306 discussed in detail above. For example, the epitaxial process 312 may implement a suitable SEG process to form one or more epitaxial layer in the source/drain recesses 135, where the epitaxial layer(s) are doped with a suitable dopant in-situ or subsequently during an implantation process. As discussed above with respect to the source/drain feature 132, the dopant for the source/drain features 136 is selected based on the type of device the source/drain features 136 are configured to provide. For embodiments in which the source/drain features 136 are configured to provide an n-type device, the source/drain feature 136 includes one or more epitaxial Si layer doped with an n-type dopant, and for embodiments in which the source/drain features 136 are configured to provide a p-type device, the source/drain feature 136 includes one or more epitaxial SiGe layer doped with a p-type dopant. In some embodiments, the source/drain feature 132 and the source/drain feature 136 are configured to provide devices of the same conductivity type (for example, both n-type or both p-type); alternatively, the source/drain feature 132 and the source/drain feature 136 are configured to provide devices of different conductivity types (for example, an n-type and a p-type, respectively). The epitaxial process 312 may further include performing a suitable annealing process similar to that discussed above to activate the dopant(s) in the source/drain features 136. In the present embodiments, because the depth D2 is less than the depth D1 as discussed above, a bottom surface of the source/drain feature 136 is above a bottom surface of the source/drain feature 132. After the formation of the source/drain feature 136, the patterned photoresist layer 134 is removed by a suitable process, such as plasma ashing and/or resist stripping.

Figure 13A:
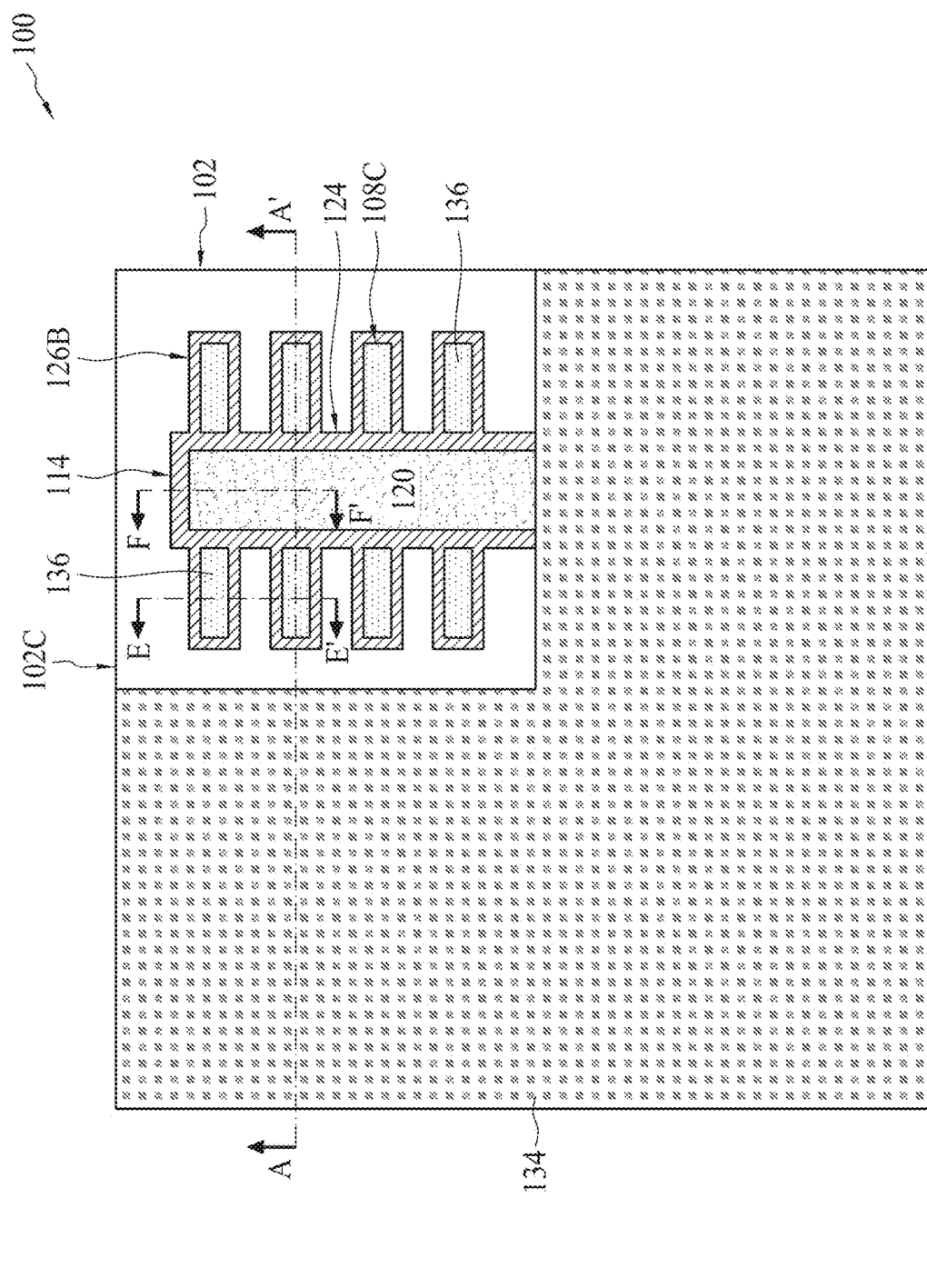
Figure 13B:
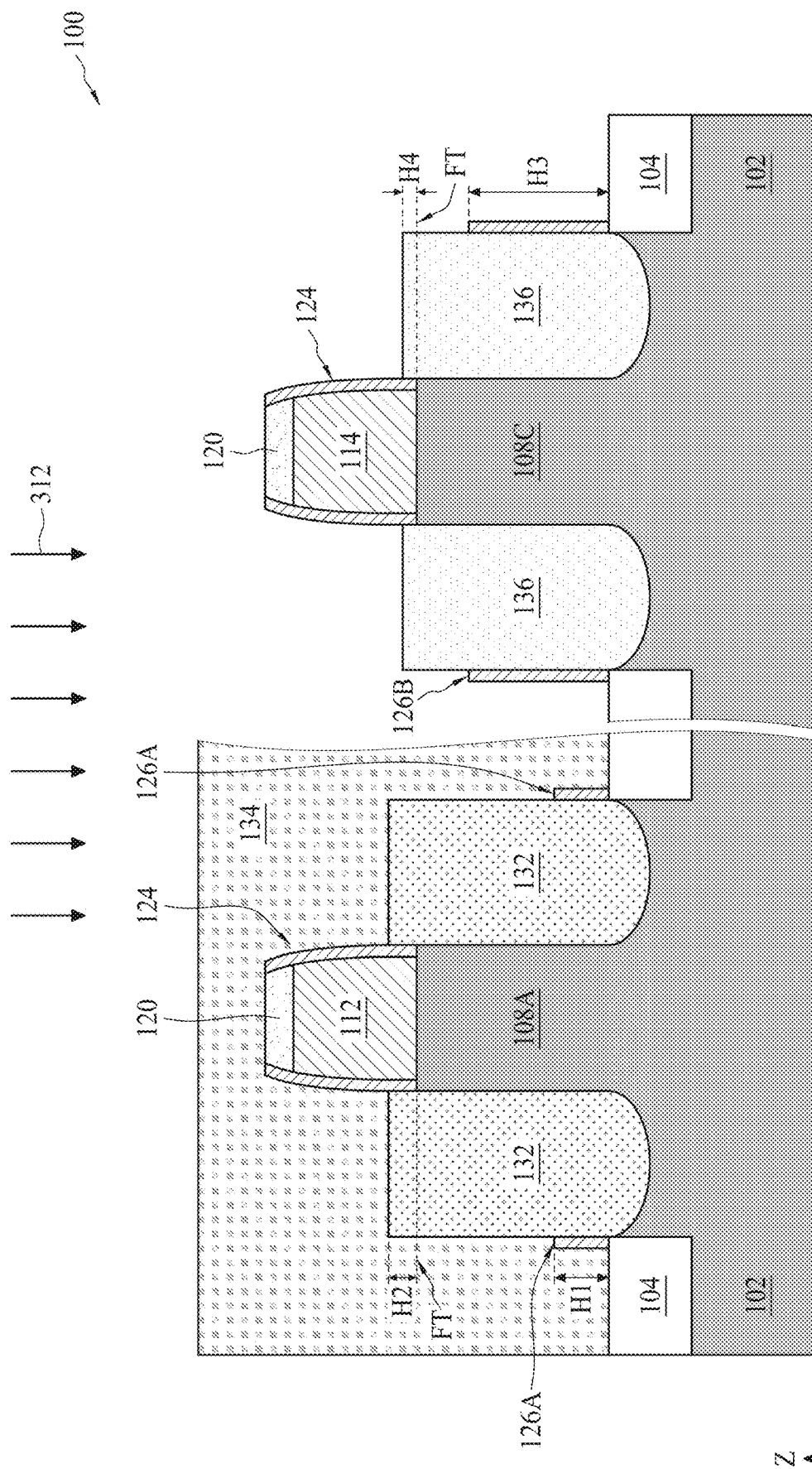
Figure 13D:
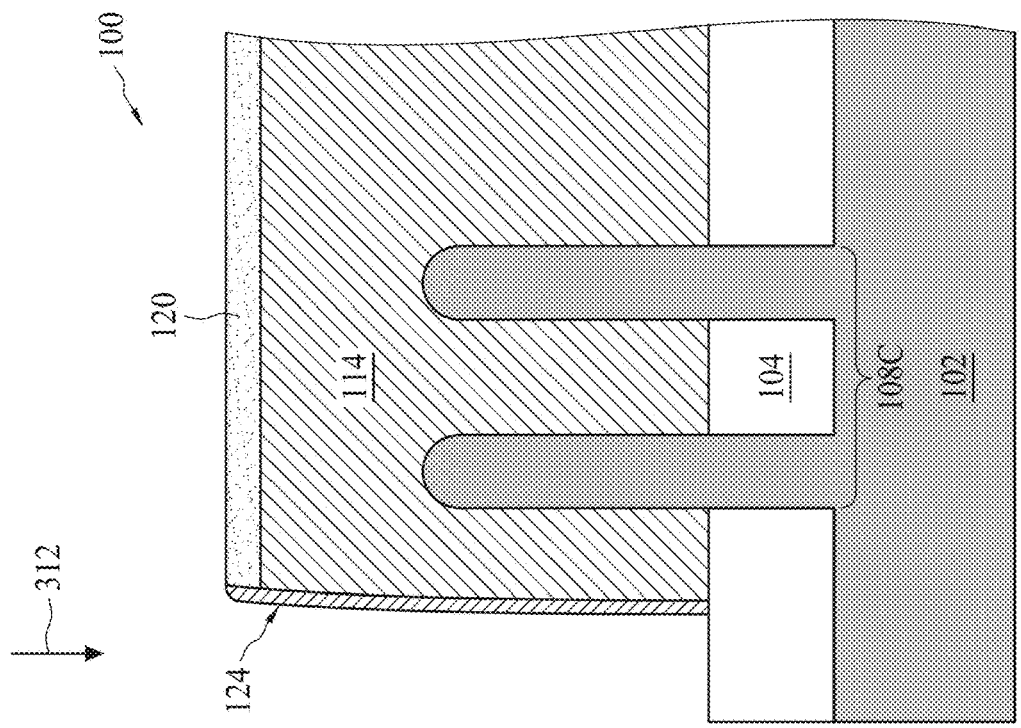
Figure 13C:
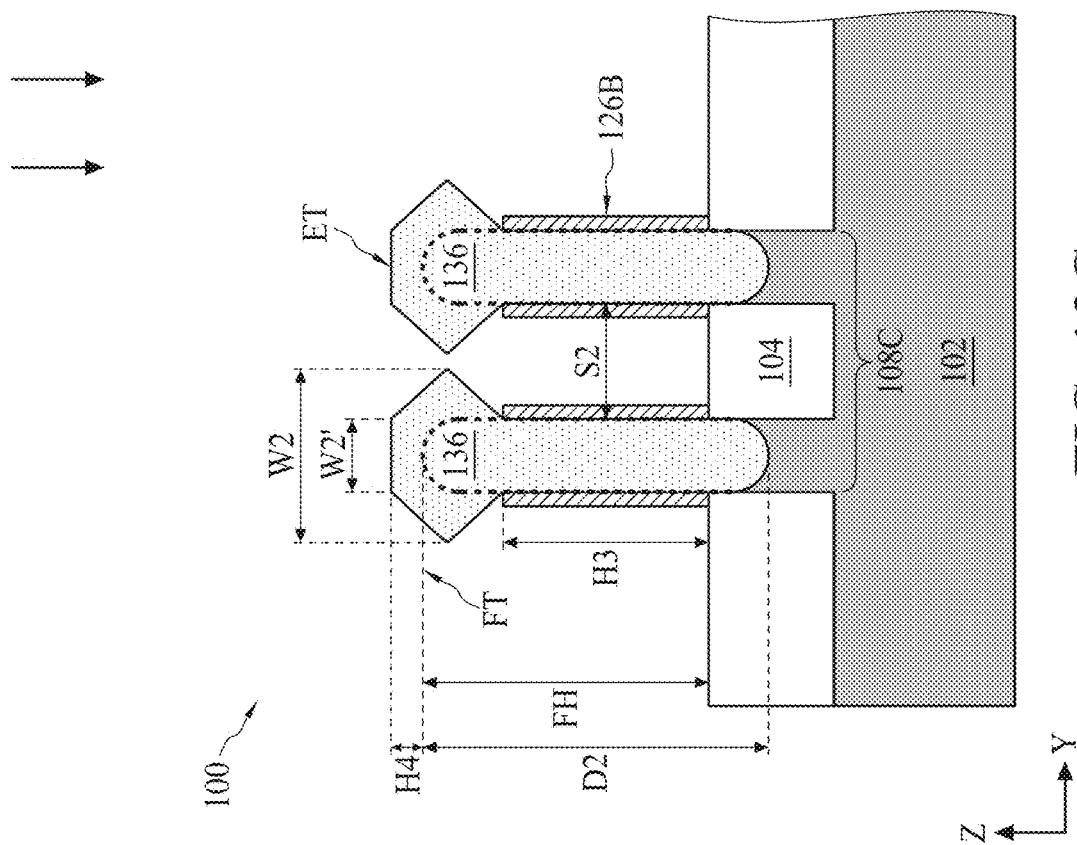

In the present embodiments, referring to FIG. 13C, the epitaxial process 312 forms the source/drain features 136 from each of the source/drain recesses 135, such that the resulting source/drain features 136 are separated from, rather than merged with, each other. In the present embodiments, tuning the height H3 of the FSW spacers 126B to be greater than the height H1 of the FSW spacers 126A allows the epitaxial layer(s) of the source/drain feature 136 to grow in a substantially vertical direction between the FSW spacers 126B. In some embodiments, the height H3 is tuned to at least half of the FH. As a result, a size of the source/drain features 136 is less than that of the source/drain features 132. For example, in some embodiments, a maximum width W2 of the source/drain feature 136 is much less than the FH, and a distance H4 between the top surface FT of the fins 108C and a top surface ET of the source/drain feature 136 is less than the distance H2 of the source/drain feature 132. In some instances, a ratio of the width W2 to the FH may be about 0.3 to about 0.5, where the width W2 may be about 18 nm to about 28 nm. In some embodiments, the distance H4 is less than zero, such as about −2 nm to about 0 nm, indicating that the ET is disposed below or at the same level as the FT. In some embodiments, as depicted herein, the distance H4 is greater than zero, such as about 0 nm to about 3 nm, indicating that the ET is disposed above the FT. Of course, the present embodiments are not limited to these dimensions. The reduced volume of the source/drain feature 136 also results in the ET of the source/drain feature 136 to be much less elongated than the ET of the source/drain feature 132 as discussed above, i.e., the distance W2' is less than the distance W1'.

In addition to the height (such as the height H3) of the FSW spacers, the size and shape of the source/drain feature 136 may depend on factors such as compositions of the epitaxial layers, the separation distance S2 between the fins 108C, and/or deposition conditions of the epitaxial process 312.

Now referring collectively to blocks 238 to 250 of FIG. 2B and to FIGS. 14A-14D, the method 220 forms source/drain features 142 in the area 102B and source/drain features 146 in the area 102D. In the depicted embodiments, the area 102B is configured to provide devices of the same function as but different conductivity type from that of the area 102A, and the area 102D is configured to provide devices of the same function as but different conductivity type from that of the area 102C. For example, in the depicted embodiments, the area 102A and the area 102B are configured to provide p-type logic device and n-type logic devices, respectively, while the area 102C and the area 102D are configured to provide p-type SRAM devices and n-type SRAM devices, respectively.

In the present embodiments, blocks 238 to 250 depict a series of photolithography, etching, and epitaxial processes substantially similar to those discussed in blocks 222 to 236. For example, referring to block 238, the method 220 forms a third patterned photoresist layer (not depicted) over the workpiece 100 to expose the area 102B, which is covered by the dielectric layer 126, without exposing the areas 102A, 102C, or 102D. The third patterned photoresist layer may be substantially similar to the patterned photoresist layer 130 as discussed above. Referring to block 240 and the method 220 performs an etching process substantially similar to or the same as the etching process 302, thereby forming the gate spacers 124 on sidewalls of the dummy gate stack 112 and the FSW spacers 126C on sidewalls of the fins 108B, as depicted in FIGS. 14B and 14C. In the present embodiments, by adjusting the bias power when etching the dielectric layer 126, the FSW spacers 126C are formed to a height H5 that is less than the FH. In some example embodiments, the height H5 is less than half of the FH, where a ratio of the height H3 to the FH is about 0.1 to about 0.3. While the present embodiments do not limit the height H5 to specific dimensions, the etching process applied at block 240 is adjusted such that resulting source/drain features formed between the FSW spacers 126C merge together two neighboring fins 108B. In some embodiments, the height H5 is substantially similar to the height H1 of the FSW spacers 126A and thus, is less than the height H3 of the FSW spacers 126B. In some examples, the height H5 may be less than the height H1, such that the merged source/drain features formed therebetween is larger than the merged source/drain features 132. If the height H5 is less than the height H1, greater etching bias power (higher voltage) may be applied at the etching process to form the FSW spacers 126C when compared with the etching process 302.

Referring to block 242, the method 220 forms source/drain recesses (not depicted) in portions of the second fins 108B between the FSW spacers 126C in an etching process similar to the etching process 304. Subsequently, referring to block 244 and to FIGS. 14B and 14C, the method 220 forms source/drain features 142 in the source/drain recesses in an epitaxial growth process similar to the epitaxial process 306, during which the source/drain features 142 merge together two recessed fins 108B, thereby forming an air gap 144 with the FSW spacers 126C. The source/drain features 142 may be configured to have a conductivity type different from that of the source/drain features 132. For embodiments in which the source/drain features 132 are configured to provide a p-type device (such as a p-type logic device), the source/drain features 142 are configured to provide an n-type device (such as n-type logic device). In this regard, the source/drain features 142 may include one or more epitaxial Si layer doped with an n-type dopant (such as a Si:P layer) as discussed above with respect to the source/drains feature 132. An annealing process may be performed after forming the source/drain features 142 to activate the dopant(s) in the source/drain features 142. After forming the source/drain features 142, the method 220 removes the third patterned photoresist layer configured to expose the area 102B by any suitable method mentioned above.

The source/drain features 142 may be configured with a geometry substantially similar to that of the source/drain features 132, though specific dimensions of the source/drain features 142 may differ from those of the source/drain features 132. For example, the merged source/drain features 142 may be formed to a maximum width W4 of about 65 nm to about 75 nm, and a ratio of the width W4 to the FH may be about 1.2 to about 1.4. In further examples, the top surface ET may be substantially elongated to a width W4' similar to the width W1', and a distance H6 between the top surface FT of the fins 108B and ET is greater than zero and may be about 3 nm to about 10 nm, for example. Of course, the present embodiments are not limited to such dimensions. In some embodiments, the FSW spacers 126C are tuned to be less than the FSW spacer 126A, such that the merged source/drain feature 142 is larger than the merged source/drain feature 132.

Referring to block 246, the method 220 forms a fourth patterned photoresist layer (not depicted) over the workpiece 100 to expose the area 102D, which is covered by the dielectric layer 126, without exposing the areas 102A-102C. The fourth patterned photoresist layer may be substantially similar to the patterned photoresist layer 130 as discussed above. Referring to block 248, the method 220 performs an etching process substantially similar to the etching process 308, thereby forming the gate spacers 124 on sidewalls of the dummy gate stack 114 and FSW spacers 126D on sidewalls of the fins 108D, as depicted in FIGS. 14B and 14D. In the present embodiments, by adjusting the synchronous pulsing of the etching process applied at block 248, an etchant (such as a dry etchant discussed above with respect to the etching process 308) is applied intermittently, i.e., alternating between "on" state and "off" state. As discussed in detail above, the "on" state of the synchronous pulsing actively recesses the dielectric layer 126 to form the FSW spacers 126D and the gate spacers 124, while the "off" state allows for any etching by-product to be re-deposited over the workpiece 100, thereby providing control to fine-tune the height H7 and smooth the recessed profile of the FSW spacers 126D. In this regard, a rate of removal of the dielectric layer 126 may be adjusted by adjusting the frequency at which the "on" and "off" states are cycled and/or the duration of each state is applied. In some instances, the inadvertent recessing of the gate spacers 124 may be mitigated by such tuning process.

In the present embodiments, the height H7 is tuned at block 248 such that the resulting source/drain features formed between the FSW spacers 126D are separated from, rather than merging with, each other as in the case of the source/drain features 142. In this regard, the height H7 is greater than the height H5 of the FSW spacers 126C and the height H1 of the FSW spacers 126A. In some embodiments, the height H7 is at least about half of the FH and, in some instances, a ratio of the height H7 to the FH may be about 0.5 to about 0.7, similar to the height H3 as discussed above. In some examples, the height H7 may be similar to the height H3 of the FSW spacers 126B.

Referring to block 250, the method 220 forms source/drain recesses (not depicted) in portions of the fins 108B between the FSW spacers 126D in an etching process similar to the etching process 310 as discussed above. Subsequently, referring to block 252 and to FIGS. 14B and 14D, the method 220 performs an epitaxial growth process similar to the epitaxial growth process 312 as discussed above, such that the resulting source/drain features 146 are grown separately from each of the source/drain recesses formed at block 250. The source/drain features 146 may be configured to have a conductivity type different from that of the source/drain feature 136. For embodiments in which the source/drain feature 136 is configured to provide a p-type device (such as a p-type memory device), the source/drain feature 146 is configured to provide an n-type device (such as an n-type memory device). In this regard, the source/drain features 146 may include one or more epitaxial Si layer doped with an n-type dopant (such as a Si:P layer) as discussed above with respect to the source/drain features 132. An annealing process may be performed after forming the source/drain features 142 to activate the dopant(s) in the source/drain features 142. After forming the source/drain feature 142, the method 220 removes the third patterned photoresist layer configured to expose the area 102B by any suitable method mentioned above.

In the present embodiments, tuning the height H7 of the FSW spacers 126D to be greater than the height H5 of the FSW spacers 126C allows the epitaxial layer(s) of the source/drain features 146 to substantially grow in a vertical direction between the FSW spacers 126D. In other words, increasing the height H7 relative to the height H5 reduces the overall size of the source/drain features 146 when compared to the source/drain features 142. For example, in some embodiments, a maximum width W5 of the source/drain features 146 is much less than the FH, and a distance H8 between the fin top FT and a top surface ET of the source/drain feature 146 is less than the distance H6 of the source/drain feature 142. In some examples, a ratio of the width W5 to the FH may be about 0.3 to about 0.5. In some embodiments, similar to the description of the distance H4 above, the distance H8 is less than zero, such as about −2 nm to about 0 nm, indicating that the ET is disposed below FT. In some embodiments, the distance H8 is greater than zero, such as about 0 nm to about 3 nm, indicating that the ET is disposed above the FT. In addition, the reduced size of the source/drain features 146 due to the height H7 results in the elongation of the ET defined by a width W5' to be less than the width W4' of the source/drain features 142. Furthermore, differences in the sizes and shapes between the source/drain features 142 and the source/drain feature 146 may depend on factors such as compositions of the epitaxial layers, the separation distances (such as distances S3 and S4) between the fins, and/or deposition conditions of the epitaxial processes.

In the depicted embodiments, although the source/drain features 132 and the source/drain features 142 are formed to similar sizes and geometries, and the source/drain features 136 and the source/drain features 146 are formed to similar sizes and geometries, the present embodiments are not limited to these configurations. For example, it is also applicable in the present disclosure that the source/drain features 142 are formed as separated, rather than merged, features by performing an etching process similar to the etching process 308 instead of the etching process 302. Similarly, the source/drain features 146 may be formed as merged, rather than separated, features by performing an etching process similar to the etching process 302 instead of the etching process 308. In other words, because the four areas 102A-102D are processed independently and separately, the methods provided herein allow source/drain features of various shapes and sizes to be formed in different device regions, thereby meeting various design requirements. This advantage may be realized when existing methods of forming source/drain features in different device regions could no long be supported at reduced length scales.

Referring now back to block 212 of FIG. 1 and to FIGS. 15A-15G, the method 200 proceeds to replacing the dummy gate stacks 112 and 114 with metal gate stacks 152 and 154, respectively. In the present embodiments, the metal gate stack 152 engages with a portion of the fin 108A to form a first FET, such as a first p-type FET, and with a portion of the fin 108B to form a second FET of different conductivity type from the first FET, such as a first n-type FET. Similarly, the metal gate stack 154 engages with a portion of the fin 108C to form a third FET, such as a second p-type FET, and with a portion of the fin 108D, to form a fourth FET of different conductivity type from the third FET, such as a second n-type FET. Furthermore, in the present embodiments, the first FET (or the second FET) and the third FET (or the fourth FET) are configured to perform different functions. For example, the first FET (or the second FET) may be configured as a logic device and the third FET (or the fourth FET) may be configured as a memory device. The formation of the metal gate stacks 152 and 154 is described in detail below.

The method 220 may first deposit an inter-layer dielectric (ILD) layer 150 is over the workpiece 100 that includes the source/drain features 132, 136, 142, and 146. The ILD layer 150 acts as an insulator that supports and isolates conductive traces formed over the workpiece 100. The ILD layer 150 may include any suitable dielectric material such as silicon oxide, doped silicon oxide such as borophosphosilicate glass (BPSG), tetraethylorthosilicate (TEOS), un-doped silicate glass, fused silica glass (FSG), phosphosilicate glass (PSG), boron-doped silicon glass (BSG), a low-k dielectric material, other suitable dielectric materials, or combinations thereof. The ILD layer 150 may be deposited by any suitable method, such as plasma-enhanced CVD (PECVD), FCVD, SOG, other suitable deposition processes, or combinations thereof. A CMP process may be subsequently performed to remove any excessive dielectric materials and planarize the top surface of the workpiece 100. Alternatively, the hard mask 120 may function as polishing stop layer during the CMP process and is removed by additional etching process after performing the CMP.

Subsequently, the method 220 separately or collectively removes the dummy gate stacks 112 and 114, or portions thereof, by a suitable selectively etching process. The selective etching process is configured to remove the dummy gate materials, such as polysilicon, with respect to the ILD layer 150, resulting in gate trenches (not depicted). The selectively etching process may include any suitable etching technique such as wet etching, dry etching, RIE, ashing, other etching methods, or combinations thereof. In one example, the selectively etching process is a dry etching process utilizing a fluorine-based etchant. In some embodiments, the selective etching process includes multiple etching steps with different etching chemistries, each targeting a particular material of the dummy gate layers.

Thereafter, the method 220 fills the gate trenches with various gate materials, such as a gate dielectric layer (not depicted separately) and a gate electrode (not depicted separately), each including one or more material layers. The gate dielectric layer may include a high-k dielectric material, such as a metal oxide (e.g., LaO, AlO, ZrO, TiO, $Ta_2O_5$, $Y_2O_3$, $SrTiO_3$ (STO), $BaTiO_3$ (BTO), BaZrO, HfZrO, HfLaO, HfTaO, HfTiO, $(Ba,Sr)TiO_3$ (BST), $Al_2O_3$, etc.) a metal silicate (e.g., HfSiO, LaSiO, AlSiO, etc.), other suitable materials, or combinations thereof. In some embodiments, the gate dielectric layer is deposited in the gate trenches by any suitable method, such as ALD, CVD, metal-organic CVD (MOCVD), PVD, other suitable methods, or combinations thereof. Subsequently, the method 220 forms a gate electrode over the gate dielectric layer, where the gate electrode may include one or more work function metal layer and a metal fill layer over the work function metal layer. The work function metal layer may include a p-type work function metal layer or an n-type work function metal layer. Example work function metal layers include TiN, TaN, Ru, Mo, Al, WN, $ZrSi_2$, $MoSi_2$, $TaSi_2$, $NiSi_2$, Ti, Ag, TaAl, TaAlC, TiAlN, TaC, TaCN, TaSiN, Mn, Zr, other suitable work function materials, or combinations thereof. work function metal layer may be deposited by CVD, PVD, other suitable processes, or combinations thereof. The metal fill layer may include aluminum (Al), tungsten (W), copper (Cu), cobalt (Co), ruthenium (Ru), other suitable materials, or combinations thereof. The metal fill layer may be formed by CVD, PVD, plating, other suitable processes, or combinations thereof. In some embodiments, the method 220 forms other material layers, such as an interfacial layer, a barrier layer, a capping layer, and/or other suitable layers, as portions of the metal gate stacks 152 and/or 154. After depositing the metal gate materials, one or more CMP process is performed to produce a substantially planar top surface of the metal gate stacks 152 and 154.

Referring to block 214 of FIG. 1, the method 200 performs additional processing steps. For example, the method 200 may form source/drain contacts in an ILD layer disposed over the workpiece 100, where the source/drain contacts are configured to to electrically couple with the source/drain features 132, 136, 142, and 146. Thereafter, the method 200 may proceed to forming an interconnection structure to couple various devices of the workpiece 100 to an IC. The interconnection structure includes metal lines in multiple metal layers for horizontal coupling and vias/contacts for vertical coupling between adjacent metal layers or between a bottom metal layer and the device features on substrate 102 (such as the source/drain features and the metal gate stacks). The source/drain contacts and the interconnect structure may include one or more suitable conductive material, such as Cu, Al, W, Co, Ru, a metal silicide, a metal nitride, or other suitable conductive material. The source/drain contacts and the interconnection structure may be formed by a damascene process, such as single damascene process or dual damascene process, which include, lithography patterning, etching, deposition, and CMP. The illustrated workpiece 100 is merely an example of some embodiments of the methods 200 and 220. The methods 200 and 220 may have various other embodiments without departure of the scoped the present disclosure.

The present disclosure provides a semiconductor structure and a method of fabricating the same. The method includes different procedures to form epitaxially grown source/drain features for various devices. Although not intended to be limiting, one or more embodiments of the present disclosure provides many benefits to a semiconductor device and the formation thereof, including FinFETs. For example, in the present embodiments, at least two types of FinFETs are formed by different procedures. The first type may be a logic device and the second type may be a memory (such as SRAM) device. Specifically, in the present embodiments, source/drain features of the first type and the second type are formed by adjusting height of their respective FSW spacers in separate photolithography and etching processes, and subsequently performing their epitaxial growth processes between the respective FSW spacers of different heights to form source/drain features of different configurations. Accordingly, by tuning the heights of the FSW spacers separately for different FinFETs, source/drain features of different sizes and geometries may be accomplished to achieve various advantages, such as reduced contact resistance, increased contact area with source/drain contacts, enhanced charge mobility due to strain effects on the channel region, and/or other advantages. In addition, the present disclosure provides design freedom to treat different FinFETs differently and independently to meet their respective design specifications. However, it is noted that the first type of FinFETs and the second type of FinFETs are not limited to logic devices and memory devices, respectively, and can be other type devices with different specifications. For example, the first type of FinFETs may be p-type devices and the second type of devices may be n-type FinFETs, or vice versa, according to various design consideration.

In one aspect, the present disclosure provides a method that includes forming a first semiconductor fin in a first device region and a second semiconductor fin in a second device region over a substrate, forming a spacer layer over the substrate, where a first portion of the spacer layer is formed over the first semiconductor fin and a second portion of the spacer layer is formed over the second semiconductor fin, performing a first etching process to recess the first portion of the spacer layer with respect to the second portion of the spacer layer, thereby forming first fin spacers on sidewalls of the first semiconductor fin, forming a first epitaxial S/D feature between the first fin spacers, subsequently performing a second etching process to recess the second portion of the spacer layer with respect to the first portion of the spacer layer, thereby forming second fin spacers on sidewalls of the second semiconductor fin, where the second fin spacers are formed to a height greater than that of the first fin spacers, and forming a second epitaxial S/D feature between the second fin spacers, where the second epitaxial S/D feature is formed to a size less than that of the first epitaxial S/D feature.

In another aspect, the present disclosure provides a method that includes forming a first fin and a second fin protruding from a first region of a semiconductor substrate, forming a third fin protruding from a second region of the semiconductor substrate, forming a first dummy gate stack over the first and the second fins and a second dummy gate stack over the third fin, depositing a dielectric layer over the first and the second dummy gate stacks, forming a first source/drain (S/D) feature over the first and the second fins, where the first S/D feature merges the first and the second fins, subsequently forming a second S/D feature over the third fin, and replacing the first and the second dummy gate stacks with metal gate stacks. In the present embodiments, forming the first S/D feature includes performing a first etching process to remove portions of the dielectric layer on sidewalls of the first and the second fins, thereby forming first fin sidewall (FSW) spacers having a first height, recessing the first and the second fins performing a first epitaxial process to grow the first S/D feature, thereby merging the recessed first and the second fins. In the present embodiments, forming the second S/D feature includes performing a second etching process to remove portions of the dielectric layer on sidewalls of the third fin, thereby forming second FSW spacers having a second height, where the second height is greater than the first height, and where the first and the second etching processes implement the same etchant, recessing the third fin, and performing a second epitaxial process to grow the second S/D feature between the second FSW spacers.

In yet another aspect, the present disclosure provides a semiconductor structure that includes first fins and second fins extending from a semiconductor substrate, isolation features disposed over the semiconductor substrate to separate the first fins and the second fins, where the first and the second fins have a fin height measured from a top surface of the isolation features, a first device over the first fins, a second device over the second fins, and an inter-layer dielectric (ILD) layer over the first and the second devices. In present embodiments, the first device includes a first gate stack engaged with first channel regions of the first fins, a first epitaxial source/drain (S/D) feature disposed on opposite sides of the first channel regions, where the first epitaxial S/D feature merges together the first fins, and first fin spacers disposed on sidewalls of the first epitaxial S/D feature, where the first fin spacers have a first height measured from the top surface of the isolation features. In the present embodiments, the second device includes a second gate stack engaged with second channel regions of the second fins, second epitaxial S/D features disposed on opposite sides of the second channel regions, and second fin spacers disposed on sidewalls of the second epitaxial S/D features, where the second fin spacers have a second height measured from the top surface of the isolation features that is greater than the first height.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
providing a substrate having a first device region and a second device region;
forming a first semiconductor fin in the first device region and a second semiconductor fin in the second device region;
forming a spacer layer over the substrate, wherein a first portion of the spacer layer is formed over the first semiconductor fin and a second portion of the spacer layer is formed over the second semiconductor fin;
performing a first etching process to recess the first portion of the spacer layer with respect to the second portion of the spacer layer, thereby forming first fin spacers on sidewalls of the first semiconductor fin;
etching the first semiconductor fin to form a first source/drain (S/D) recess between the first fin spacers;
forming a first epitaxial S/D feature in the first S/D recess;
after forming the first epitaxial S/D feature, performing a second etching process to recess the second portion of the spacer layer with respect to the first portion of the spacer layer, thereby forming second fin spacers on sidewalls of the second semiconductor fin, wherein the second fin spacers are formed to a height greater than that of the first fin spacers;
etching the second semiconductor fin to form a second S/D recess between the second fin spacers; and
forming a second epitaxial S/D feature in the second S/D recess, wherein the second epitaxial S/D feature is formed to a size less than that of the first epitaxial S/D feature.

2. The method of claim 1, wherein the first semiconductor fin is configured to provide a logic device, and wherein the second semiconductor fin is configured to provide a memory device.

3. The method of claim 1, wherein etching the first portion of the spacer layer includes:
forming a patterned photoresist layer to expose the first portion of the spacer layer but not the second portion of the spacer layer;
performing the first etching process; and
after forming the first epitaxial S/D feature and before performing the second etching process, removing the patterned photoresist layer from the substrate.

4. The method of claim 3, wherein the patterned photoresist layer is a first patterned photoresist layer, and wherein etching the second portion of the spacer layer includes:
forming a second patterned photoresist layer to expose the second portion of the spacer layer but not the first portion of the spacer layer;
performing the second etching process; and
after forming the second epitaxial S/D feature, removing the second patterned photoresist layer.

5. The method of claim 1, wherein performing the first etching process includes adjusting a bias power of the first etching process.

6. The method of claim 5, wherein performing the second etching process includes applying an etchant intermittently.

7. The method of claim 6, wherein applying the etchant intermittently includes cyclically recessing the second portion of the spacer layer and re-depositing an etching byproduct over the second semiconductor fin.

8. The method of claim 1, wherein the first semiconductor fin and the second semiconductor fin are configured to form devices of the same conductivity type.

9. The method of claim 1, wherein the first semiconductor fin and the second semiconductor fin are configured to form devices of different conductivity types.

10. A method, comprising:
forming a first fin and a second fin protruding from a first region of a semiconductor substrate;
forming a third fin protruding from a second region of the semiconductor substrate;
forming a first dummy gate stack over the first and the second fins and a second dummy gate stack over the third fin;
depositing a dielectric layer over the first and the second dummy gate stacks;
forming a first source/drain (S/D) feature over the first and the second fins, wherein forming the first S/D feature over the first and the second fins includes:
performing a first etching process to remove portions of the dielectric layer on sidewalls of the first and the second fins, thereby forming first fin sidewall (FSW) spacers having a first height,
recessing the first and the second fins, and
performing a first epitaxial process to grow the first S/D feature, thereby merging the recessed first and the second fins;
forming a second S/D feature over the third fin, wherein forming the second S/D feature over the third fin includes:
subsequent to forming the first S/D feature, performing a second etching process to remove portions of the dielectric layer on sidewalls of the third fin, thereby forming second FSW spacers having a second height, wherein the second height is greater than the first height, and wherein the first and the second etching processes implement the same etchant,
recessing the third fin, and
performing a second epitaxial process to grow the second S/D feature between the second FSW spacers; and
replacing the first and the second dummy gate stacks with metal gate stacks.

11. The method of claim 10, wherein the first and the second regions provide devices of different functions, different conductivity types, or a combination thereof.

12. The method of claim 10, wherein the first and the second regions provide devices of different functions but the same conductivity type.

13. The method of claim 10, wherein the first, the second, and the third fins are formed to a fin height, and wherein the first height is formed to less than half of the fin height and the second height is formed to at least half of the fin height.

14. The method of claim 10, wherein performing the first and the second etching processes forms first gate spacers on sidewalls of the first dummy gate stack and second gate spacers on sidewalls of the second dummy gate stack, respectively.

15. The method of claim 14, wherein the second gate spacers have a height greater than the first gate spacers.

16. A method, comprising:
forming a first semiconductor fin and a second semiconductor fin on a substrate;
forming a dielectric layer directly on the first semiconductor fin and the second semiconductor fin;
forming a first patterned material layer over the second semiconductor fin such that the first patterned material layer exposes a first portion of the dielectric layer disposed directly on the first semiconductor fin;

removing the first portion of the exposed dielectric layer disposed directly on the first semiconductor fin to form first fin spacers on sidewalls of the first semiconductor fin;

removing a portion of the first semiconductor fin between the first fin spacers to thereby form a first recess, wherein the first fin spacers extend to a first height above the substrate after the removing the portion of the first semiconductor fin between the first fin spacers;

forming a first source/drain feature in the first recess;

after forming the first source/drain feature, forming a second patterned material layer over the first semiconductor fin such that the second patterned material layer exposes a second portion of the dielectric layer disposed directly on the second semiconductor fin;

removing the second portion of the exposed dielectric layer disposed directly on the second semiconductor fin to form second fin spacers on sidewalls of the second semiconductor fin;

removing a portion of the second semiconductor fin between the second fin spacers to thereby form a second recess, wherein the second fin spacers extend to a second height above the substrate after the removing the portion of the second semiconductor fin between the second fin spacers, the second height being different than the first height; and forming a second source/drain feature in the second recess.

17. The method of claim 16, wherein the removing of the first portion of the exposed dielectric layer disposed directly on the first semiconductor fin to form the first fin spacers on sidewalls of the first semiconductor fin includes performing a first etching process that includes adjusting a bias power of the first etching process, and wherein the removing of the second portion of the exposed dielectric layer disposed directly on the second semiconductor fin to form the second fin spacers on sidewalls of the second semiconductor fin includes performing a second etching process that includes applying an etchant intermittently and cyclically recessing the second portion of the dielectric layer and re-depositing an etching by-product over the second semiconductor fin.

18. The method of claim 16, wherein the dielectric layer extends continuously from the first semiconductor fin to the second semiconductor fin after forming the dielectric layer directly on the first semiconductor fin and the second semiconductor fin.

19. The method of claim 16, wherein the first source/drain feature includes a first dopant having a first type of conductivity and the second source/drain feature includes a second dopant having a second type of conductivity that is opposite the first type of conductivity.

20. The method of claim 16, wherein the first source/drain feature includes a first dopant having a first type of conductivity and the second source/drain feature includes a second dopant having the first type of conductivity.

* * * * *